United States Patent
Sanad et al.

(10) Patent No.: US 10,896,735 B2
(45) Date of Patent: Jan. 19, 2021

(54) SEMICONDUCTOR MEMORY DEVICE

(71) Applicant: TOSHIBA MEMORY CORPORATION, Tokyo (JP)

(72) Inventors: Bushnaq Sanad, Yokohama Kanagawa (JP); Noriyasu Kumazaki, Kawasaki Kanagawa (JP); Yuzuru Shibazaki, Fujisawa Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/564,223

(22) Filed: Sep. 9, 2019

(65) Prior Publication Data
US 2020/0194077 A1 Jun. 18, 2020

(30) Foreign Application Priority Data

Dec. 17, 2018 (JP) .................. 2018-235800

(51) Int. Cl.
G11C 16/12 (2006.01)
G11C 16/04 (2006.01)
G11C 16/08 (2006.01)
G11C 16/24 (2006.01)
G11C 16/30 (2006.01)

(52) U.S. Cl.
CPC .......... *G11C 16/12* (2013.01); *G11C 16/0483* (2013.01); *G11C 16/08* (2013.01); *G11C 16/24* (2013.01); *G11C 16/30* (2013.01)

(58) Field of Classification Search
None
See application file for complete search history.

(56) References Cited

U.S. PATENT DOCUMENTS

| 5,568,419 | A | * | 10/1996 | Atsumi | ........... | G11C 16/16 365/185.3 |
| 6,961,268 | B2 | * | 11/2005 | Umezawa | ........... | G11C 16/08 365/185.01 |
| 7,259,990 | B2 | | 8/2007 | Maejima et al. | | |
| 7,505,355 | B2 | * | 3/2009 | Kanda | ........... | G11C 8/08 365/189.05 |
| 7,562,180 | B2 | | 7/2009 | Gyl et al. | | |
| 8,559,234 | B2 | | 10/2013 | Fujimura et al. | | |

(Continued)

FOREIGN PATENT DOCUMENTS

JP 2003308247 A 10/2003
JP 4693375 B2 8/2004

(Continued)

*Primary Examiner* — Khamdan N. Alrobaie
(74) *Attorney, Agent, or Firm* — Holtz, Holtz & Volek PC

(57) ABSTRACT

According to one embodiment, a semiconductor memory device includes: a memory cell array including a first memory cell, a first word line, a first circuit coupled to the first word line, a first driver used for a write operation and a read operation, a second driver used for an erase operation, and a voltage generator. The first circuit includes: a second circuit capable of electrically coupling the first word line and a first interconnect; a third circuit capable of electrically coupling the first interconnect and a second interconnect; a fourth circuit capable of electrically coupling the second interconnect and the first driver in the write and read operations; and a fifth circuit capable of electrically coupling the second interconnect and the second driver in the erase operation.

20 Claims, 45 Drawing Sheets

(56) References Cited

U.S. PATENT DOCUMENTS

| | | | |
|---|---|---|---|
| 9,147,488 B2 | 9/2015 | Kim et al. | |
| 9,190,156 B2 | 11/2015 | Sako | |
| 9,219,482 B2 | 12/2015 | Kwon et al. | |
| 9,455,009 B2 | 9/2016 | Lee et al. | |
| 9,600,414 B2 | 3/2017 | Porzio et al. | |
| 2004/0264244 A1* | 12/2004 | Morimoto | G11C 11/5685 365/180 |
| 2007/0047328 A1* | 3/2007 | Kim | G11C 16/16 365/185.29 |
| 2009/0267128 A1* | 10/2009 | Maejima | H01L 27/11565 257/314 |
| 2009/0268522 A1* | 10/2009 | Maejima | H01L 27/11556 365/185.11 |
| 2010/0207195 A1* | 8/2010 | Fukuzumi | H01L 27/11578 257/326 |
| 2011/0157989 A1* | 6/2011 | Iwata | G11C 16/30 365/185.17 |
| 2011/0194345 A1* | 8/2011 | Kuroda | G11C 29/50 365/185.2 |
| 2011/0284946 A1 | 11/2011 | Kiyotoshi | |
| 2013/0188423 A1* | 7/2013 | Nam | H01L 27/11582 365/185.17 |
| 2017/0076803 A1* | 3/2017 | Lee | G11C 16/3459 |
| 2019/0130982 A1* | 5/2019 | Reusswig | G11C 16/26 |
| 2019/0385681 A1* | 12/2019 | Yun | G11C 16/0483 |

FOREIGN PATENT DOCUMENTS

| | | | |
|---|---|---|---|
| JP | 5856536 B2 | 4/2012 | |
| JP | 2012142058 A | 7/2012 | |

* cited by examiner

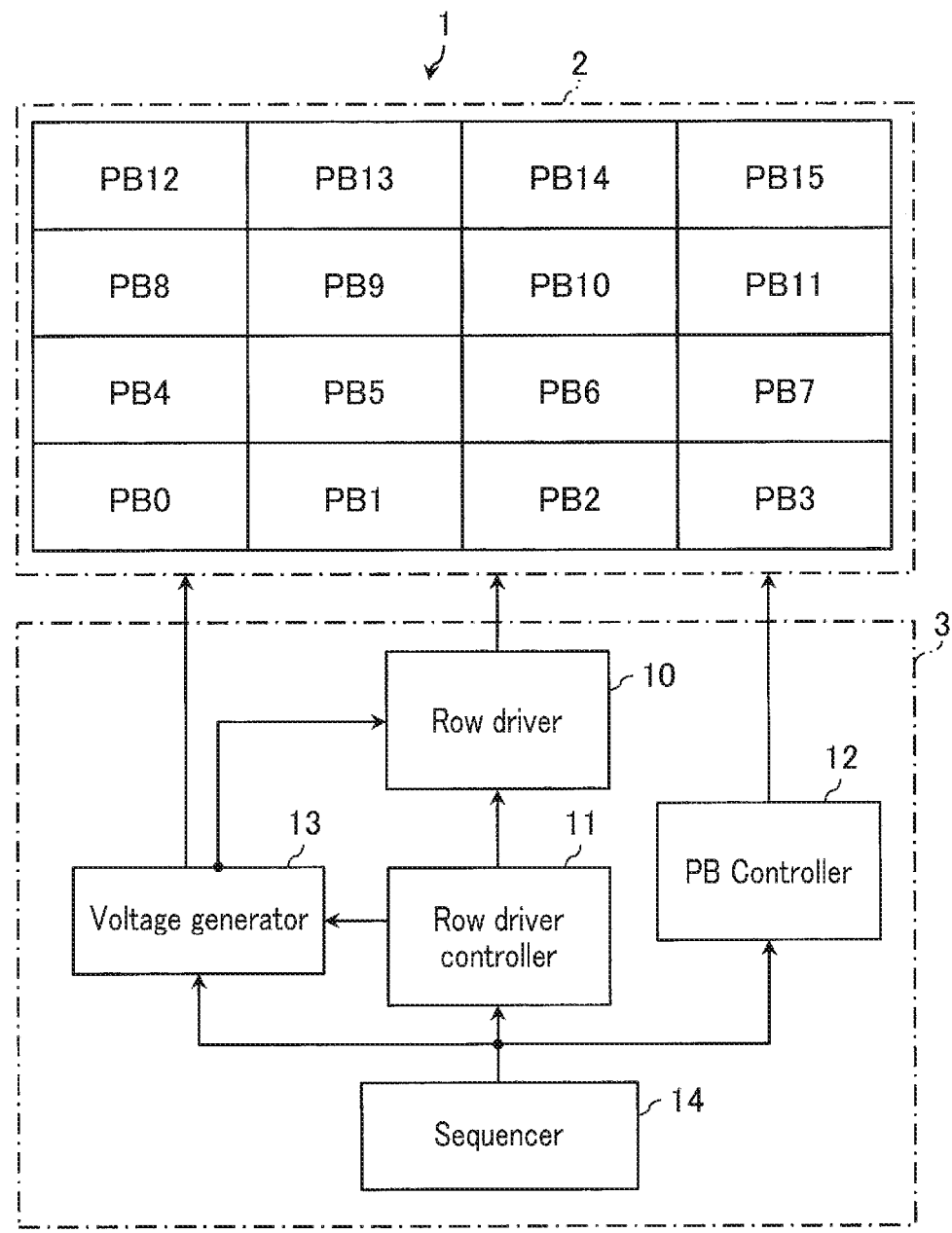
F I G. 1

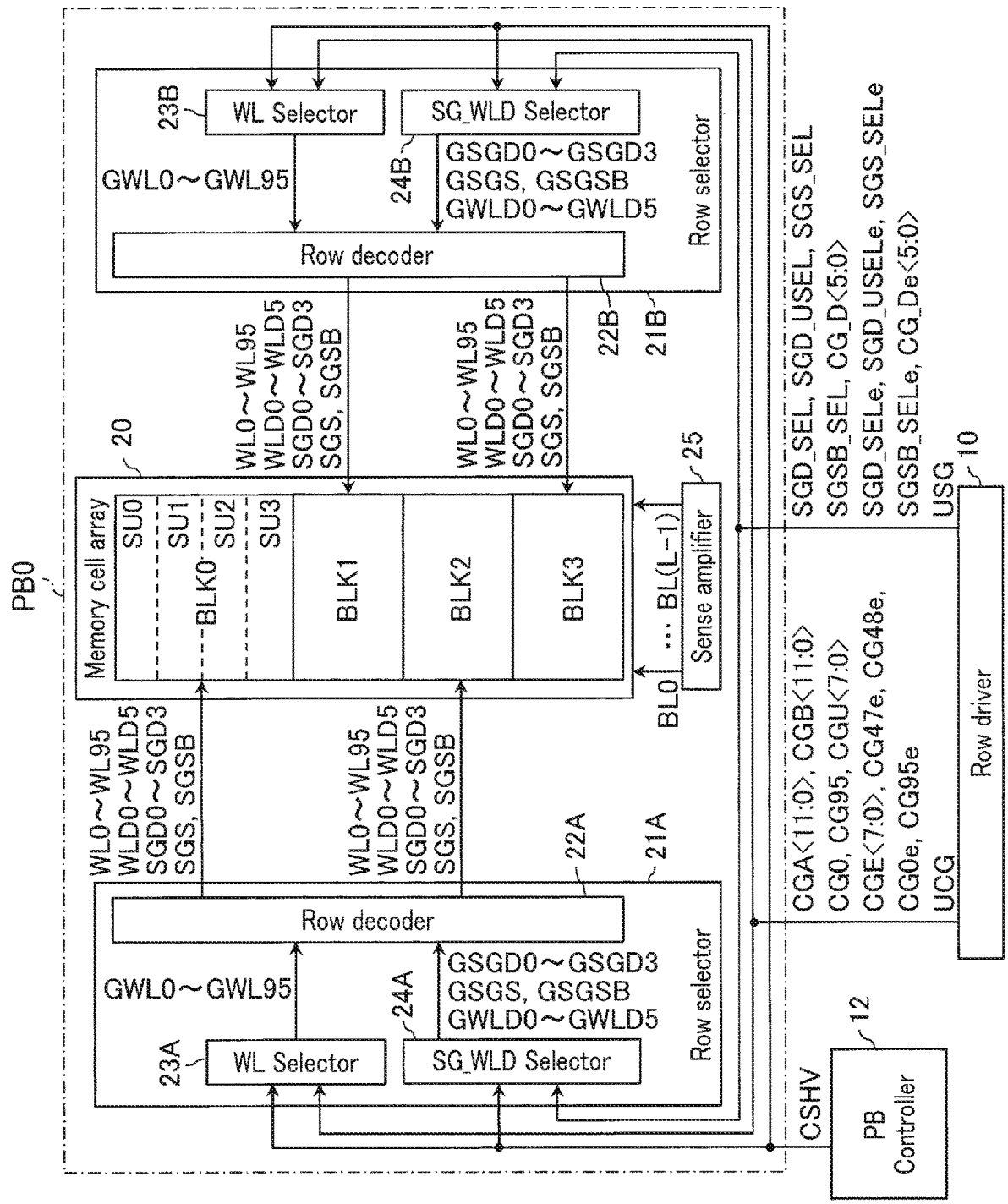
F I G. 2

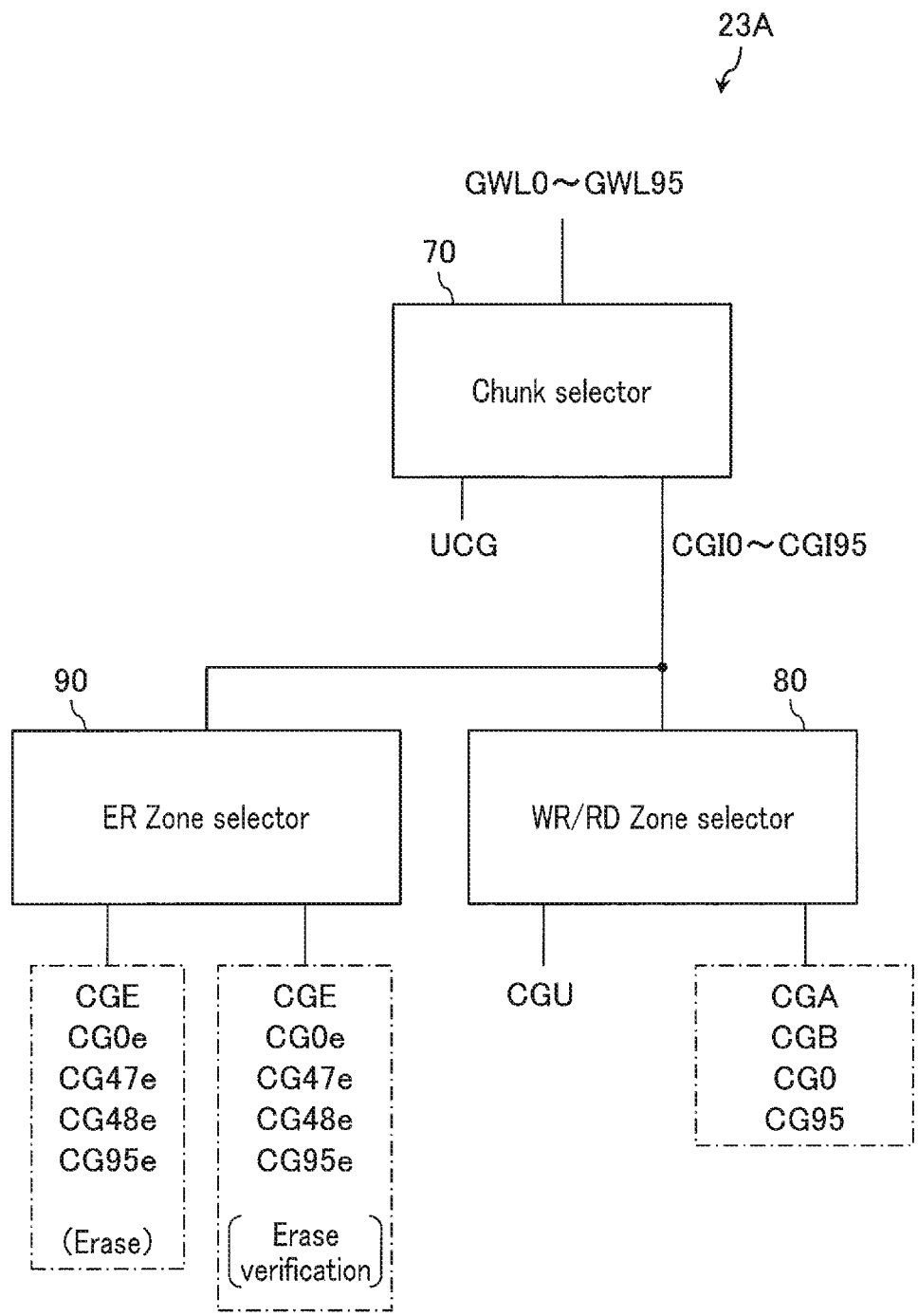
F I G. 7

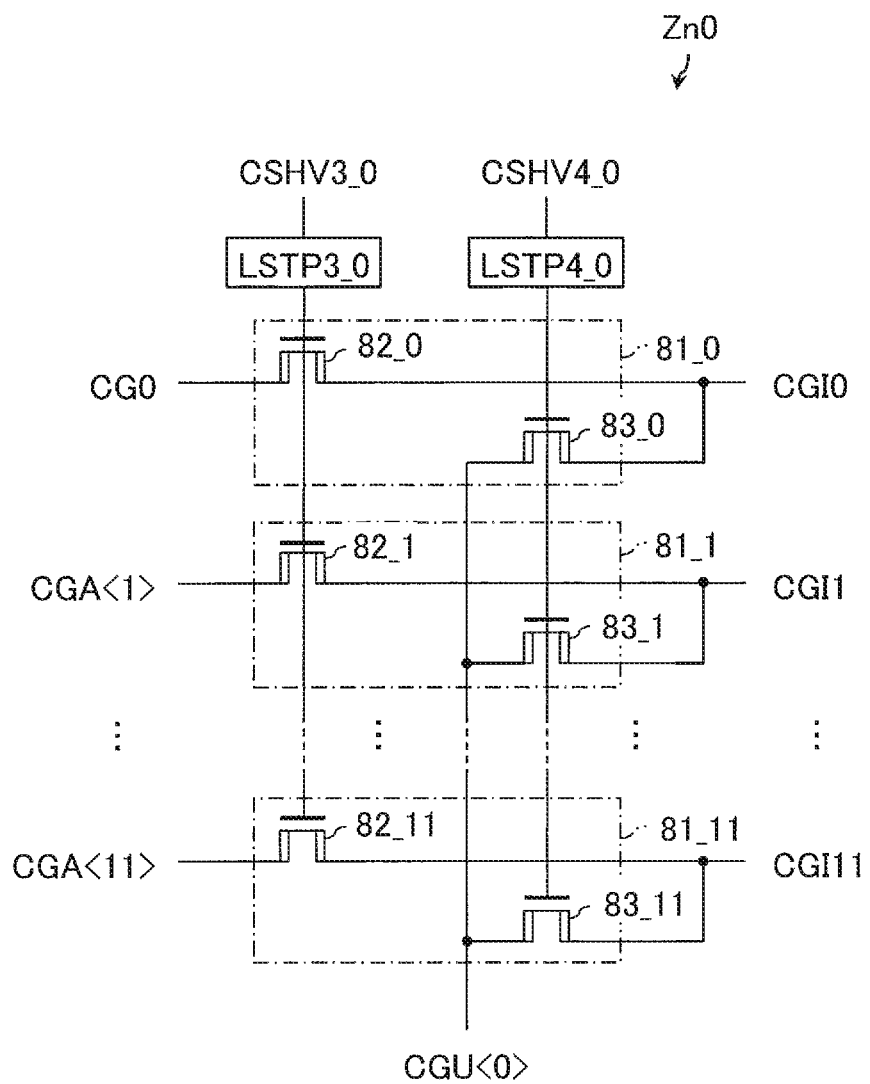
F I G. 10

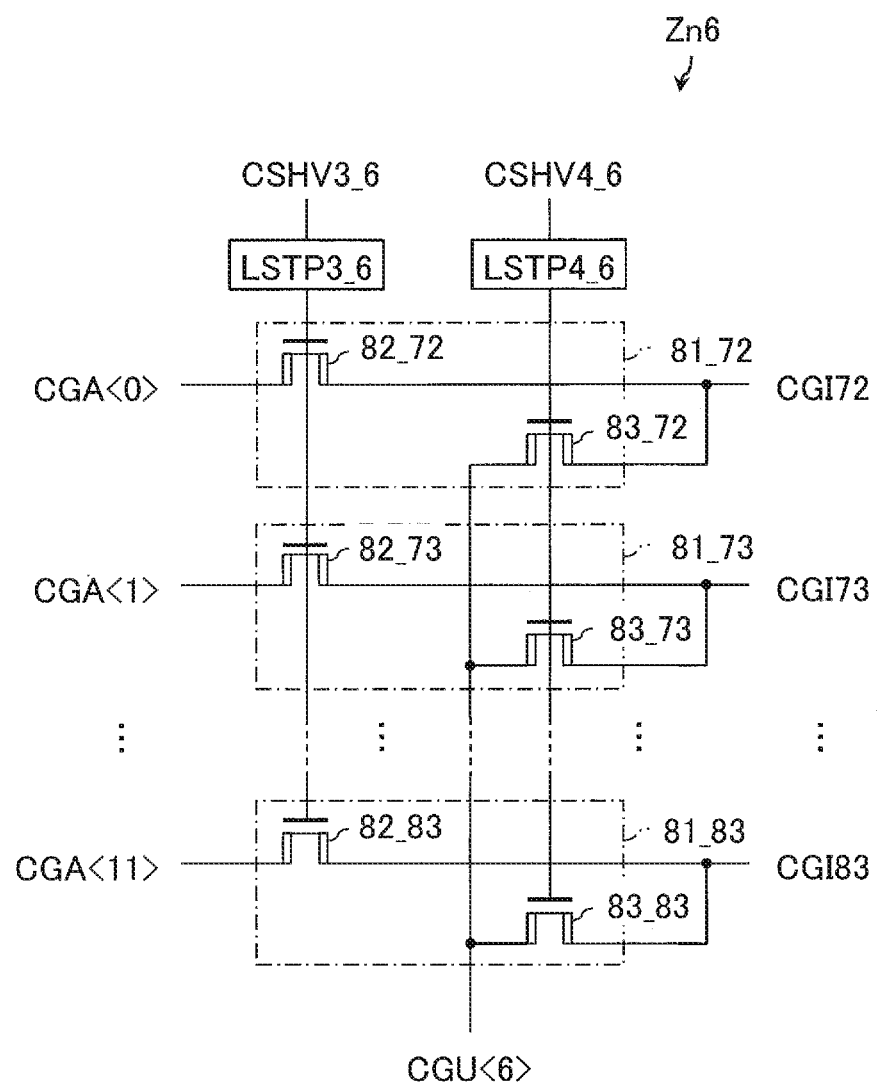
F I G. 16

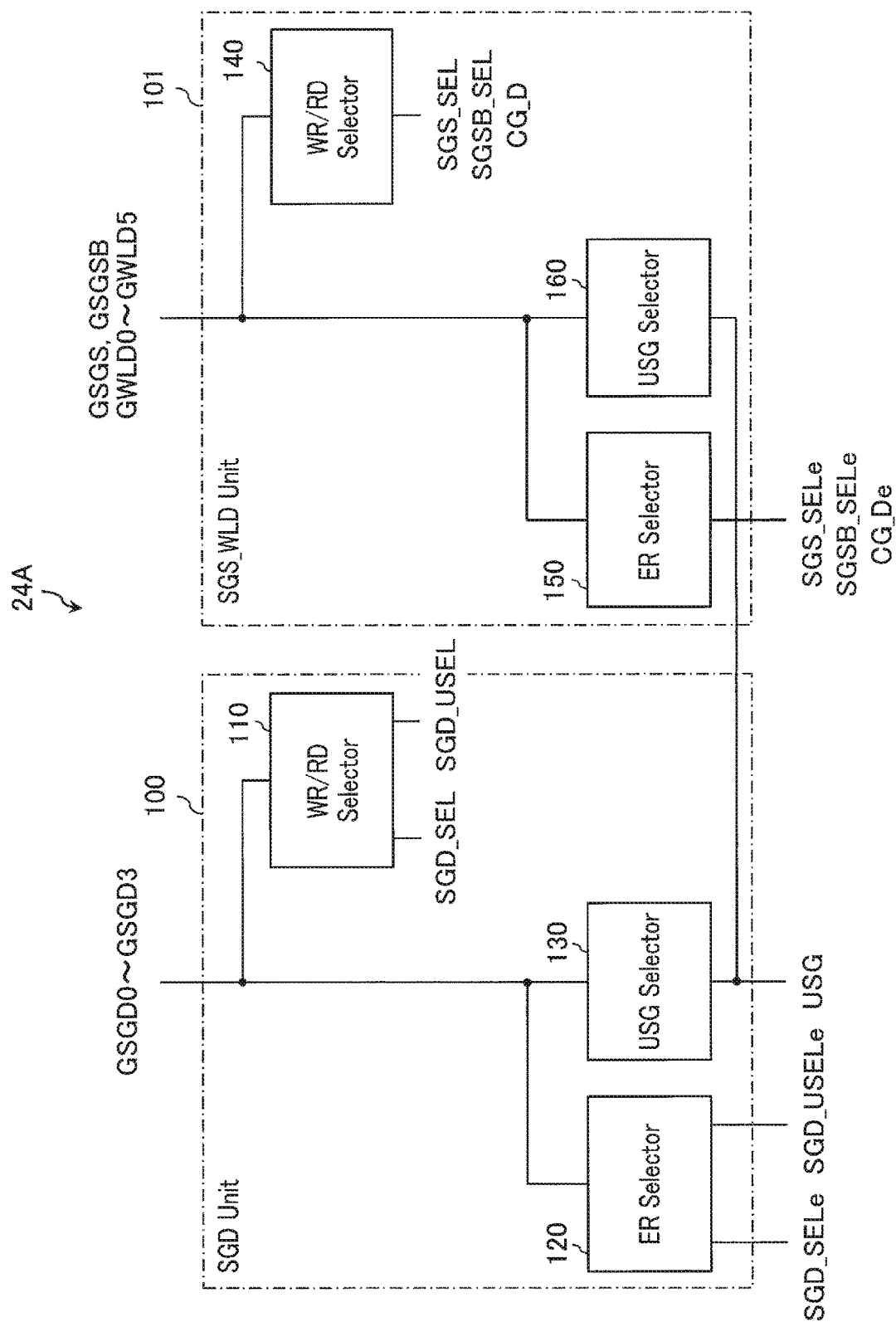
F I G. 19

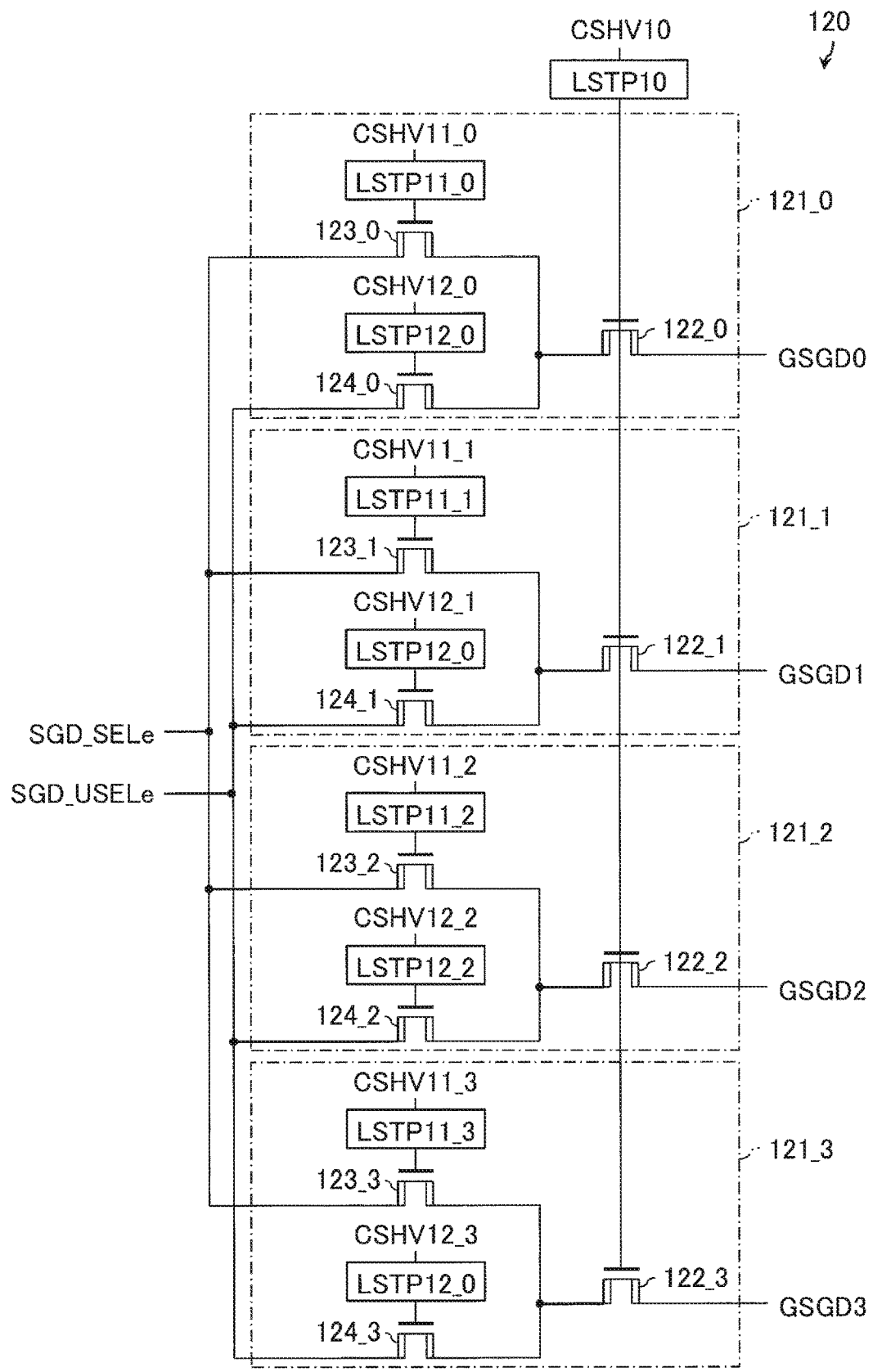
F I G. 21

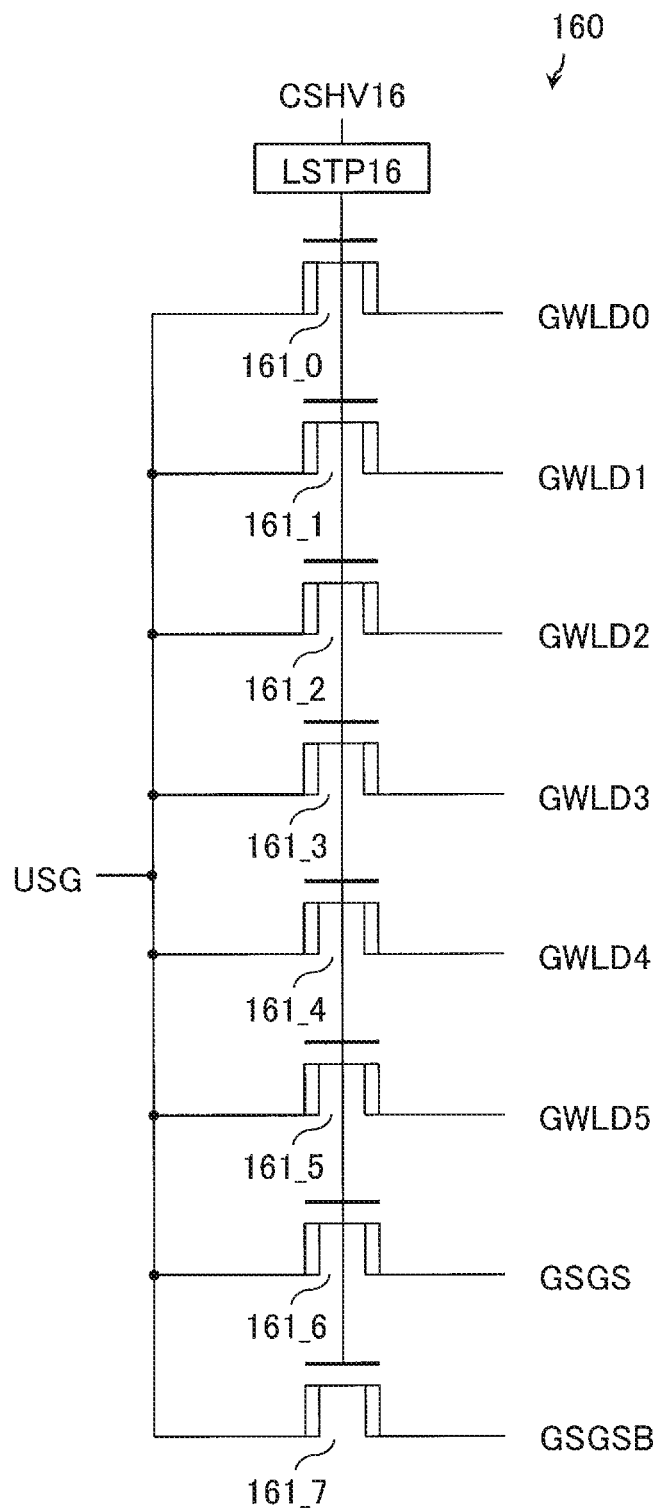
F I G. 25

| LSTP Power source | LSTP | Program | Read (verification) | Erase |
|---|---|---|---|---|
| DEC1 | LSTP1<br>LSTP3_0~3_7<br>LSTP4_0~4_7<br>LSTP5<br>LSTP6<br>LSTP7 | VPGMH | VGBST | VGBST |
| DEC2 | LSTP2 | VGBST | VGBST | VERA |
| DEC3 | LSTP8_0~8_3<br>LSTP9_0~9_3<br>LSTP10<br>LSTP11_0~11_3<br>LSTP12_0~12_3<br>LSTP13<br>LSTP14<br>LSTP15<br>LSTP16 | VGBST | VGBST | VERA |

F I G. 28

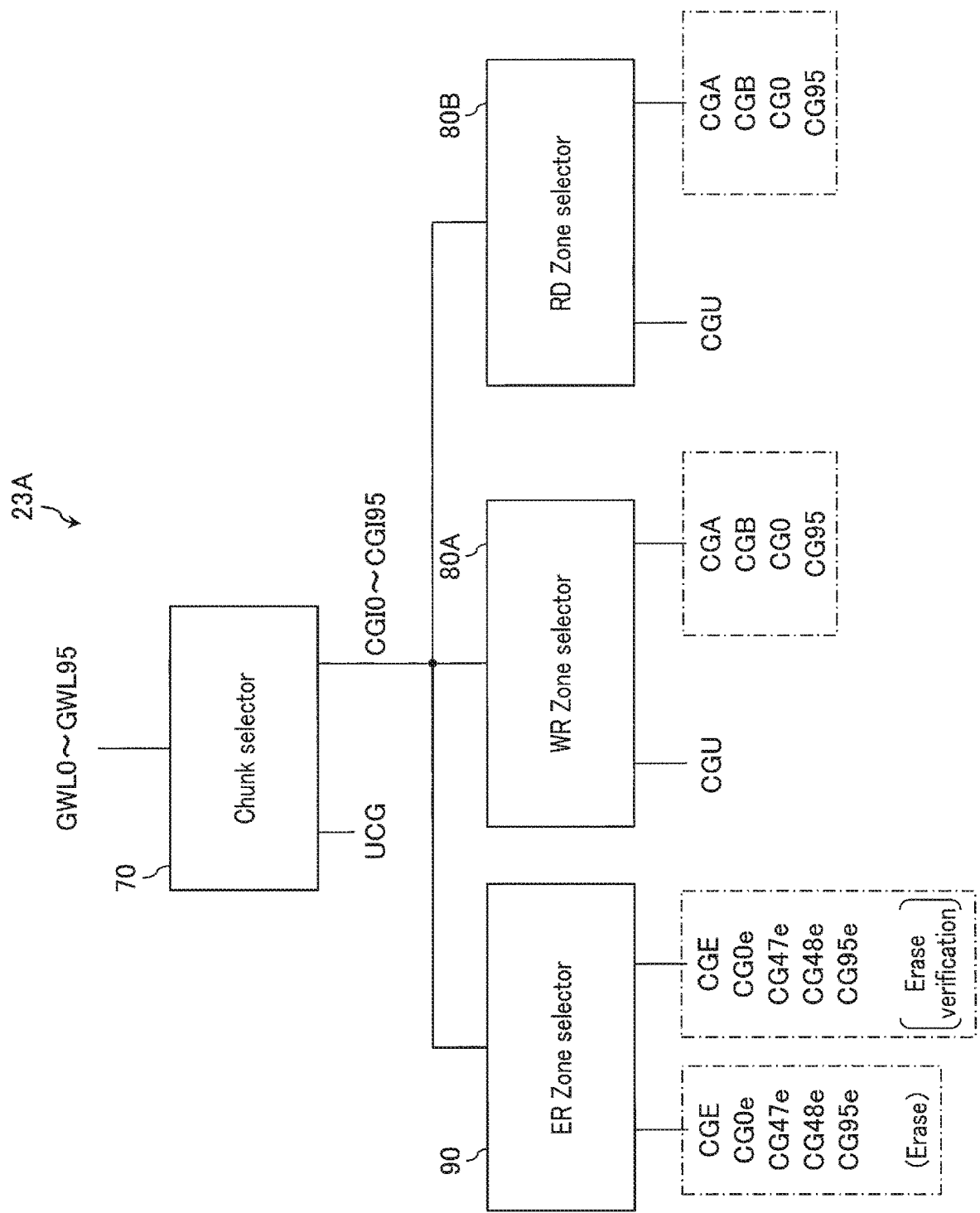
F I G. 29

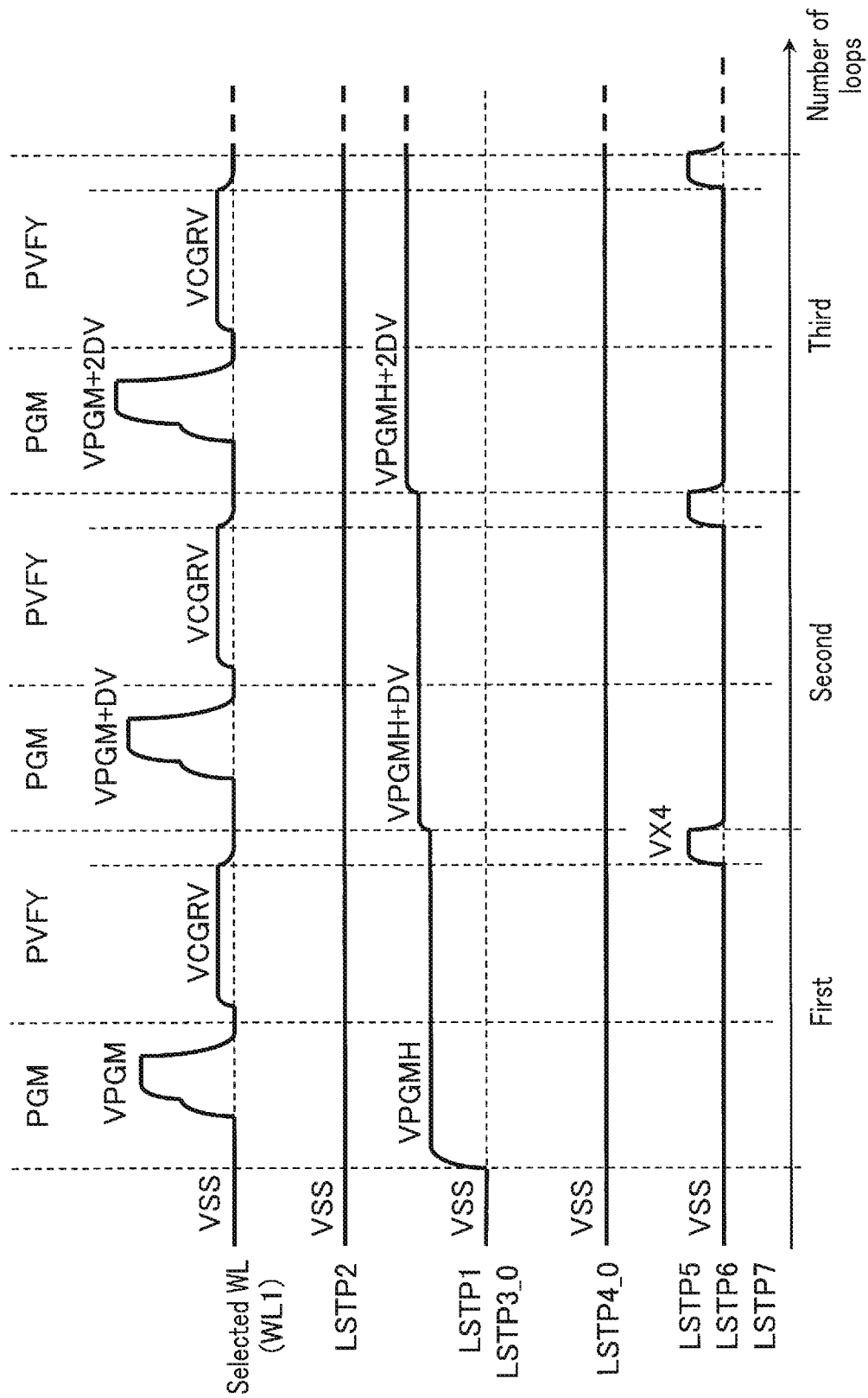
F I G. 34

| LSTP Power source | LSTP | Write | Read | Erase |
|---|---|---|---|---|
| DEC1 | LSTP1<br>LSTP3_0~3_7<br>LSTP4_0~4_7 | VPGMH | VGBST | VGBST |
| DEC2 | LSTP2 | VX4 | VX4 | VERA |
| DEC3 | LSTP8_0~8_3<br>LSTP9_0~9_3<br>LSTP10<br>LSTP11_0~11_3<br>LSTP12_0~12_3<br>LSTP13<br>LSTP14<br>LSTP15<br>LSTP16 | VGBST | VGBST | VERA |
| DEC4 | LSTP5<br>LSTP6<br>LSTP7 | VX4 | VX4 | VERA |

FIG. 35

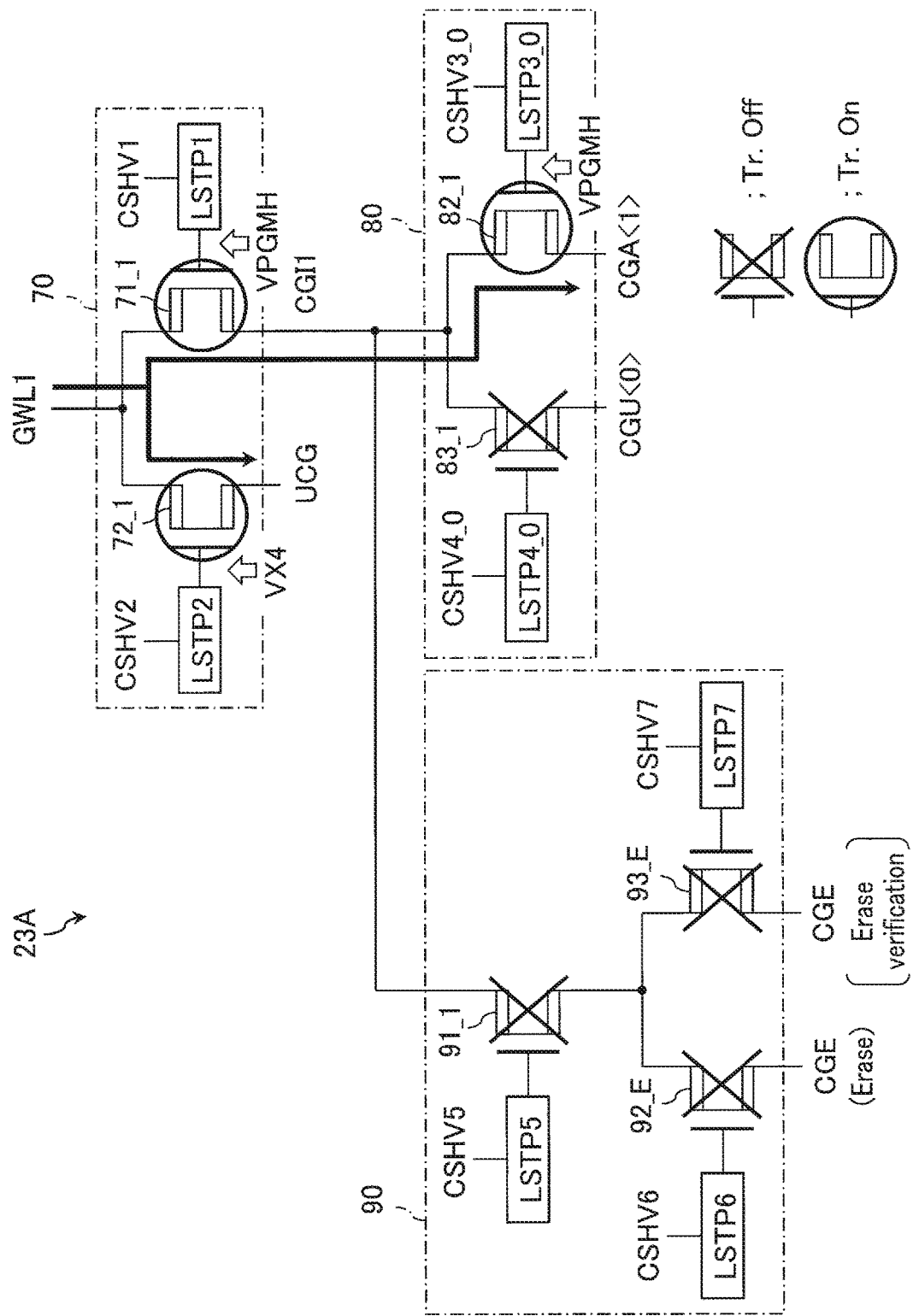
F I G. 36

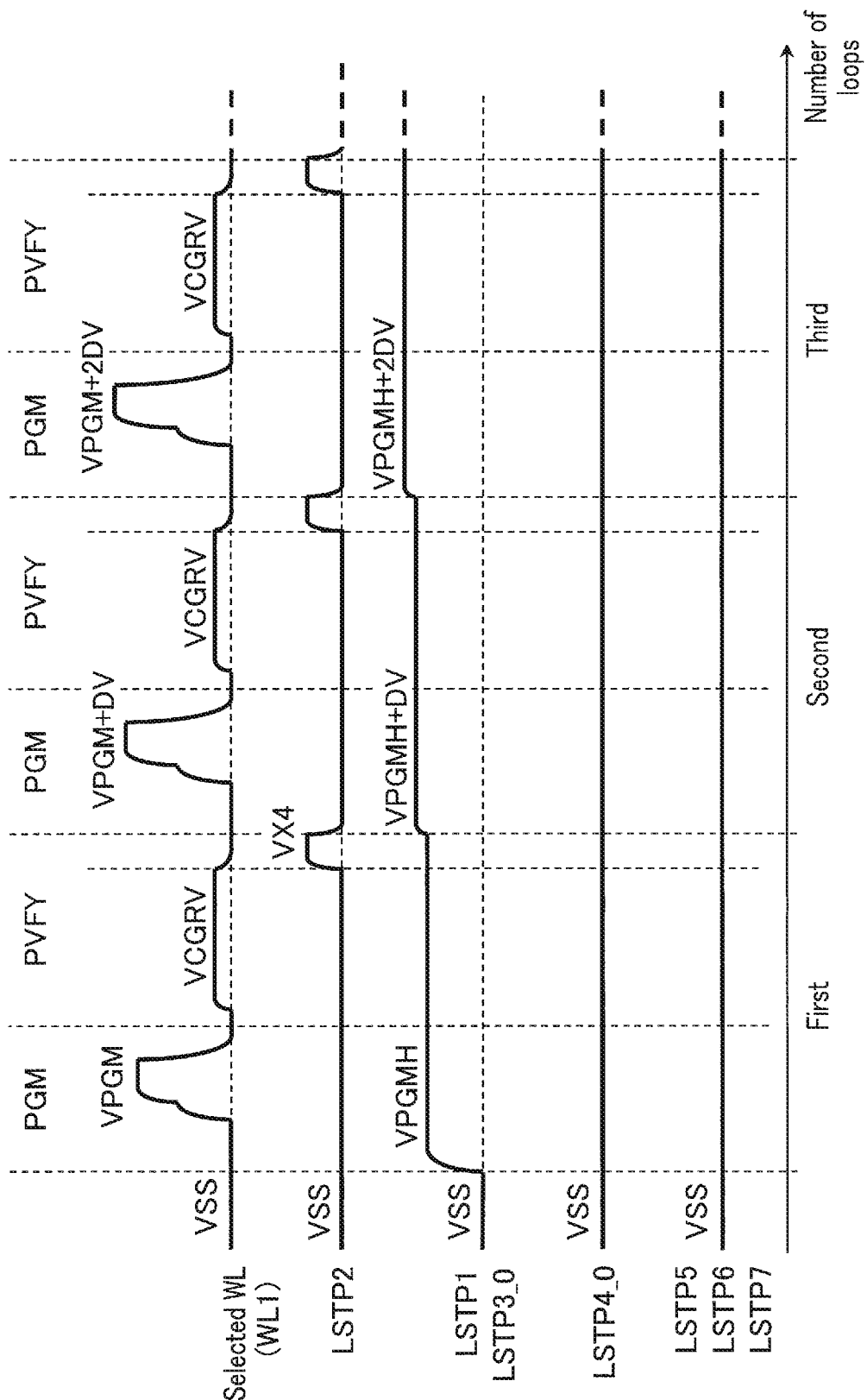
F I G. 37

| LSTP Power source | LSTP | Write | Read | Erase |
|---|---|---|---|---|
| DEC1 | LSTP1<br>LSTP3_0~3_7 | VPGMH | VGBST | VGBST |
| DEC2 | LSTP2 | VX4 | VX4 | VERA |
| DEC3 | LSTP4_0~4_7<br>LSTP8_0~8_3<br>LSTP9_0~9_3<br>LSTP10<br>LSTP11_0~11_3<br>LSTP12_0~12_3<br>LSTP13<br>LSTP14<br>LSTP15<br>LSTP16 | VGBST | VGBST | VERA |
| DEC4 | LSTP5<br>LSTP6<br>LSTP7 | VX4 | VX4 | VERA |

F I G. 40

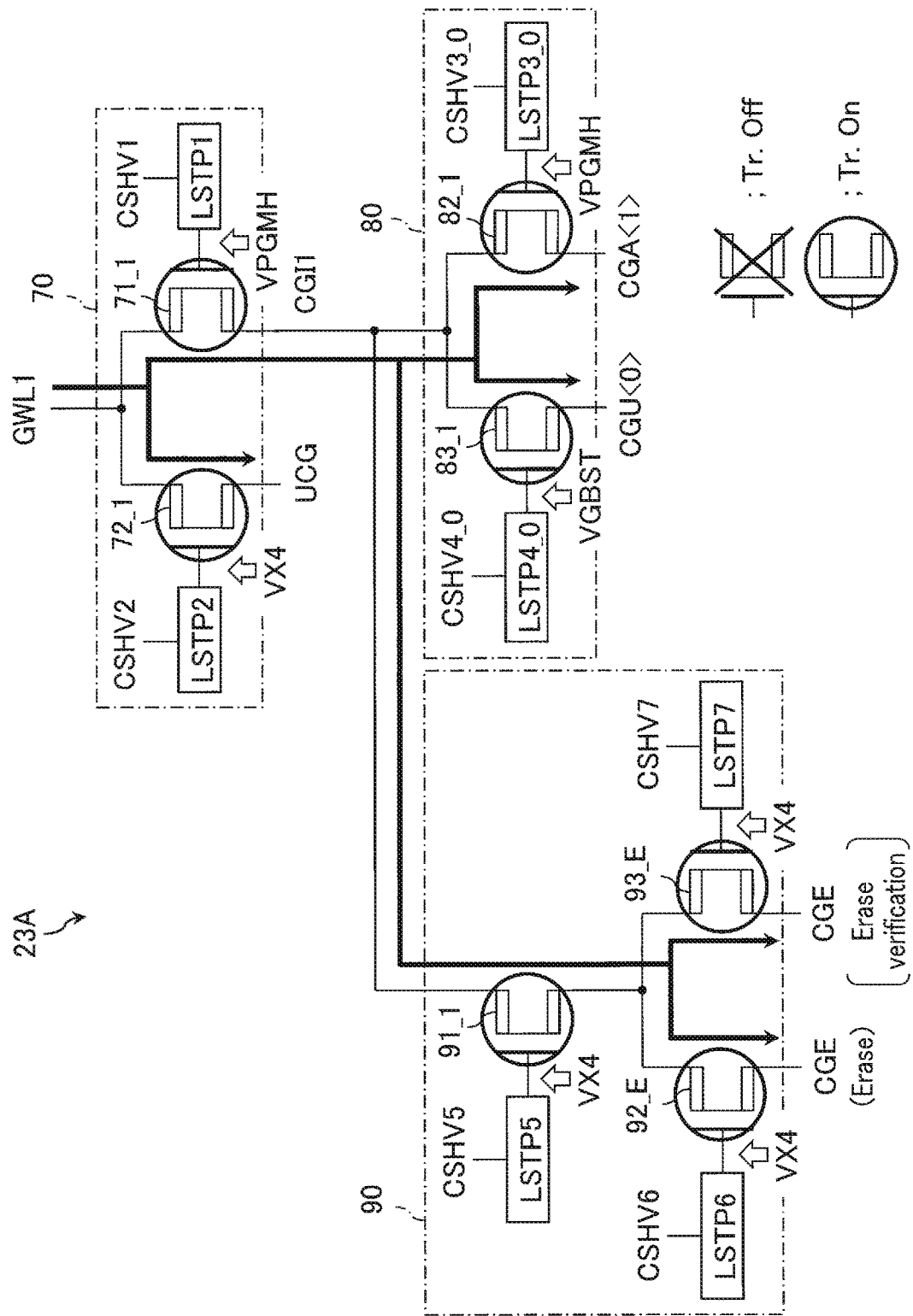
F I G. 41

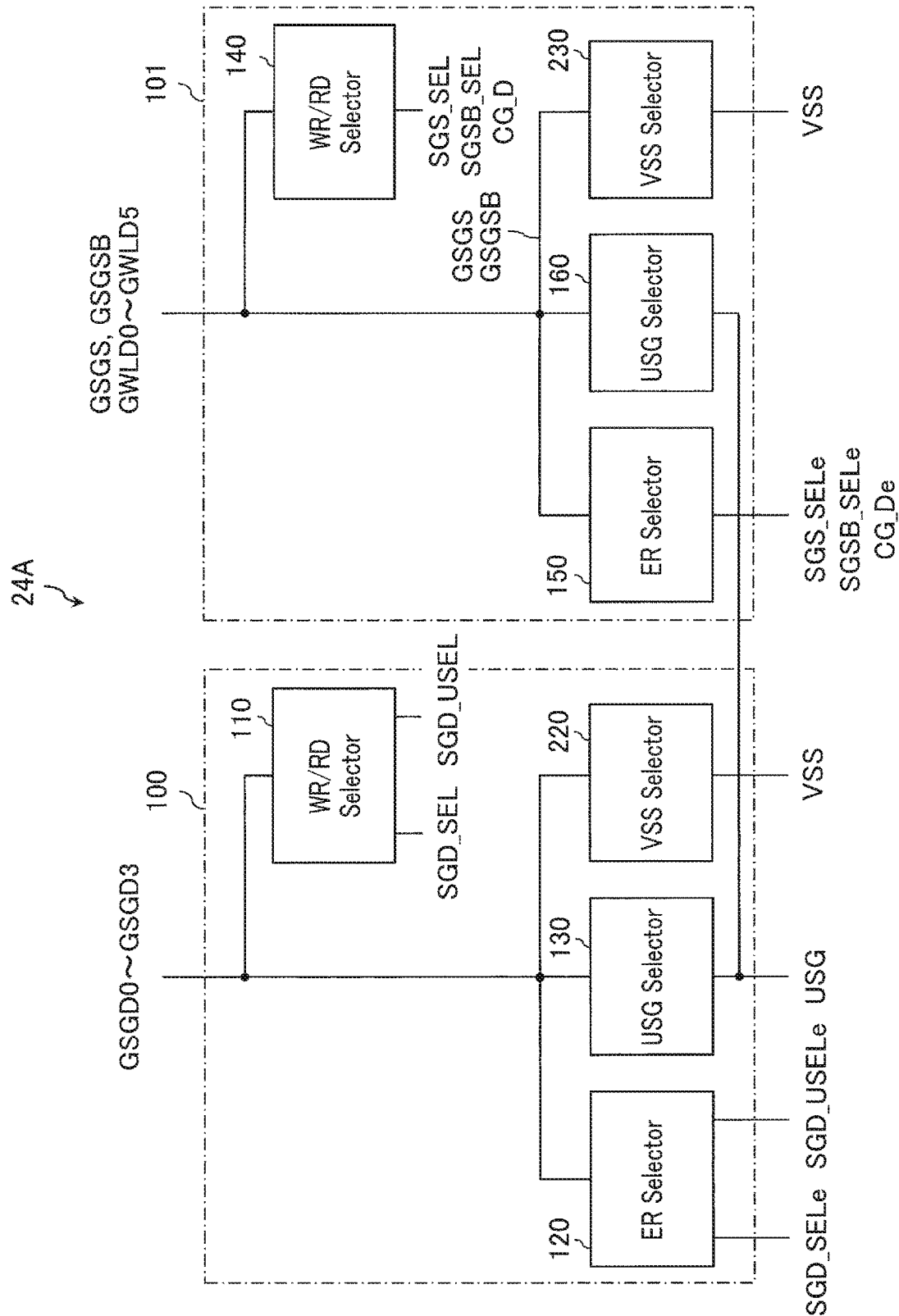
F I G. 43

SEMICONDUCTOR MEMORY DEVICE

CROSS-REFERENCE TO RELATED APPLICATIONS

This application is based upon and claims the benefit of priority from Japanese Patent Application No. 2018-235800, filed Dec. 17, 2018, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 1 is a block diagram of a semiconductor memory device according to a first embodiment;

FIG. 2 is a block diagram of a plane included in the semiconductor memory device according to the first embodiment;

FIG. 7 is a block diagram of a WL selector included in the semiconductor memory device according to the first embodiment;

FIG. 10 is a circuit diagram of a switch circuit of a zone Zn0 in the WR/RD zone selector included in the semiconductor memory device according to the first embodiment;

FIG. 16 is a circuit diagram of a switch circuit of a zone Zn6 in the WR/RD zone selector included in the semiconductor memory device according to the first embodiment;

FIG. 19 is a block diagram of a SG_WLD selector included in the semiconductor memory device according to the first embodiment;

FIG. 21 is a circuit diagram of an ER selector in the SGD unit included in the semiconductor memory device according to the first embodiment;

FIG. 25 is a circuit diagram of a USG selector in the SGS_WLD unit included in the semiconductor memory device according to the first embodiment;

FIG. 28 is a table showing voltages supplied to level shifters in write, read, and erase operations in the semiconductor memory device according to the first embodiment;

FIG. 29 is a block diagram of a WL selector included in a semiconductor memory device according to a first example of a second embodiment;

FIG. 34 is a timing chart illustrating a voltage of the selected word line WL and output voltages of level shifters in a write operation in the semiconductor memory device according to the first example of the third embodiment;

FIG. 35 is a table showing voltages supplied to the level shifters in the write, read, and erase operations in the semiconductor memory device according to the first example of the third embodiment;

FIG. 36 is a schematic diagram illustrating a discharge path of a selected word line in a program verification operation in a semiconductor memory device according to a second example of the third embodiment;

FIG. 37 is a timing chart showing a voltage of the selected word line WL and output voltages of level shifters in a write operation in the semiconductor memory device according to the second example of the third embodiment;

FIG. 40 is a table showing voltages supplied to the level shifters in the write, read, and erase operations in the semiconductor memory device according to the third example of the third embodiment;

FIG. 41 is a schematic diagram illustrating a discharge path of a selected word line in a program verification operation in a semiconductor memory device according to a fourth example of the third embodiment;

FIG. 43 is a block diagram of a SG_WLD selector included in a semiconductor memory device according to a fourth embodiment;

DETAILED DESCRIPTION

Figure 3:
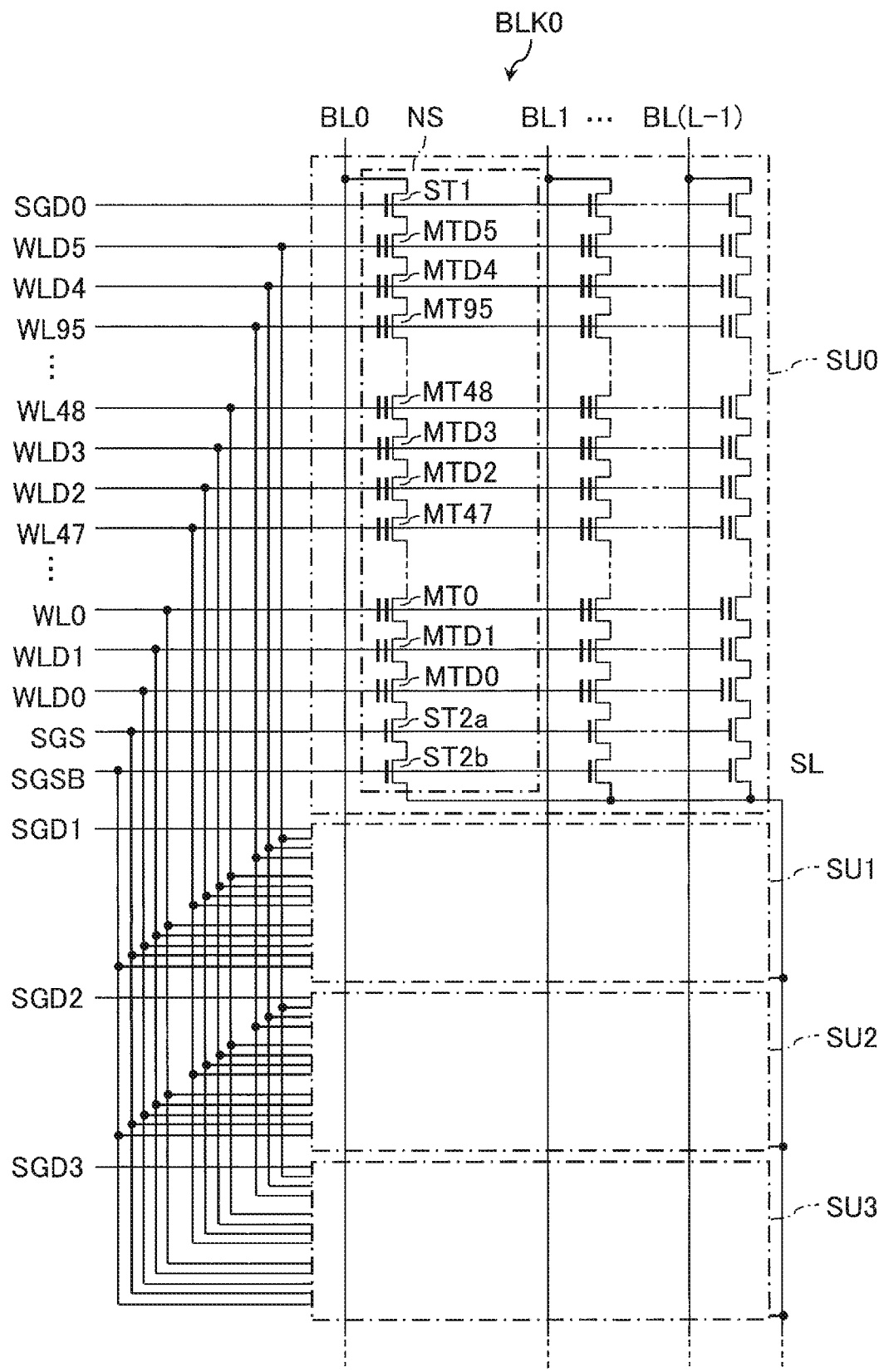
FIG. 3 is a circuit diagram of a memory cell array included in the semiconductor memory device according to the first embodiment.

In general, according to one embodiment, a semiconductor memory device includes: a memory cell array including a first memory cell, a first word line coupled to a gate of the first memory cell, a first circuit coupled to the first word line, a first driver used for a write operation and a read operation, a second driver used for an erase operation, and a voltage generator respectively coupled to the first and second drivers. The first circuit includes: a second circuit capable of electrically coupling the first word line and a first interconnect in the write operation, the read operation, and the erase operation in which the first word line is selected; a third circuit capable of electrically coupling the first interconnect and a second interconnect in the write operation, the read operation, and the erase operation; a fourth circuit capable of electrically coupling the second interconnect and the first driver in the write operation and the read operation; and a fifth circuit capable of electrically coupling the second interconnect and the second driver in the erase operation.

1. First Embodiment

A semiconductor memory device according to a first embodiment will be described. Hereinafter, a three-dimensional stacked NAND-type flash memory, in which a memory cell transistor is three-dimensionally stacked above a semiconductor substrate, will be described as an example of the semiconductor memory device.

1.1 Configuration 1.1.1 Overall Configuration of Semiconductor Memory Device

First, an overall configuration of the semiconductor memory device will be described with reference to FIG. 1. In an example of FIG. 1, some of the couplings between blocks are indicated by arrows; however, the couplings in the configuration are not limited to those shown in FIG. 1.

As shown in FIG. 1, a semiconductor memory device 1 generally includes a core circuit part 2 and a peripheral circuitry part 3.

The core circuit part 2 includes, for example, sixteen planes PB (PB0 to PB15). A plane PB includes a memory cell array (to be described later), and is a unit for performing an operation of writing data to a memory cell transistor and an operation of reading data from a memory cell transistor, etc. Planes PB0 to PB15 are both independently and simultaneously operable. The planes PB0 to PB15 in the present embodiment have the same configuration. For example, the planes PB0 to PB15 are arranged in a matrix of 4 rows×4 columns. In the example shown in FIG. 1, the planes PB0, PB4, PB8, and PB12 are arranged in the same column in this order, and the planes PB1, PB5, PB9, and PB13 are arranged in the same column in this order. Similarly, the planes PB2, PB6, PB10, and PB14 are arranged in the same column in this order, and the planes PB3, PB7, PB11, and PB15 are arranged in the same column in this order. The number and arrangement of the planes PB are discretionary.

The peripheral circuitry part 3 includes: a row driver 10, a row driver controller 11, a PB controller 12, a voltage generator 13, and a sequencer 14.

The row driver 10 supplies a voltage applied from the voltage generator 13 to each plane PB, based on a control signal received from the row driver controller 11.

The row driver controller 11 controls the row driver 10 and the voltage generator 13, based on control information and address information (e.g., a page address) received from the sequencer 14. The row driver controller 11 controls the row driver 10. More specifically, the row driver controller 11 controls voltages to be applied to interconnects (a word line and a select gate line, etc.—to be described later) in a row direction provided in the planes PB, and the timing at which to apply.

The voltage generator 13 generates voltages necessary for write, read, and erase operations based on the control of the sequencer 14 or the row driver controller 11. For example, the voltage generator 13 supplies a voltage necessary for the interconnects in the row direction to the row driver 10.

The PB controller 12 controls a plurality of circuits coupled to the interconnects in the row direction in the planes PB, based on the control and address information (e.g., a plane address, a chunk address, a block address, or a page address, etc.) of the sequencer 14.

The sequencer 14 controls an overall operation of the semiconductor memory device 1. More specifically, the sequencer 14 controls the write, read, and erase operations in each plane PB, based on various commands input from an external controller.

1.1.2 Configuration of Plane

Next, a configuration of the plane PB will be described with reference to FIG. 2. An example of FIG. 2 shows the plane PB0, but the other planes PB have the same configuration.

As shown in FIG. 2, the plane PB includes a memory cell array 20, two row selectors 21A and 21B, and a sense amplifier 25.

The memory cell array 20 includes, for example, four blocks BLK (BLK0 to BLK3), each including non-volatile memory cell transistors individually associated with a row and a column. Each of the blocks BLK includes, for example, four string units SU (SU0 to SU3). The number of blocks BLK and the number of string units SU in each block BLK in the memory cell array 20 are discretionary. Details of the block BLK will be described later.

A row selector 21A supplies a voltage to interconnects in the row direction of the blocks BLK0 and BLK2. The row selector 21A includes a row decoder 22A, a WL selector 23A, and a SG_WLD selector 24A.

The row decoder 22A decodes the address information and selects the block BLK0 or BLK2. More specifically, for example, when the block BLK0 is selected, the row decoder 22A electrically couples interconnects GWL0 to GWL95, GSGD0 to GSGD3, GSGS, GSGSB, and GWLD0 to GWLD5 with word lines WL0 to WL95, select gate lines SGD0 to SGD3, SGS0, and SGSB, and dummy word lines WLD0 to WLD5, which correspond to the selected block BLK0, respectively. The same applies to when the block BLK2 is selected.

The WL selector 23A supplies voltages to be applied to the word lines WL of the selected block BLK to the row decoder 22A, according to a control signal CSHV received from the PB controller 12. More specifically, a plurality of input terminals of the WL selector 23A are respectively coupled to the row driver 10 via interconnects CGA<11:0>, CGB<11:0>, CG0, CG95, CGU<7:0>, CGE<7:0>, CG47e, CG48e, CG0e, CG95e, and UCG. A plurality of output terminals of the WL selector 23A are respectively coupled to the row decoder 22A via the interconnects GWL0 to GWL95. Then, the WL selector 23A electrically couples the row decoder 22A and the row driver 10 when the block BLK0 or BLK2 is selected.

The SG_WLD selector 24A supplies voltages to be applied to the select gate lines SGD0 to SGD3, SGS, and SGSB, and the dummy word lines WLD0 to WLD5 of the selected block BLK to the row decoder 22A, according to a control signal CSHV received from the PB controller 12. More specifically, a plurality of input terminals of the SG_WLD selector 24A are respectively coupled to the row driver 10 via interconnects SGD_SEL, SGD_USEL, SGS_SEL, SGSB_SEL, CG_D<5:0>, SGD_SELe, SGD_USELe, SGS_SELe, SGSB_SELe, CG_De<5:0>, and USG. A plurality of output terminals of the SG_WLD selector 24A are respectively coupled to the row decoder 22A via interconnects GSGD0 to GSGD3, GSGS, GSGSB, and GWLD0 to GWLD5. Then, the SG_WLD selector 24A electrically couples the row decoder 22A and the row driver 10 when the block BLK0 or BLK2 is selected.

A row selector 21B supplies a voltage to interconnects in the row direction of the blocks BLK1 and BLK3. The row selector 21B has the same configuration as that of the row selector 21A, and includes a row decoder 22B, a WL selector 23B, and a SG_WLD selector 24B. Hereinafter, the row selectors 21A and 21B will be respectively referred to as "the row selector 21", unless otherwise specified.

The row decoder 22B has the same configuration as that of the row decoder 22A. It decodes the address information and selects the block BLK1 or BLK3. Hereinafter, the row decoders 22A and 22B will be respectively referred to as "the row decoder 22", unless otherwise specified.

The WL selector 23B has the same configuration as that of the WL selector 23A, and supplies voltages to be applied to the word lines WL of the selected block BLK to the row decoder 22B, according to a control signal CSHV received from the PB controller 12. Hereinafter, the WL selectors 23A and 23B will be respectively referred to as "the WL selector 23", unless otherwise specified.

The SG_WLD selector 24B has the same configuration as that of the SG_WLD selector 24A, and supplies voltages to be applied to the select gate lines SGD0 to SGD3, SGS, and SGSB, and the dummy word lines WLD0 to WLD5 of the selected block BLK to the row decoder 22B, according to a control signal CSHV received from the PB controller 12. Hereinafter, the SG_WLD selectors 24A and 24B will be respectively referred to as "the SG_WLD selector 24", unless otherwise specified.

In the read operation, the sense amplifier 25 senses data read onto a plurality of bit lines BL. In the write operation, the sense amplifier 25 transfers write data to the memory cell transistor via the bit lines BL.

1.1.3 Configuration of Memory Cell Array

Next, a configuration of the memory cell array 20 will be described with reference to FIG. 3. An example in FIG. 3 shows a configuration of the block BLK0; however, the other blocks BLK have the same configuration.

The block BLK0 includes a plurality of NAND strings NS, each including memory cell transistors coupled together in series. Each of the NAND strings NS includes, for example, ninety six memory cell transistors MT (MT0 to MT95), six dummy memory cell transistors MTD0 to MTD5, a select transistor ST1, and two select transistors ST2 (ST2a and ST2b). Hereinafter, the memory cell transistors MT0 to MT95 will be respectively referred to as "the memory cell transistor MT", unless otherwise specified. The dummy memory cell transistors MTD0 to MTD5 will be respectively referred to as "the dummy memory cell transistor MTD", unless otherwise specified.

Each of the memory cell transistors MT, and each of the dummy memory cell transistors MTD, are provided with a control gate and a charge storage layer. The memory cell transistors MT hold data in a nonvolatile manner. The dummy memory cell transistors MTD have the same configuration as that of the memory cell transistors MT, but are used as a dummy, not for holding data.

The memory cell transistors MT, and the dummy memory cell transistors MTD, may be of a MONOS type using insulating films for the charge storage layers, or an FG type using conductive layers for the charge storage layers. In the present embodiment, a MONOS type will be explained by way of example. The number of memory cell transistors MT may be 8, 16, 32, 64, 128, etc., and the number thereof is not limited. In addition, the number of dummy memory cell transistors MTD and the number of select transistors ST1 and ST2 are discretionary. Each of the select transistors ST1 and ST2 may be one or more in number.

Current paths of the memory cell transistors MT, the dummy memory cell transistors MTD, the select transistor ST1, and the select transistors ST2a and ST2b are coupled together in series. More specifically, current paths of the select transistor ST2b, the select transistor ST2a, the dummy memory cell transistors MTD0 and MID1, the memory cell transistors MT0 to MT47, the dummy memory cell transistors MTD2 and MTD3, the memory cell transistors MT48 to MT95, the dummy memory cell transistors MTD4 and MTD5, and the select transistor ST1 are coupled together in series. Then, a drain of the select transistor ST1 is coupled to any one of the bit lines BL, and a source of the select transistor ST2b is coupled to a source line SL.

Gates of a plurality of select transistors ST1 in the string unit SU0 are coupled in common to the select gate line SGD0. Similarly, gates of a plurality of select transistors ST1 in the string unit SU1 are coupled in common to the select gate line SGD1. Gates of a plurality of select transistors ST1 in the string unit SU2 are coupled in common to the select gate line SGD2. Gates of a plurality of select transistors ST1 in the string unit SU3 are coupled in common to the select gate line SGD3. Hereinafter, the select gate lines SGD0 to SGD3 will be respectively referred to as "the select gate line SGD", unless otherwise specified.

In the string units SU0 to SU3, gates of a plurality of select transistors ST2a are coupled in common to the select gate line SGS, and gates of a plurality of select transistors ST2b are coupled in common to the select gate line SGSB.

Select gate lines SGS0 to SGS3 and SGSB0 to SGSB3, corresponding to the string units SU0 to SU3, may be provided. In this case, gates of a plurality of select transistors ST2a in the string unit SU0 are coupled in common to the select gate line SGS0, and gates of a plurality of select transistors ST2b are coupled in common to the select gate line SGSB0. Similarly, gates of a plurality of select transistors ST2a in the string unit SU1 are coupled in common to the select gate line SGS1, and gates of a plurality of select transistors ST2b are coupled in common to the select gate line SGSB1. Gates of a plurality of select transistors ST2a in the string unit SU2 are coupled in common to the select gate line SGS2, and gates of a plurality of select transistors ST2b are coupled in common to the select gate line SGSB2. Gates of a plurality of select transistors ST2a in the string unit SU3 are coupled in common to the select gate line SGS3, and gates of a plurality of select transistors ST2b are coupled in common to the select gate line SGSB3.

The plurality of memory cell transistors MT0 to MT95 in one block BLK have their control gates coupled in common to the word lines WL0 to WL95, respectively. The dummy memory cell transistors MTD0 to MTD5 in one block BLK have their control gates coupled in common to the dummy word lines WLD0 to WLD5, respectively. Hereinafter, the word lines WL0 to WL95 will be respectively referred to as "the word line WL", unless otherwise specified. The dummy word lines WLD0 to WLD5 will be respectively referred to as "the dummy word line WLD", unless otherwise specified.

In one string unit SU, the select transistors ST1 of the NAND strings NS have their drains coupled respectively to different bit lines BL0 to BL (L−1, where L is an integer of 2 or more). Hereinafter, the bit lines BL0 to BL (L−1) will be respectively referred to as "the bit line BL", unless otherwise specified. Each bit line BL couples one NAND string NS included in each string unit SU in a plurality of blocks BLK. Moreover, sources of a plurality of select transistors ST2b are coupled in common to the source line SL. That is, each string unit SU is an assembly of NAND strings NS coupled to the different bit lines BL, and coupled to the same select gate line SGD. Each block BLK is an assembly of a plurality of string units SU sharing the word lines WL. The memory cell array 20 is an assembly of a plurality of blocks BLK which share the bit lines BL.

A write operation and a read operation are performed together on the memory cell transistors MT coupled to any one of the word lines WL, in any one of the string units SU.

The memory cell array 20 may have other configurations. The configuration of the memory cell array 20 is described in, for example, U.S. patent application Ser. No. 14/407,403 entitled "THREE DIMENSIONAL STACKED NON-VOLATILE SEMICONDUCTOR MEMORY" filed on Mar. 19, 2009. It is additionally described in U.S. patent application Ser. No. 12/406,524 entitled "THREE DIMENSIONAL STACKED NONVOLATILE SEMICONDUCTOR MEMORY" filed on Mar. 18, 2009; U.S. patent application Ser. No. 12/679,991 entitled "NON-VOLATILE SEMICONDUCTOR STORAGE DEVICE AND METHOD OF MANUFACTURING THE SAME" filed on Mar. 25, 2010; and U.S. patent application Ser. No. 12/532,030 entitled "SEMICONDUCTOR MEMORY AND METHOD FOR MANUFACTURING SAME" filed on Mar. 23, 2009. The entire contents of these patent applications are incorporated herein by reference.

1.1.4 Cross-Sectional Configuration of Memory Cell Array

Next, a cross-sectional configuration of the memory cell array 20 will be described with reference to FIG. 4. In an example of FIG. 4, some of the insulating films are omitted. For simplification of the descriptions, a contact formed on a memory pillar MP and a bit line BL coupled to the contact are omitted.

Figure 4:
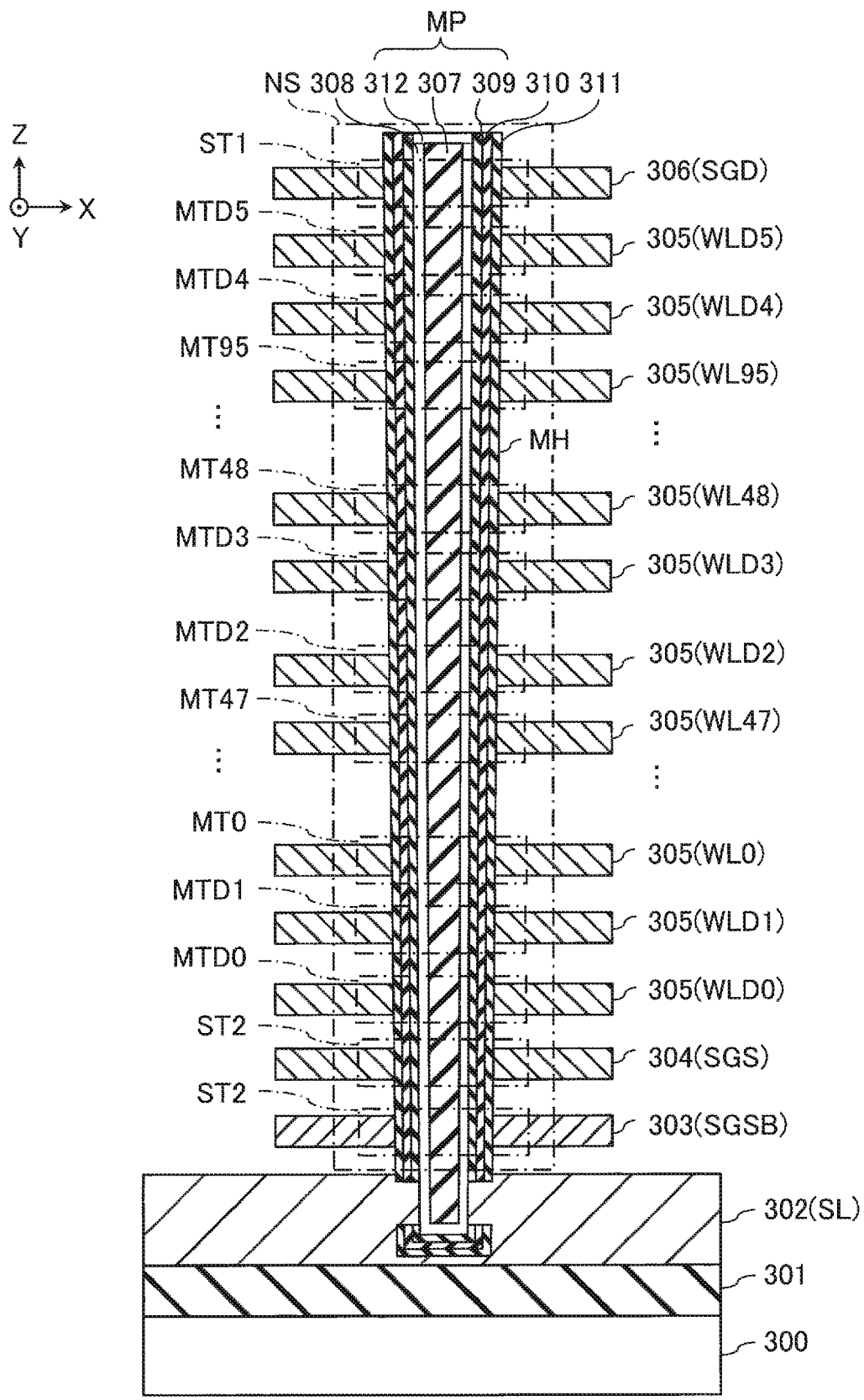
FIG. 4 is a sectional view of the memory cell array included in the semiconductor memory device according to the first embodiment.

As shown in FIG. 4, an insulating layer 301 is formed on a semiconductor substrate 300. For the insulating layer 301, for example, a silicon oxide film ($SiO_2$) is used. Circuits in the plane PB, such as the row selectors 21A and 21B and the sense amplifier 25, may be provided in a region where the insulating layer 301 is formed, i.e., between the semiconductor substrate 300 and the source line SL.

A conductive layer 302 which functions as a source line SL is stacked on the insulating layer 301. The conductive layer 302 is formed by a conductive material. For said conductive material, a metallic material, such as tungsten (W), tungsten silicide (WSi), and tungsten nitride (WN), or a n-type semiconductor obtained by doping impurities to a semiconductor such as silicon (Si), etc., may be used.

Above the conductive layer 302, an interconnect layer 303 that functions as the select gate line SGSB is formed with an insulating layer interposed therebetween (not shown). Above the interconnect layer 303, an interconnect layer 304 that functions as the select gate line SGS is formed.

Above the interconnect layer 304, one hundred and two interconnect layers 305, that respectively function as the dummy word lines WLD0 and WLD1, the word lines WL0 to WL47, the dummy word lines WLD2 and WLD3, the word lines WL48 to WL95, and the dummy word lines WLD4 and WLD5 in this order from the bottom layer, are stacked with a space being interposed therebetween.

Above the uppermost interconnect layer 305, an interconnect layer 306 that functions as the select gate line SGD is formed.

For the interconnect layers 303 to 306, for example, a metallic material such as W, an n-type semiconductor, or a p-type semiconductor, etc. may be used as a conductive material.

The memory pillar MP is formed in such a manner that the memory pillar MP passes through one hundred and five interconnect layers 303 to 306, and reaches the conductive layer 302 with its bottom surface. One memory pillar MP corresponds to one NAND string NS.

The memory pillar MP includes a core layer 307, a semiconductor layer 308, a tunnel insulating film 309, a charge storage layer 310, a block insulating film 311, and a cap layer 312.

More specifically, a memory hole MH is formed in such a manner as to pass through one hundred and five interconnect layers 303 to 306, and reach the conductive layer 302. On a bottom surface and part of a side surface of the memory hole MH, the block insulating film 311, the charge storage layer 310, and the tunnel insulating film 309 are formed in this order. The inside of the memory hole MH is filled with the semiconductor layer 308 and the core layer 307, and the cap layer 312 is provided on the semiconductor layer 308 and the core layer 307. The semiconductor layer 308 is a region where channels of the memory cell transistors MT, the dummy memory cell transistors MTD, and the select transistors ST1 and ST2 (ST2a and ST2b) are formed. Inside the conductive layer 302, part of the block insulating film 311, the charge storage layer 310, and the tunnel insulating film 309, formed on the side surface of the memory hole MH, is removed. Thus, part of the side surface of the semiconductor layer 308 is in contact with the conductive layer 302.

The memory cell transistors MT0 to MT95 are formed by part of the memory pillar MP and the interconnect layers 305 that function as the word lines WL0 to WL95. Similarly, the dummy memory cell transistors MTD0 to MTD5 are formed by part of the memory pillar MP and the interconnect layers 305 that function as the dummy word lines WLD0 to WLD5. The select transistor ST2b is formed by part of the memory pillar MP and the interconnect layer 303 that functions as the select gate line SGSB. The select transistor ST2a is formed by part of the memory pillar MP and the interconnect layer 304 that functions as the select gate line SGS. The select transistor ST1 is formed by part of the memory pillar MP and the interconnect layer 306 that functions as the select gate line SGD.

For the block insulating film 311, the tunnel insulating film 309, and the core layer 307, for example, $SiO_2$ is used. For the charge storage layer 310, for example, a silicon nitride film (SiN) is used. For the semiconductor layer 308, for example, polysilicon is used. For the cap layer 312, for example, an n-type semiconductor, etc., may be used as a conductive material.

The memory pillar MP may have a stacked structure of two stages or more.

1.1.5 Configuration of Row Driver

Figure 5:
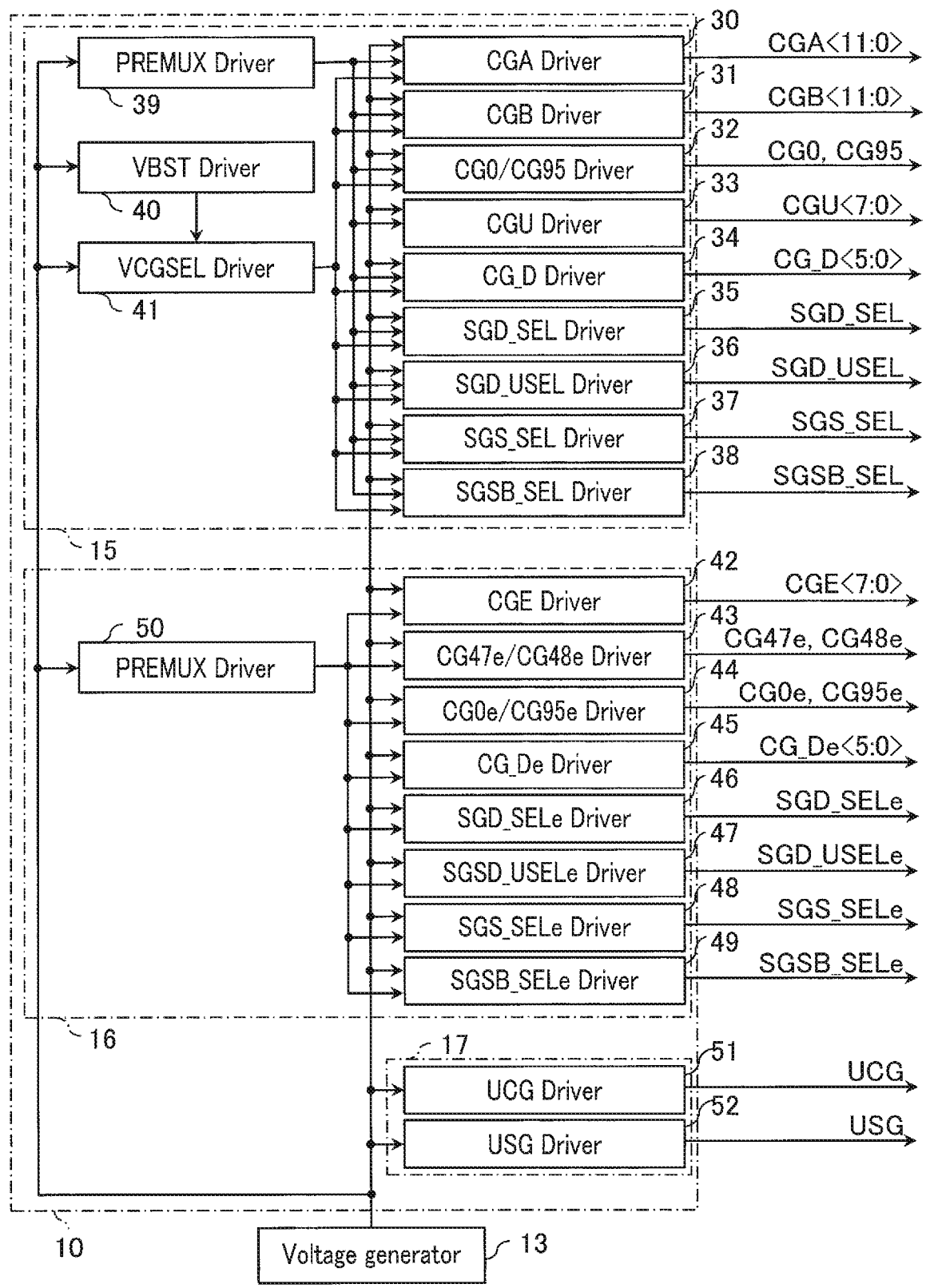
FIG. 5 is a block diagram of a row driver included in the semiconductor memory device according to the first embodiment.

Next, a configuration of the row driver 10 will be described with reference to FIG. 5.

The row driver 10 includes a driver unit 15 for write/read operations, a driver unit 16 for erase operation, and a common driver unit 17.

The driver unit 15 for write/read operations is used for write and read operations. The driver unit 15 for write/read operations includes: a CGA driver 30, a CGB driver 31, a CG0/CG95 driver 32, a CGU driver 33, a CG_D driver 34, a SGD_SEL driver 35, a SGD_USEL driver 36, a SGS_SEL driver 37, a SGSB_SEL driver 38, a PREMUX driver 39, a VBST driver 40, and a VCGSEL driver 41.

The CGA driver 30 supplies voltages to be applied to a plurality of word lines WL (e.g., any of the word lines WL1 to WL94) corresponding to a selected block BLK serving as a target for the write and read operations. The CGA driver 30 applies voltages supplied from the voltage generator 13, the PREMUX driver 39, and the VCGSEL driver 41 to twelve interconnects CGA<11:0>. The interconnects CGA<11:0> are coupled to each plane PB. The interconnects CGA<11:0> are electrically coupled to a plurality of word lines WL corresponding to the selected block BLK via the row selector 21A or 21B. Hereinafter, the twelve interconnects CGA<11:0> will be respectively referred to as "the interconnect CGA", unless otherwise specified. The number of interconnects CGA that couple the CGA driver 30 and each plane PB is discretionary.

Similarly to the CGA driver 30, the CGB driver 31 supplies voltages to be applied to a plurality of word lines WL (e.g., any of the word lines WL1 to WL94) corresponding to the selected block BLK. The CGB driver 31 applies voltages supplied from the voltage generator 13, the PREMUX driver 39, and the VCGSEL driver 41 to twelve interconnects CGB<11:0>. The interconnects CGB<11:0> are coupled to each plane PB. The interconnects CGB<11:0> are electrically coupled to a plurality of word lines WL corresponding to the selected block BLK via the row selector 21A or 21B. Hereinafter, the twelve interconnects CGB<11:0> will be respectively referred to as "the interconnect CGB", unless otherwise specified. The number of interconnects CGB that couple the CGB driver 31 and each plane PB is discretionary.

The CG0/CG95 driver 32 supplies voltages to be applied to the word lines WL0 and WL95 corresponding to the selected block BLK. The CG0/CG95 driver 32 applies voltages supplied from the voltage generator 13, the PREMUX driver 39, and the VCGSEL driver 41 to the interconnects CG0 and CG95. The interconnects CG0 and CG95 are coupled to each plane PB. The interconnects CG0 and CG95 are electrically coupled to the word lines WL0 and WL95 corresponding to the selected block BLK via the row selector 21A or 21B.

The CGU driver 33 supplies a voltage to be applied to unselected word lines WL corresponding to the selected block BLK. The CGU driver 33 applies voltages supplied from the voltage generator 13 and the PREMUX driver 39 to eight interconnects CGU<7:0>. The interconnects CGU<7:0> are coupled to each plane PB. The interconnects CGU<7:0> are electrically coupled to the unselected word lines WL in the selected block BLK (to which the interconnects CGA<11:0>, the interconnects CGB<11:0>, and the interconnects CG0 and CG95 are not coupled) via the row selector 21A or 21B. Hereinafter, the eight interconnects CGU<7:0> will be respectively referred to as "the interconnect CGU", unless otherwise specified.

The CG_D driver 34 supplies voltages to be applied to the dummy word lines WLD0 to WLD5 corresponding to the selected block BLK. The CG_D driver 34 applies voltages supplied from the voltage generator 13, the PREMUX driver 39, and the VCGSEL driver 41 to six interconnects CG_D<5:0>. The interconnects CG_D<5:0> are coupled to each plane PB. The interconnects CG_D<5:0> are electrically coupled to the dummy word lines WLD0 to WLD5 corresponding to the selected block BLK via the row selector 21A or 21B. Hereinafter, the six interconnects CG_D<5:0> will be respectively referred to as "the interconnect CG_D", unless otherwise specified. If the dummy word lines WLD are not provided, it may not be necessary to provide the CG_D driver 34.

The SGD_SEL driver 35 supplies a voltage to be applied to a select gate line SGD corresponding to a selected string unit SU in the selected block BLK. The SGD_SEL driver 35 applies voltages supplied from the voltage generator 13, the PREMUX driver 39, and the VCGSEL driver 41 to the interconnect SGD_SEL. The interconnect SGD_SEL is coupled to each plane PB. The interconnect SGD_SEL is electrically coupled to the select gate line SGD, corresponding to the selected string unit SU of the selected block BLK, via the row selector 21A or 21B.

The SGD_USEL driver 36 supplies voltages to be applied to select gate lines SGD corresponding to unselected string units SU in the selected block BLK. The SGD_USEL driver 36 applies voltages supplied from the voltage generator 13, the PREMUX driver 39, and the VCGSEL driver 41 to an interconnect SGD_USEL. The interconnect SGD_USEL is coupled to each plane PB. The interconnect SGD_USEL is electrically coupled to the select gate lines SGD, corresponding to the unselected string units SU of the selected block BLK, via the row selector 21A or 21B.

The SGS_SEL driver 37 supplies a voltage to be applied to a select gate line SGS corresponding to the selected block BLK. The SGS_SEL driver 37 applies voltages supplied from the voltage generator 13, the PREMUX driver 39, and the VCGSEL driver 41 to an interconnect SGS_SEL. The interconnect SGS_SEL is coupled to each plane PB. The interconnect SGS_SEL is electrically coupled to the select gate line SGS, corresponding to the selected block BLK, via the row selector 21A or 21B.

The SGSB_SEL driver 38 supplies a voltage to be applied to a select gate line SGSB corresponding to a selected block BLK. The SGSB_SEL driver 38 applies voltages supplied from the voltage generator 13, the PREMUX driver 39, and the VCGSEL driver 41 to an interconnect SGSB_SEL. The interconnect SGSB_SEL is coupled to each plane PB. The interconnect SGSB_SEL is electrically coupled to a select gate line SGSB, corresponding to the selected block BLK, via the row selector 21A or 21B.

The PREMUX driver 39 selects at least one of a plurality of voltages supplied from the voltage generator 13, and supplies the voltage to the CGA driver 30, the CGB driver 31, the CG0/CG95 driver 32, the CGU driver 33, the CG_D driver 34, the SGD_SEL driver 35, the SGD_USEL driver 36, the SGS_SEL driver 37, and the SGSB_SEL driver 38.

The VCGSEL driver 41 supplies relatively high voltages necessary for the write and read operations, supplied from the voltage generator 13, to the CGA driver 30, the CGB driver 31, the CG0/CG95 driver 32, the CG_D driver 34, the SGD_SEL driver 35, the SGD_USEL driver 36, the SGS_SEL driver 37, and the SGSB_SEL driver 38. The VCGSEL driver 41 includes a switch element and a level shifter LSTP corresponding to relatively high voltages.

The VBST driver 40 supplies a relatively high voltage necessary for driving the VCGSEL driver 41, supplied from the voltage generator 13, to the VCGSEL driver 41. The VBST driver 40 includes a switch element and a level shifter LSTP corresponding to relatively high voltages.

Next, the driver unit 16 for erase operation will be described.

The driver unit 16 for erase operation is used for the erase operation. The driver unit 16 for erase operation includes: a CGE driver 42, a CG47e/CG48e driver 43, a CG0e/CG95e driver 44, a CG_De driver 45, a SGD_SELe driver 46, a SGD_USELe driver 47, a SGS_SELe driver 48, a SGSB_SELe driver 49, and a PREMUX driver 50.

The CGE driver 42 supplies voltages to be applied to a plurality of word lines WL (e.g., any of the word lines WL1 to WL46 and WL49 to WL94), corresponding to the selected block BLK that serves as a target for the erase operation. The CGE driver 42 applies voltages supplied from the voltage generator 13 and the PREMUX driver 50 to eight interconnects CGE<7:0>. The interconnects CGE<7:0> are coupled to each plane PB. The interconnects CGE<7:0> are electrically coupled to a plurality of word lines WL, corresponding to the selected block BLK, via the row selector 21A or 21B. Hereinafter, the eight interconnects CGE<7:0> will be respectively referred to as "the interconnect CGE", unless otherwise specified. The number of interconnects CGE that couple the eight interconnects CGE<7:0> and each plane PB is discretionary.

The CG47e/CG48e driver 43 supplies voltages to be applied to the word lines WL47 and WL48 corresponding to the selected block BLK. The CG47e/CG48e driver 43 applies voltages supplied from the voltage generator 13 and the PREMUX driver 50 to interconnects CG47e and CG48e. The interconnects CG47e and CG48e are coupled to each plane PB. The interconnects CG47e and CG48e are electrically coupled to the word lines WL47 and WL48, corresponding to the selected block BLK, via the row selector 21A or 21B.

The CG0e/CG95e driver 44 supplies voltages to be applied to the word lines WL0 and WL95, corresponding to the selected block BLK. The CG0e/CG95e driver 44 applies voltages supplied from the voltage generator 13 and the PREMUX driver 50 to interconnects CG0e and CG95e. The interconnects CG0e and CG95e are coupled to each plane PB. The interconnects CG0e and CG95e are electrically coupled to the word lines WL0 and WL95, corresponding to the selected block BLK via the row selector 21A or 21B.

The CG_De driver 45 supplies voltages to be applied to the dummy word lines WLD0 to WLD5, corresponding to the selected block BLK. The CG_De driver 45 applies voltages supplied from the voltage generator 13 and the PREMUX driver 50 to six interconnects CG_De<5:0>. The interconnects CG_De<5:0> are coupled to each plane PB. The interconnects CG_De<5:0> are electrically coupled to the dummy word lines WLD0 to WLD5, corresponding to the selected block BLK via the row selector 21A or 21B. Hereinafter, the six interconnects CG_De<5:0> will be respectively referred to as "the interconnect CG_De", unless otherwise specified. If the dummy word line WLD is not provided, it may not be necessary to provide the CG_De driver 45.

The SGD_SELe driver 46 supplies voltages to be applied to the select gate line SGD, corresponding to the selected string unit SU in the selected block BLK. The SGD_SELe driver 46 applies voltages supplied from the voltage generator 13 and the PREMUX driver 50 to an interconnect SGD_SELe. The interconnect SGD_SELe is coupled to each plane PB. The interconnect SGD_SELe is electrically coupled to the select gate line SGD, corresponding to the selected string unit SU of the selected block BLK, via the row selector 21A or 21B.

The SGD_USELe driver 47 supplies voltages to be applied to the select gate lines SGD, corresponding to the unselected string units SU in the selected block BLK. The SGD_USELe driver 47 applies voltages supplied from the voltage generator 13 and the PREMUX driver 50 to an interconnect SGD_USELe. The interconnect SGD_USELe is coupled to each plane PB. The interconnect SGD_USELe is electrically coupled to the select gate lines SGD, corresponding to the unselected string units SU in the selected block BLK, via the row selector 21A or 21B.

The SGS_SELe driver 48 supplies a voltage to be applied to the select gate line SGS corresponding to the selected block BLK. The SGS_SELe driver 48 applies voltages supplied from the voltage generator 13 and the PREMUX driver 50 to an interconnect SGS_SELe. The interconnect SGS_SELe is coupled to each plane PB. The interconnect SGS_SELe is electrically coupled to the select gate line SGS, corresponding to the selected block BLK, via the row selector 21A or 21B.

The SGSB_SELe driver 49 supplies a voltage to be applied to the select gate line SGSB corresponding to the selected block BLK. The SGSB_SELe driver 49 applies voltages supplied from the voltage generator 13 and the PREMUX driver 50 to an interconnect SGSB_SELe. The interconnect SGSB_SELe is coupled to each plane PB. The interconnect SGSB_SELe is electrically coupled to the select gate line SGSB, corresponding to the selected block BLK, via the row selector 21A or 21B.

Similarly to the PREMUX driver 39, the PREMUX driver 50 selects at least one of a plurality of voltages supplied from the voltage generator 13, and supplies the voltage to the CGE driver 42, the CG47e/CG48e driver 43, the CG0e/CG95e driver 44, the CG_De driver 45, the SGD_SELe driver 46, the SGD_USELe driver 47, the SGS_SELe driver 48, and the SGSB_SELe driver 49.

Next, the common driver unit 17 will be described.

The common driver unit 17 includes a UCG driver 51 and a USG driver 52.

The UCG driver 51 supplies voltages to be applied to word lines WL corresponding to unselected blocks BLK. The UCG driver 51 applies a voltage supplied from the voltage generator 13 to an interconnect UCG. The interconnect UCG is coupled to each plane PB. The interconnect UCG is electrically coupled to the word lines WL in the unselected blocks BLK via the row selector 21A or 21B.

The USG driver 52 supplies voltages to be applied to select gate lines SGD, SGS, and SGSB corresponding to unselected string units SU in the unselected blocks BLK. The USG driver 52 applies a voltage supplied from the voltage generator 13 to an interconnect USG. The interconnect USG is coupled to each plane PB. The interconnect USG is electrically coupled to the select gate lines SGD, SGS, and SGSB corresponding to the unselected string units SU in the unselected blocks BLK (to which the interconnects SGD_SEL, SGD_USEL, SGS_SEL, SGSB_SEL, SGD_SELe, SGD_USELe, SGS_SELe, and SGSB_SELe are not coupled) via the row selector 21A or 21B.

1.1.6 Configuration of Row Selector

Next, the configuration of the row selector will be described. Hereinafter, the configuration of the row selector 21A will be mainly described, but the row selector 21B also has the same configuration.

1.1.6.1 Regarding Configuration of Row Decoder

Figure 6:
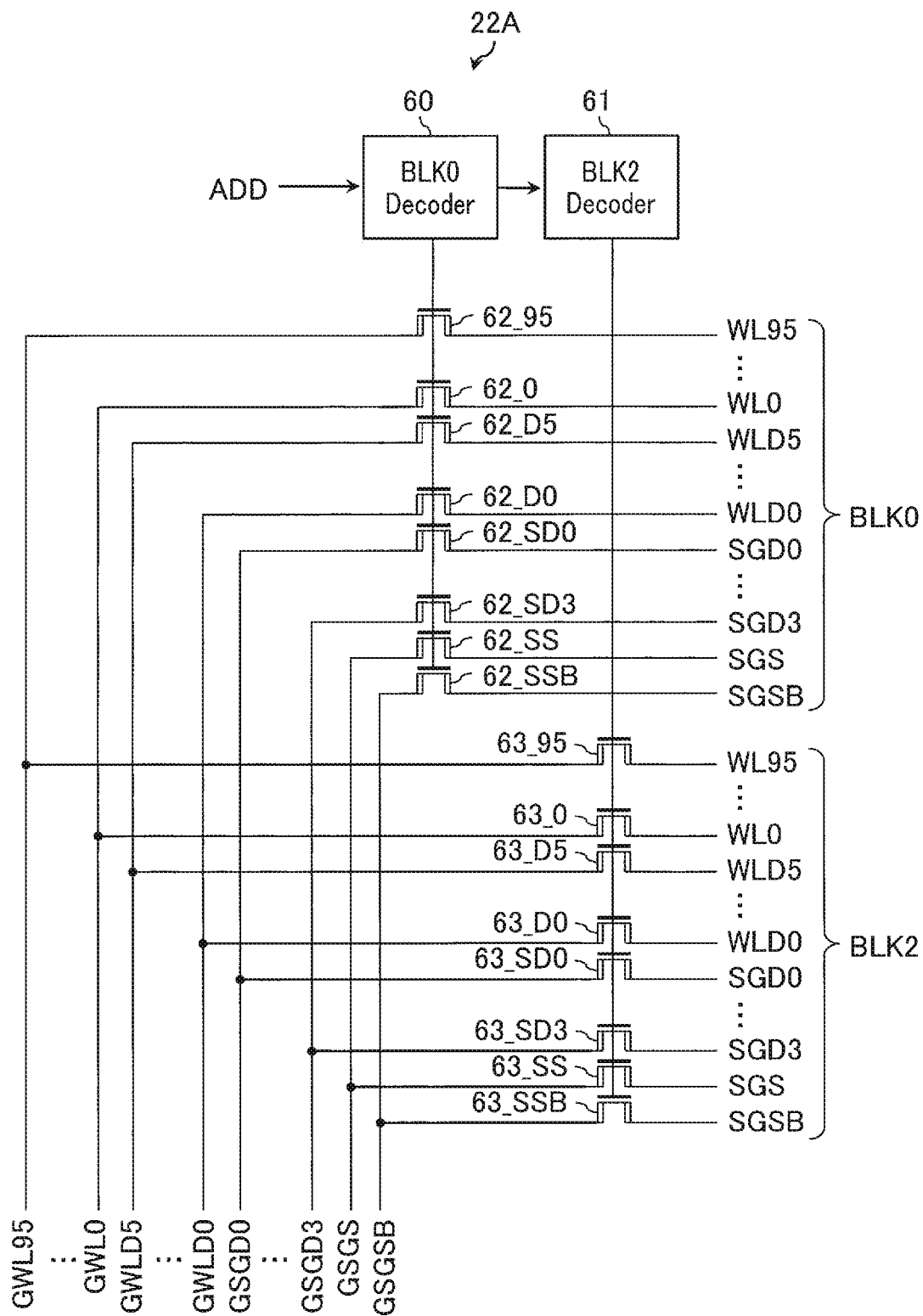
FIG. 6 is a block diagram of a row decoder included in the semiconductor memory device according to the first embodiment.

First, the configuration of the row driver 22 will be described with reference to FIG. 6. An example of FIG. 6 shows the row decoder 22A, but the row decoder 22B also has the same configuration. In the following descriptions, if a source and a drain of a transistor are not specified, either one of the source and the drain of the transistor is referred to as "one end of the transistor," and the other is referred to as "the other end of the transistor" or simply "the other end."

As shown in FIG. 6, the row decoder 22A includes: a BLK0 decoder 60, a BLK2 decoder 61, a hundred and eight high-voltage n-channel MOS transistors 62 (62_0 to 62_95, 62_D0 to 62_D5, 62_SD0 to 62_SD3, 62_SS, and 62_SSB), and a hundred and eight high-voltage n-channel MOS transistors 63 (63_0 to 63_95, 63_D0 to 63_D5, 63_SD0 to 63_SD3, 63_SS, and 63_SSB).

The BLK0 decoder 60 decodes address information ADD (e.g., a block address). Then, the BLK0 decoder 60 controls an on/off state of corresponding transistors 62 according to a decoding result.

More specifically, if the block BLK0 is selected, the BLK0 decoder 60 sets the transistors 62 (62_0 to 62_95, 62_D0 to 62_D5, 62_SD0 to 62_SD3, 62_SS, and 62_SSB) to an on state. Thereby, the interconnects GWL0 to GWL95, GWLD0 to GWLD5, GSGD0 to GSGD3, GSGS, and GSGSB are electrically coupled to the word lines WL0 to WL95, the dummy word lines WLD0 to WLD5, and the select gate lines SGD0 to SGD3, SGS, and SGSB of the corresponding block BLK0, respectively.

The BLK2 decoder 61 decodes the address information ADD (e.g., a block address). Then, the BLK2 decoder 61 controls an on/off state of corresponding transistors 63 according to a decoding result.

More specifically, if the block BLK2 is selected, the BLK2 decoder 61 sets the transistors 63 (63_0 to 63_95, 63_D0 to 63_D5, 63_SD0 to 63_SD3, 63_SS, and 63_SSB) to an on state. Thereby, the interconnects GWL0 to GWL95, GWLD0 to GWLD5, GSGD0 to GSGD3, GSGS, and GSGSB are electrically coupled to the word lines WL0 to WL95, the dummy word lines WLD0 to WLD5, and the select gate lines SGD0 to SGD3, SGS, and SGSB of the corresponding block BLK2, respectively.

The transistors 62_0 to 62_95 function as switching elements that couple the interconnects GWL0 to GWL95 and the word lines WL0 to WL95 of the corresponding block BLK0, respectively. One set of ends of the transistors 62_0 to 62_95 is coupled to the word lines WL0 to WL95 of the corresponding block BLK0, respectively, and the other set of ends is coupled to the interconnects GWL0 to GWL95, respectively. Gates of the transistors 62_0 to 62_95 are coupled in common to the BLK0 decoder 60.

The transistors 62_D0 to 62_D5 function as switching elements that couple the interconnects GWLD0 to GWLD5 and the dummy word lines WLD0 to WLD5 of the corresponding block BLK0, respectively. One set of ends of the transistors 62_D0 to 62_D5 is coupled to the dummy word lines WLD0 to WLD5 of the corresponding block BLK0, respectively, and the other set of ends is coupled to the interconnects GWLD0 to GWLD5, respectively. Gates of the transistors 62_D0 to 62_D5 are coupled in common to the BLK0 decoder 60.

The transistors 62_SD0 to 62_SD3 function as switching elements that couple the interconnects GSGD0 to GSGD3 and the select gate lines SGD0 to SGD3 of the corresponding block BLK0, respectively. One set of ends of the transistors 62_SD0 to 62_SD3 is coupled to the select gate lines SGD0 to SGD3 of the corresponding block BLK0, respectively, and the other set of ends is coupled to the interconnects GSGD0 to GSGD3, respectively. Gates of the transistors 62_SD0 to 62_SD3 are coupled in common to the BLK0 decoder 60.

The transistors 62_SS and 62_SSB function as switching elements that couple the interconnects GSGS and GSGSB and the select gate lines SGS and SGSB of the corresponding block BLK0, respectively. One set of ends of the transistors 62_SS and 62_SSB is coupled to the select gate lines SGS and SGSB of the corresponding block BLK0, respectively, and the other set of ends is coupled to the interconnects GSGS and GSGSB, respectively. Gates of the transistors 62_SS and 62_SSB are coupled to the BLK0 decoder 60.

For example, transistors that respectively couple ground voltage (VSS) interconnects and the select gate lines SGD0 to SGD3, SGS, and SGSB of the corresponding block BLK0, may be provided. In this case, an inverting signal of the BLK0 decoder 60 is input to a gate of each transistor.

The configuration of the transistors 63 is the same as that of the transistors 62.

One set of ends of the transistors 63_0 to 63_95 is coupled to the word lines WL0 to WL95 of the corresponding block BLK2, respectively, and the other set of ends is coupled to the interconnects GWL0 to GWL95, respectively. Gates of the transistors 63_0 to 63_95 are coupled in common to the BLK2 decoder 61.

One set of ends of the transistors 63_D0 to 63_D5 is coupled to the dummy word lines WLD0 to WLD5 of the corresponding block BLK2, respectively, and the other set of ends is coupled to the interconnects GWLD0 to GWLD5, respectively. Gates of the transistors 63_D0 to 63_D5 are coupled in common to the BLK2 decoder 61.

One set of ends of the transistors 63_SD0 to 63_SD3 is coupled to the select gate lines SGD0 to SGD3 of the corresponding block BLK2, respectively, and the other set of ends is coupled to the interconnects GSGD0 to GSGD3, respectively. Gates of the transistors 63_SD0 to 63_SD3 are coupled in common to the BLK2 decoder 61.

One set of ends of the transistors 63_SS and 63_SSB is coupled to the select gate lines SGS and SGSB of the corresponding block BLK2, respectively, and the other set of ends is coupled to the interconnects GSGS and GSGSB, respectively. Gates of the transistors 63_SS and 63_SSB are coupled to the BLK2 decoder 61.

1.1.6.2 Configuration of WL Selector

Next, the configuration of the WL selector will be described. Hereinafter, the configuration of the WL selector 23A will mainly be described, but the configuration of the WL selector 23B is also the same as that of the WL selector 23A.

1.1.6.2.1 Overall Configuration of WL Selector

First, the overall configuration of the WL selector 23A will be described with reference to FIG. 7.

As shown in FIG. 7, the WL selector 23A includes a chunk selector 70, a WR/RD zone selector 80, and an ER zone selector 90.

The chunk selector 70 applies voltages to the interconnects GWL0 to GWL95 based on a control signal CSHV received from the PB controller 12. The interconnects UCG and CGI0 to CGI95 are respectively coupled to a plurality of input terminals of the chunk selector 70, and the interconnects GWL0 to GWL95 are respectively coupled to a plurality of output terminals of the chunk selector 70. Hereinafter, the interconnects CGI0 to CGI95 will be respectively referred to as "the interconnect CGI", unless otherwise specified.

The WR/RD zone selector 80 applies voltages to the interconnects CGI0 to CGI95 based on the control signal CSHV received from the PB controller 12 when executing the write and read operations. The interconnects CGU, CGA, CGB, CG0, and CG95 are respectively coupled to a plurality of input terminals of the WR/RD zone selector 80, and the interconnects CGI0 to CGI95 are respectively coupled to a plurality of output terminals of the WR/RD zone selector 80.

More specifically, the interconnects CGI0 to CGI95 are divided into, for example, eight zones in the WR/RD zone selector 80. One zone includes twelve interconnects CGI. In a zone including the interconnect CGI corresponding to the selected word line WL, the WR/RD zone selector 80 electrically couples the interconnects CGI and the interconnects CGA, CGB, CG0, or CG95. In zones not including the interconnect CGI corresponding to the selected word line WL, the WR/RD zone selector 80 electrically couples the interconnects CGI and the interconnects CGU. In other words, in the selected zone corresponding to the selected word line WL, the interconnects CGI and the CGA driver 30, the CGB driver 31, or the CG0/CG95 driver 32 (hereinafter, also referred to as "the selected CG driver") are electrically coupled; and in the unselected zones, the interconnects CGI and the CGU driver 33 (hereinafter, also referred to as "the unselected CG driver") are electrically coupled.

The ER zone selector 90 applies voltages to the interconnects CGI0 to CGI95 based on the control signal CSHV received from the PB controller 12, when executing the erase operation. The interconnects CGE, CG0e, CG47e, CG48e, and CG95e are respectively coupled to a plurality of input terminals, which correspond to an erase pulse application operation, of the ER zone selector 90; and the interconnects CGE, CG0e, CG47e, CG48e, and CG95e are respectively coupled to a plurality of input terminals of the ER zone selector 90, which correspond to an erase verification operation. The interconnects CGI0 to CGI95 are respectively coupled to a plurality of output terminals of the ER zone selector 90. In the present embodiment, a combination of the interconnects CGI included in one zone differs between the erase pulse application operation and the erase verification operation. Thus, the ER zone selector 90 uses different current paths in the erase pulse application operation to those of the erase verification operation.

The erase operation will be briefly described. The erase operation generally includes an erase pulse application operation and an erase verification operation. The erase pulse application operation is an operation of applying an erase pulse for lowering a threshold voltage of the memory cell transistor MT. The erase verification operation is an operation of determining whether the threshold voltage of the memory cell transistor MT has become lower than a target value as a result of performing the erase pulse application operation. By repeating a combination of the erase pulse application operation and the erase verification operation, the threshold voltage of the memory cell transistor MT is lowered to a target threshold voltage level.

1.1.6.2.2 Example of Configuration of Chunk Selector

Next, an example of the configuration of the chunk selector 70 will be described with reference to FIG. 8.

Figure 8:
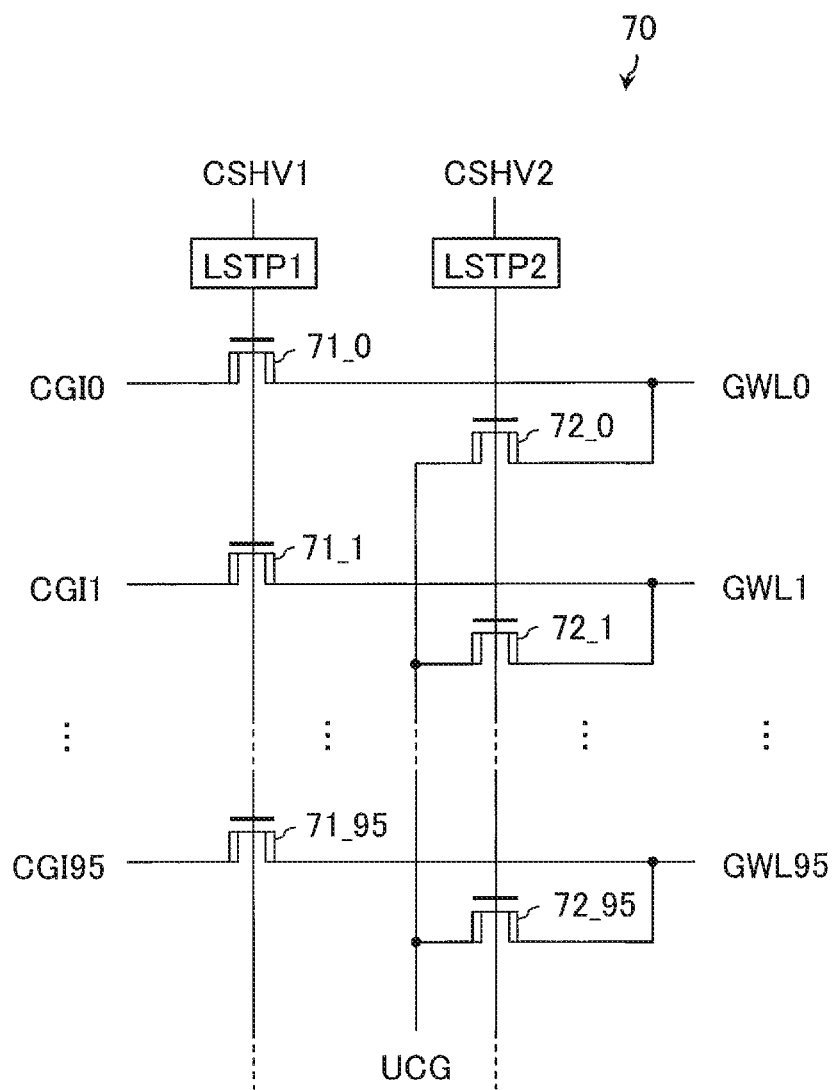
FIG. 8 is a circuit diagram of a chunk selector in the WL selector included in the semiconductor memory device according to the first embodiment.

As shown in FIG. 8, the chunk selector 70 includes high-voltage n-channel MOS transistors 71_0 to 71_95 and 72_0 to 72_95, and level shifters LSTP1 and LSTP2.

The transistors 71_0 to 71_95 function as switch elements that couple the interconnects GWL0 to GWL95 and the interconnects CGI0 to CGI95, respectively. One set of ends of the transistors 71_0 to 71_95 is coupled to the interconnects GWL0 to GWL95, respectively, and the other set of ends is coupled to the interconnects CGI0 to CGI95, respectively. Gates of the transistors 71_0 to 71_95 are coupled in common to the level shifter LSTP1.

The transistors 72_0 to 72_95 function as switch elements that couple the interconnects GWL0 to GWL95 and the interconnect UCG. One set of ends of the transistors 72_0 to 72_95 is coupled to the interconnects GWL0 to GWL95, respectively, and the other set of ends is coupled in common to the interconnect UCG. Gates of the transistors 72_0 to 72_95 are coupled in common to the level shifter LSTP2.

LSTP1 applies voltages to the gates of the transistors 71_0 to 71_95 based on a control signal CSHV1 received from the PB controller 12.

LSTP2 applies voltages to the gates of the transistors 72_0 to 72_95 based on a control signal CSHV2 received from the PB controller 12.

For example, when the interconnects GWL0 to GWL 95 and the interconnects CGI0 to CGI95 are electrically coupled, respectively, the transistors 71_0 to 71_95 are set to an on state. On the other hand, when the interconnects GWL0 to GWL95 and the interconnect UCG are electrically coupled, the transistors 72_0 to 72_95 are set to an on state.

1.1.6.2.3 Example of Configuration of WR/RD Zone Selector

Next, an example of a configuration of the WR/RD zone selector 80 will be described with reference to FIG. 9.

Figure 9:
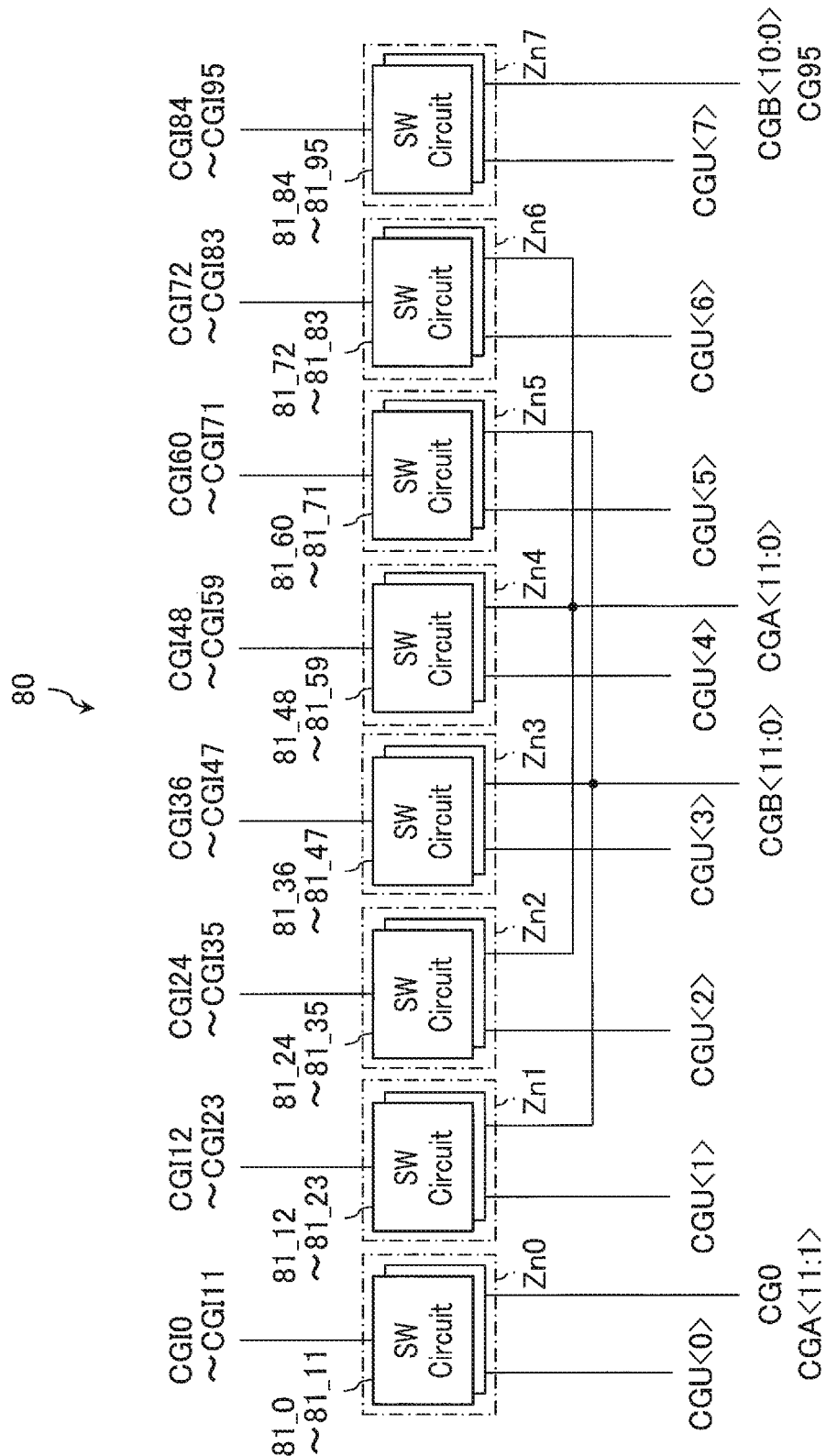
FIG. 9 is a block diagram of a WR/RD zone selector in the WL selector included in the semiconductor memory device according to the first embodiment.

As shown in FIG. 9, the WR/RD zone selector 80 includes eight zones Zn0 to Zn7.

The zone Zn0 corresponds to twelve interconnects CGI0 to CGI11. The zone Zn0 includes twelve switch circuits 81_0 to 81_11 respectively corresponding to the interconnects CGI0 to CGI11.

An interconnect CGU<0> is coupled to a first input terminal of the switch circuit 81_0, the interconnect CG0 is coupled to a second input terminal, and the interconnect CGI0 is coupled to an output terminal.

The interconnect CGU<0> is coupled in common to first input terminals of the switch circuits 81_1 to 81_11. Interconnects CGA<11:1> are respectively coupled to second input terminals of the switch circuits 81_1 to 81_11. The interconnects CGI1 to CGI11 are respectively coupled to output terminals of the switch circuits 81_1 to 81_11.

The zone Zn1 corresponds to twelve interconnects CGI12 to CGI23. The zone Zn1 includes twelve switch circuits 81_12 to 81_23 respectively corresponding to the interconnects CGI12 to CGI23.

An interconnect CGU<1> is coupled in common to first input terminals of switch circuits 81_12 to 81_23. Interconnects CGB<11:0> are respectively coupled to second input terminals of the switch circuits 81_12 to 81_23. The interconnects CGI12 to CGI23 are respectively coupled to output terminals of the switch circuits 81_12 to 81_23.

The zone Zn2 corresponds to twelve interconnects CGI24 to CGI35. The zone Zn2 includes twelve switch circuits 81_24 to 81_35 respectively corresponding to the interconnects CGI24 to CGI35.

An interconnect CGU<2> is coupled in common to first input terminals of the switch circuits 81_24 to 81_35. Interconnects CGA<11:0> are respectively coupled to second input terminals of the switch circuits 81_24 to 81_35. The interconnects CGI24 to CGI35 are respectively coupled to output terminals of the switch circuits 81_24 to 81_35.

The zone Zn3 corresponds to twelve interconnects CGI36 to CGI47. The zone Zn3 includes twelve switch circuits 81_36 to 81_47 respectively corresponding to the interconnects CGI36 to CGI47.

An interconnect CGU<3> is coupled in common to first input terminals of the switch circuits 81_36 to 81_47. The interconnects CGB<11:0> are respectively coupled to second input terminals of the switch circuits 81_36 to 81_47. The interconnects CGI36 to CGI47 are respectively coupled to output terminals of the switch circuits 81_36 to 81_47.

The zone Zn4 corresponds to twelve interconnects CGI48 to CGI59. The zone Zn4 includes twelve switch circuits 81_48 to 81_59 respectively corresponding to the interconnects CGI48 to CGI59.

An interconnect CGU<4> is coupled in common to first input terminals of the switch circuits 81_48 to 81_59. The interconnects CGA<11:0> are respectively coupled to second input terminals of the switch circuits 81_48 to 81_59. The interconnects CGI48 to CGI59 are respectively coupled to output terminals of the switch circuits 81_48 to 81_59.

The zone Zn5 corresponds to twelve interconnects CGI60 to CGI71. The zone Zn5 includes twelve switch circuits 81_60 to 81_71 respectively corresponding to the interconnects CGI60 to CGI71.

An interconnect CGU<5> is coupled in common to first input terminals of the switch circuits 81_60 to 81_71. The interconnects CGB<11:0> are respectively coupled to second input terminals of the switch circuits 81_60 to 81_71. The interconnects CGI60 to CGI71 are respectively coupled to output terminals of the switch circuits 81_60 to 81_71.

The zone Zn6 corresponds to twelve interconnects CGI72 to CGI83. The zone Zn6 includes twelve switch circuits 81_72 to 81_83 respectively corresponding to the interconnects CGI72 to CGI83.

An interconnect CGU<6> is coupled in common to first input terminals of the switch circuits 81_72 to 81_83. The interconnects CGA<11:0> are respectively coupled to second input terminals of the switch circuits 81_72 to 81_83. The interconnects CGI72 to CGI83 are respectively coupled to output terminals of the switch circuits 81_72 to 81_83.

The zone Zn7 corresponds to twelve interconnects CGI84 to CGI95. The zone Zn7 includes twelve switch circuits 81_84 to 81_95 respectively corresponding to the interconnects CGI84 to CGI95.

An interconnect CGU<7> is coupled in common to first input terminals of the switch circuits 81_84 to 81_94. Interconnects CGB<10:0> are respectively coupled to second input terminals of the switch circuits 81_84 to 81_94. The interconnects CGI84 to CGI94 are respectively coupled to output terminals of the switch circuits 81_84 to 81_94.

An interconnect CGU<7> is coupled to a first input terminal of the switch circuit 81_95, the interconnect CG95 is coupled to a second input terminal, and the interconnect CGI95 is coupled to an output terminal.

Hereinafter, the switch circuits 81_0 to 81_95 will be respectively referred to as "the switch circuit 81", unless otherwise specified.

Next, an example of the switch circuit 81 in each zone Zn will be described with reference to FIGS. 10 to 17.

As shown in FIG. 10, the zone Zn0 includes high-voltage n-channel MOS transistors 82_0 to 82_11 and 83_0 to 83_11, and level shifters LSTP3_0 and LSTP4_0.

The switch circuit 81_0 includes the transistors 82_0 and 83_0. The switch circuit 81_1 includes the transistors 82_1 and 83_1. The other switch circuits 81_2 to 81_11 have the same configuration, e.g., the switch circuit 81_11 includes the transistors 82_11 and 83_11.

One set of ends of the transistors 82_0 to 82_11 is coupled to the interconnects CG0 and CGA<1> to CGA<11>, respectively, and the other set of ends is coupled to the interconnects CGI0 to CGI11, respectively. Gates of the transistors 82_0 to 82_11 are coupled in common to the level shifter LSTP3_0.

One set of ends of the transistors 83_0 to 83_11 is coupled in common to the interconnect CGU<0>, and the other set of ends is respectively coupled to the interconnects CGI0 to CGI11. Gates of the transistors 83_0 to 83_11 are coupled in common to the level shifter LSTP4_0.

LSTP3_0 applies voltages to the gates of the transistors 82_0 to 82_11 based on a control signal CSHV3_0 received from the PB controller 12.

LSTP4_0 applies voltages to the gates of the transistors 83_0 to 83_11 based on a control signal CSHV4_0 received from the PB controller 12.

For example, if any one of the interconnects CGI0 to CGI11 corresponds to the selected word line WL, the transistors 82_0 to 82_11 are set to an on state, and the interconnects CGI0 to CGI11, and the interconnects CG0 and CGA<1> to CGA<11> are electrically coupled, respectively. In addition, if the interconnects CGI0 to CGI11 do not correspond to the selected word line WL, the transistors 83_0 to 83_11 are set to an on state, and the interconnects CGI0 to CGI11 and the interconnect CGU<0> are electrically coupled.

Figure 11:
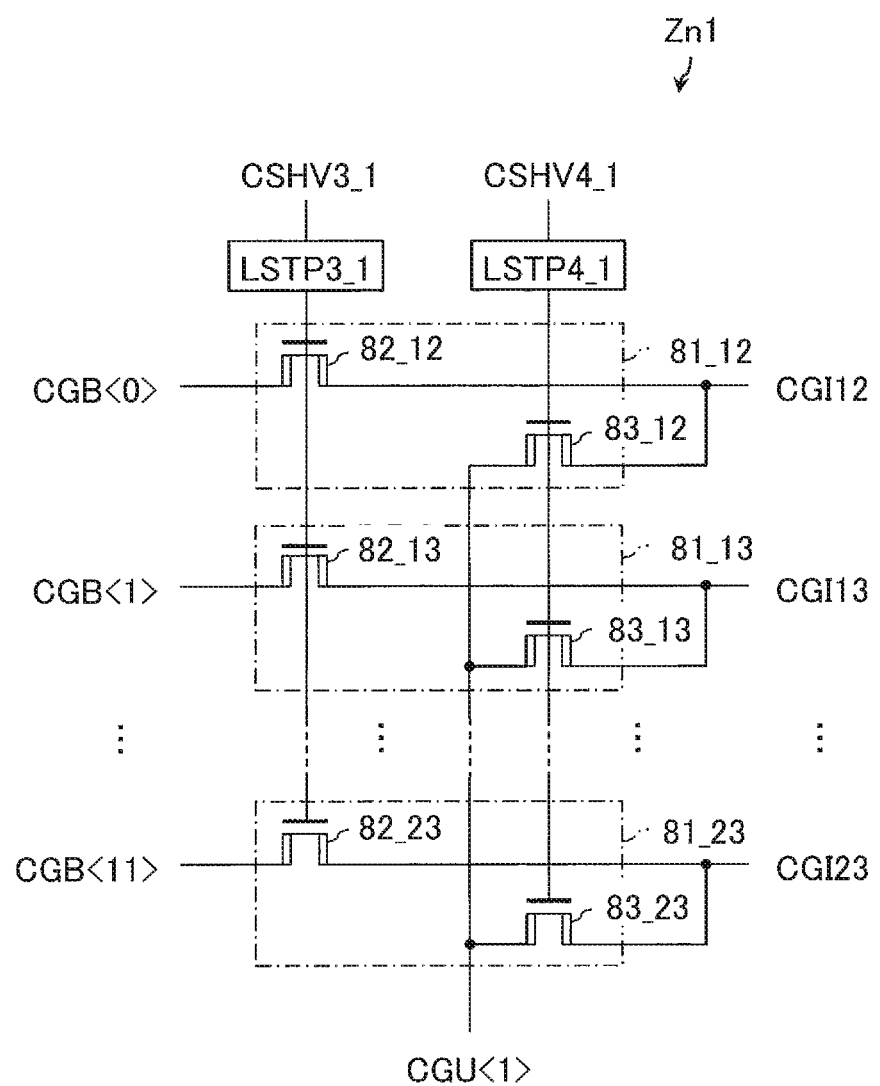
FIG. 11 is a circuit diagram of a switch circuit of a zone Zn1 in the WR/RD zone selector included in the semiconductor memory device according to the first embodiment.

As shown in FIG. 11, the zone Zn1 includes high-voltage n-channel MOS transistors 82_12 to 82_23 and 83_12 to 83_23, and level shifters LSTP3_1 and LSTP4_1.

The switch circuit 81_12 includes the transistors 82_12 and 83_12. The switch circuit 81_13 includes the transistors 82_13 and 83_13. The other switch circuits 81_14 to 81_23 have the same configuration, e.g., the switch circuit 81_23 includes the transistors 82_23 and 83_23.

One set of ends of the transistors 82_12 to 82_23 is coupled to the interconnects CGB<0> to CGB<11>, respectively, and the other set of ends is coupled to the interconnects CGI12 to CGI23, respectively. Gates of the transistors 82_12 to 82_23 are coupled in common to a level shifter LSTP3_1.

One set of ends of the transistors 83_12 to 83_23 is coupled in common to the interconnect CGU<1>, and the other set of ends is respectively coupled to the interconnects CGI12 to CGI23. Gates of the transistors 83_12 to 83_23 are coupled in common to the level shifter LSTP4_1.

LSTP3_1 applies voltages to the gates of the transistors 82_12 to 82_23 based on a control signal CSHV3_1 received from the PB controller 12.

LSTP4_1 applies voltages to the gates of the transistors 83_12 to 83_23 based on a control signal CSHV4_1 received from the PB controller 12.

For example, if any one of the interconnects CGI12 to CGI23 corresponds to the selected word line WL, the transistors 82_12 to 82_23 are set to an on state, and the interconnects CGI12 to CGI23 and the interconnects CGB<0> to CGB<11> are electrically coupled, respectively. In addition, if the interconnects CGI12 to CGI23 do not correspond to the selected word line WL, the transistors 83_12 to 83_23 are set to an on state, and the interconnects CGI12 to CGI23 and the interconnect CGU<1> are electrically coupled.

Figure 12:
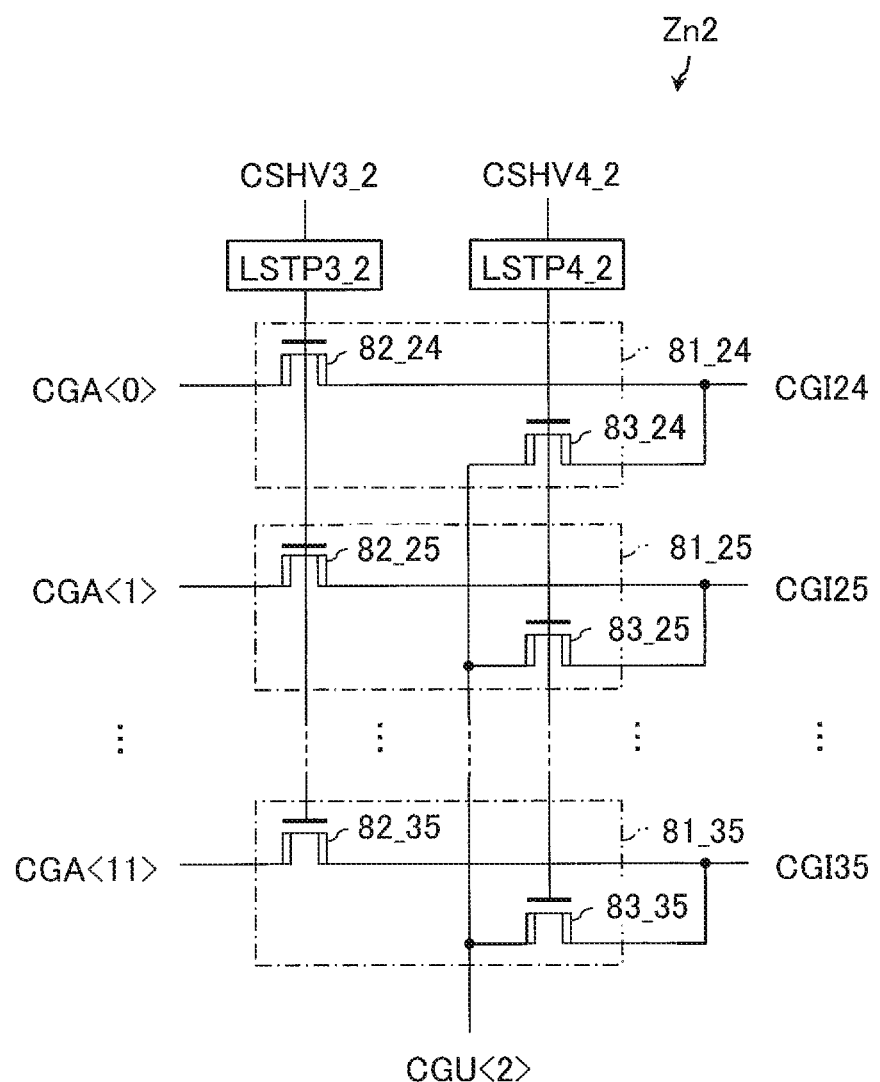
FIG. 12 is a circuit diagram of a switch circuit of a zone Zn2 in the WR/RD zone selector included in the semiconductor memory device according to the first embodiment.

As shown in FIG. 12, the zone Zn2 includes the high-voltage n-channel MOS transistors 82_24 to 82_35 and 83_24 to 83_35, and level shifters LSTP3_2 and LSTP4_2.

The switch circuit 81_24 includes the transistors 82_24 and 83_24. The switch circuit 81_25 includes the transistors 82_25 and 83_25. The other switch circuits 81_26 to 81_35 have the same configuration, e.g., the switch circuit 81_35 includes the transistors 82_35 and 83_35.

One set of ends of the transistors 82_24 to 82_35 is coupled to the interconnects CGA<0> to CGA<11>, respectively, and the other set of ends is coupled to the interconnects CGI24 to CGI35, respectively. Gates of the transistors 82_24 to 82_35 are coupled in common to a level shifter LSTP3_2.

One set of ends of the transistors 83_24 to 83_35 is coupled in common to the interconnect CGU<2>, and the other set of ends is coupled to the interconnects CGI24 to CGI35, respectively. Gates of the transistors 83_24 to 83_35 are coupled in common to a level shifter LSTP4_2.

LSTP3_2 applies voltages to the gates of the transistors 82_24 to 82_35 based on a control signal CSHV3_2 received from the PB controller 12.

LSTP4_2 applies voltages to the gates of the transistors 83_24 to 83_35 based on a control signal CSHV4_2 received from the PB controller 12.

For example, if anyone of the interconnects CGI24 to CGI35 corresponds to the selected word line WL, the transistors 82_24 to 82_35 are set to an on state, and the interconnects CGI24 to CGI35 and the interconnects CGA<0> to CGA<11> are electrically coupled, respectively. In addition, if the interconnects CGI24 to CGI35 do not correspond to the selected word line WL, the transistors 83_24 to 83_35 are set to an on state, and the interconnects CGI24 to CGI35 and the interconnect CGU<2> are electrically coupled.

Figure 13:
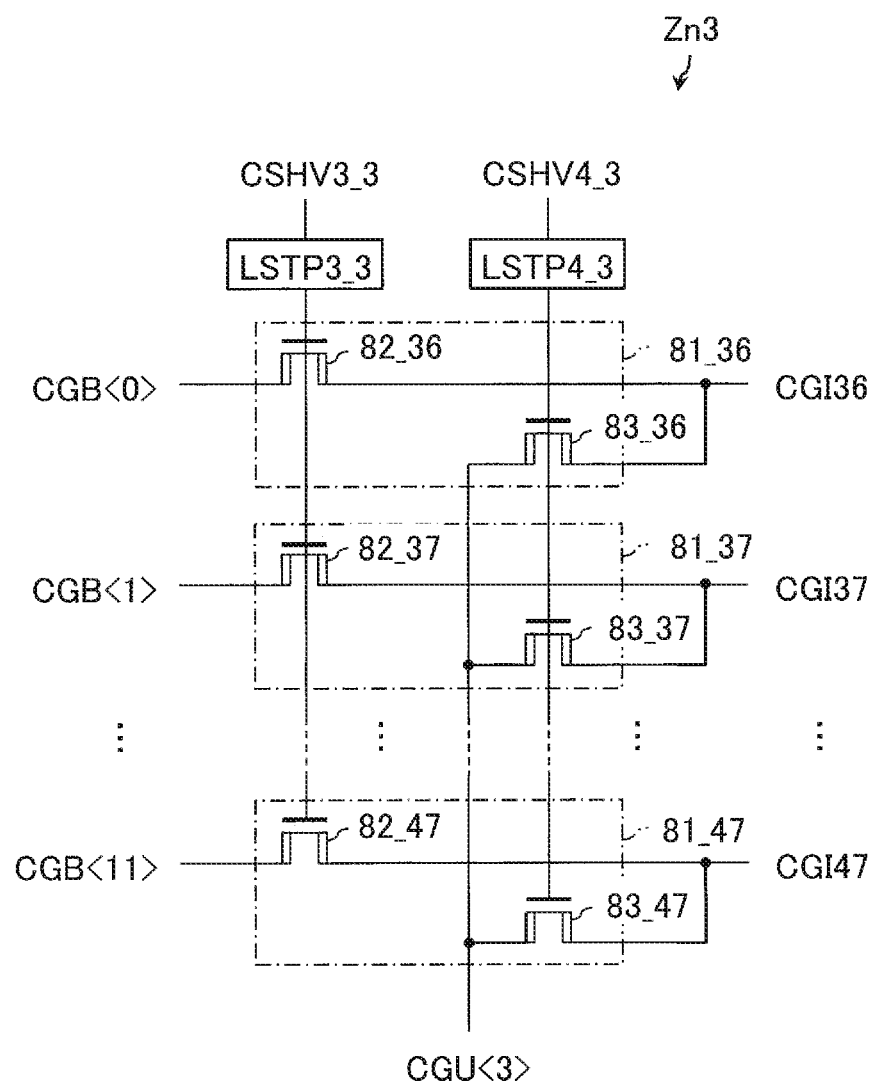
FIG. 13 is a circuit diagram of a switch circuit of a zone Zn3 in the WR/RD zone selector included in the semiconductor memory device according to the first embodiment.

As shown in FIG. 13, the zone Zn3 includes high-voltage n-channel MOS transistors 82_36 to 82_47 and 83_36 to 83_47, and level shifters LSTP3_3 and LSTP4_3.

The switch circuit 81_36 includes the transistors 82_36 and 83_36. The switch circuit 81_37 includes the transistors 82_37 and 83_37. The other switch circuits 81_38 to 81_47 have the same configuration, e.g., the switch circuit 81_47 includes the transistors 82_47 and 83_47.

One set of ends of the transistors 82_36 to 82_47 is coupled to the interconnects CGB<0> to CGB<11>, respectively, and the other set of ends is coupled to the interconnects CGI36 to CGI47, respectively. Gates of the transistors 82_36 to 82_47 are coupled in common to the level shifter LSTP3_3.

One set of ends of the transistors 83_36 to 83_47 is coupled in common to the interconnect CGU<3>, and the other set of ends is coupled to the interconnects CGI36 to CGI47, respectively. Gates of the transistors 83_36 to 83_47 are coupled in common to the level shifter LSTP4_3.

LSTP3_3 applies voltages to the gates of the transistors 82_36 to 82_47 based on a control signal CSHV3_3 received from the PB controller 12.

LSTP4_3 applies voltages to the gates of the transistors 83_36 to 83_47 based on a control signal CSHV4_3 received from the PB controller 12.

For example, if any one of the interconnects CGI36 to CGI47 corresponds to the selected word line WL, the transistors 82_36 to 82_47 are set to an on state, and the interconnects CGI36 to CGI47 and the interconnects CGB<0> to CGB<11> are electrically coupled, respectively. In addition, if the interconnects CGI36 to CGI47 do not correspond to the selected word line WL, the transistors 83_36 to 83_47 are set to an on state, and the interconnects CGI36 to CGI47 and the interconnect CGU<3> are electrically coupled.

Figure 14:
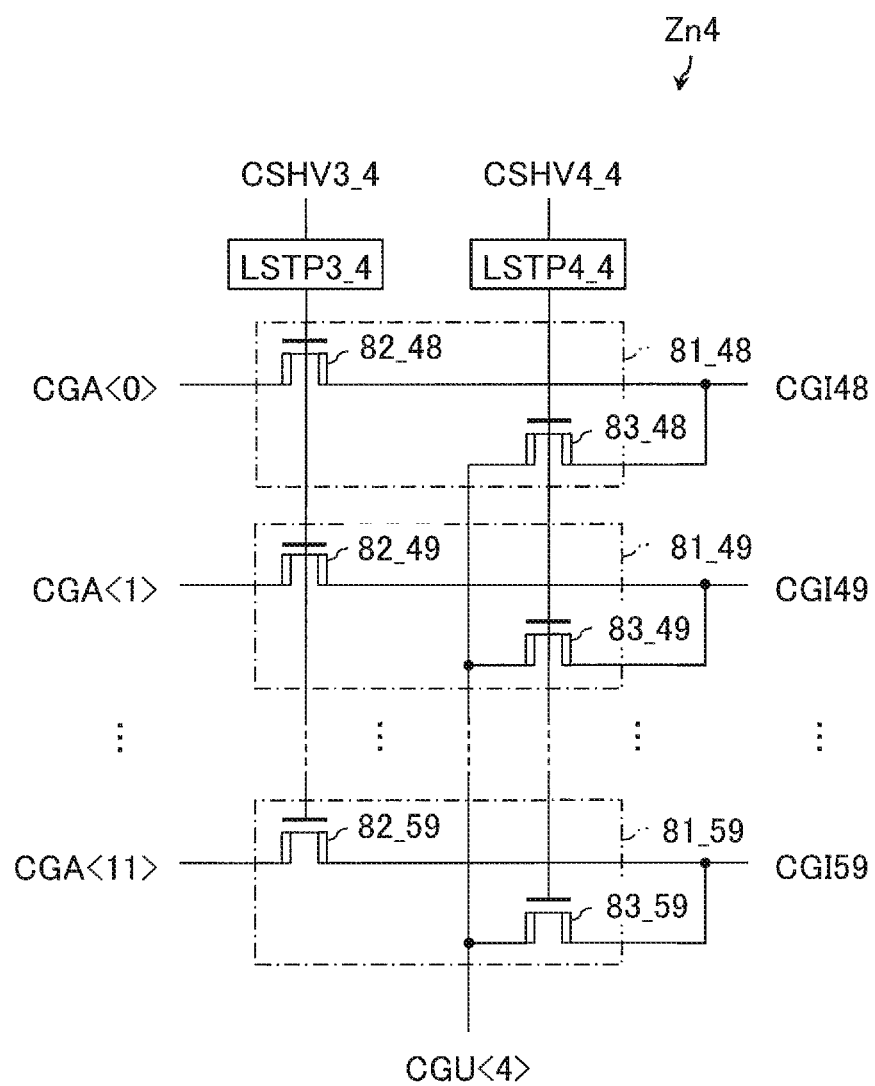
FIG. 14 is a circuit diagram of a switch circuit of a zone Zn4 in the WR/RD zone selector included in the semiconductor memory device according to the first embodiment.

As shown in FIG. 14, the zone Zn4 includes high-voltage n-channel MOS transistors 82_48 to 82_59 and 83_48 to 83_59, and level shifters LSTP3_4 and LSTP4_4.

The switch circuit 81_48 includes the transistors 82_48 and 83_48. The switch circuit 81_49 includes the transistors 82_49 and 83_49. The other switch circuits 81_50 to 81_59 have the same configuration, e.g., the switch circuit 81_59 includes the transistors 82_59 and 83_59.

One set of ends of the transistors 82_48 to 82_59 is coupled to the interconnects CGA<0> to CGA<11>, respectively, and the other set of ends is coupled to the interconnects CGI48 to CGI59, respectively. Gates of the transistors 82_48 to 82_59 are coupled in common to the level shifter LSTP3_4.

One set of ends of the transistors 83_48 to 83_59 is coupled in common to the interconnect CGU<4>, and the other set of ends is coupled to the interconnects CGI48 to CGI59, respectively. Gates of the transistors 83_48 to 83_59 are coupled in common to the level shifter LSTP4_4.

LSTP3_4 applies voltages to the gates of the transistors 82_48 to 82_59 based on a control signal CSHV3_4 received from the PB controller 12.

LSTP4_4 applies voltages to the gates of the transistors 83_48 to 83_59 based on a control signal CSHV4_4 received from the PB controller 12.

For example, if anyone of the interconnects CGI48 to CGI59 corresponds to the selected word line WL, the transistors 82_48 to 82_59 are set to an on state, and the interconnects CGI48 to CGI59 and the interconnects CGA<0> to CGA<11> are electrically coupled, respectively. In addition, if the interconnects CGI48 to CGI59 do not correspond to the selected word line WL, the transistors 83_48 to 83_59 are set to an on state, and the interconnects CGI48 to CGI59 and the interconnect CGU<4> are electrically coupled.

Figure 15:
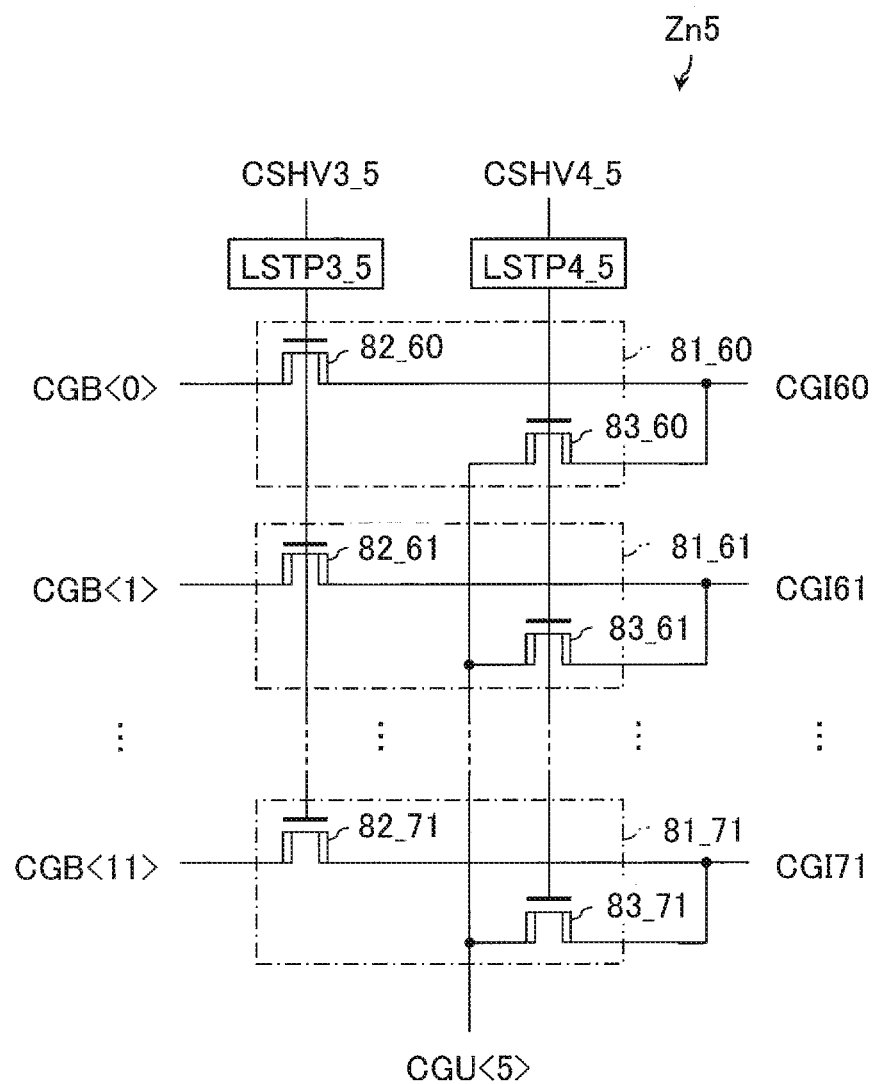
FIG. 15 is a circuit diagram of a switch circuit of a zone Zn5 in the WR/RD zone selector included in the semiconductor memory device according to the first embodiment.

As shown in FIG. 15, the zone Zn5 includes high-voltage n-channel MOS transistors 82_60 to 82_71 and 83_60 to 83_71, and level shifters LSTP3_5 and LSTP4_5.

The switch circuit 81_60 includes the transistors 82_60 and 83_60. The switch circuit 81_61 includes the transistors 82_61 and 83_61. The other switch circuits 81_62 to 81_71 have the same configuration, e.g., the switch circuit 81_71 includes the transistors 82_71 and 83_71.

One set of ends of the transistors 82_60 to 82_71 is coupled to the interconnects CGB<0> to CGB<11>, respectively, and the other set of ends is coupled to the interconnects CGI6_0 to CGI71, respectively. Gates of the transistors 82_60 to 82_71 are coupled in common to the level shifter LSTP3_5.

One set of ends of the transistors 83_60 to 83_71 is coupled in common to the interconnect CGU<5>, and the other set of ends is coupled to the interconnects CGI60 to CGI71, respectively. Gates of the transistors 83_60 to 83_71 are coupled in common to the level shifter LSTP4_5.

LSTP3_5 applies voltages to the gates of the transistors 82_60 to 82_71 based on a control signal CSHV3_5 received from the PB controller 12.

LSTP4_5 applies voltages to the gates of the transistors 83_60 to 83_71 based on a control signal CSHV4_5 received from the PB controller 12.

For example, if any one of the interconnects CGI60 to CGI71 corresponds to the selected word line WL, the transistors 82_60 to 82_71 are set to an on state, and the interconnects CGI60 to CGI71 and the interconnects CGB<0> to CGB<11> are electrically coupled, respectively. In addition, if the interconnects CGI60 to CGI71 do not correspond to the selected word line WL, the transistors 83_60 to 83_71 are set to an on state, and the interconnects CGI60 to CGI71 and the interconnect CGU<5> are electrically coupled.

As shown in FIG. 16, the zone Zn6 includes high-voltage n-channel MOS transistors 82_72 to 82_83 and 83_72 to 83_83, and level shifters LSTP3_6 and LSTP4_6.

The switch circuit 81_72 includes the transistors 82_72 and 83_72. The switch circuit 81_73 includes the transistors 82_73 and 83_73. The other switch circuits 81_74 to 81_83 have the same configuration, e.g., the switch circuit 81_83 includes the transistors 82_83 and 83_83.

One set of ends of the transistors 82_72 to 82_83 is coupled to the interconnects CGA<0> to CGA<11>, respectively, and the other set of ends is coupled to the interconnects CGI72 to CGI83, respectively. Gates of the transistors 82_72 to 82_83 are coupled in common to the level shifter LSTP3_6.

One set of ends of the transistors 83_72 to 83_83 is coupled in common to the interconnect CGU<6>, and the other set of ends is respectively coupled to the interconnects CGI72 to CGI83. Gates of the transistors 83_72 to 83_83 are coupled in common to the level shifter LSTP4_6.

LSTP3_6 applies voltages to the gates of the transistors 82_72 to 82_83 based on a control signal CSHV3_6 received from the PB controller 12.

LSTP4_6 applies voltages to the gates of the transistors 83_72 to 83_83 based on a control signal CSHV4_6 received from the PB controller 12.

For example, if anyone of the interconnects CGI72 to CGI83 corresponds to the selected word line WL, the transistors 82_72 to 82_83 are set to an on state, and the interconnects CGI72 to CGI83 and the interconnects CGA<0> to CGA<11> are electrically coupled, respectively. In addition, if the interconnects CGI72 to CGI83 do not correspond to the selected word line WL, the transistors 83_72 to 83_83 are set to an on state, and the interconnects CGI72 to CGI83 and the interconnect CGU<6> are electrically coupled.

Figure 17:
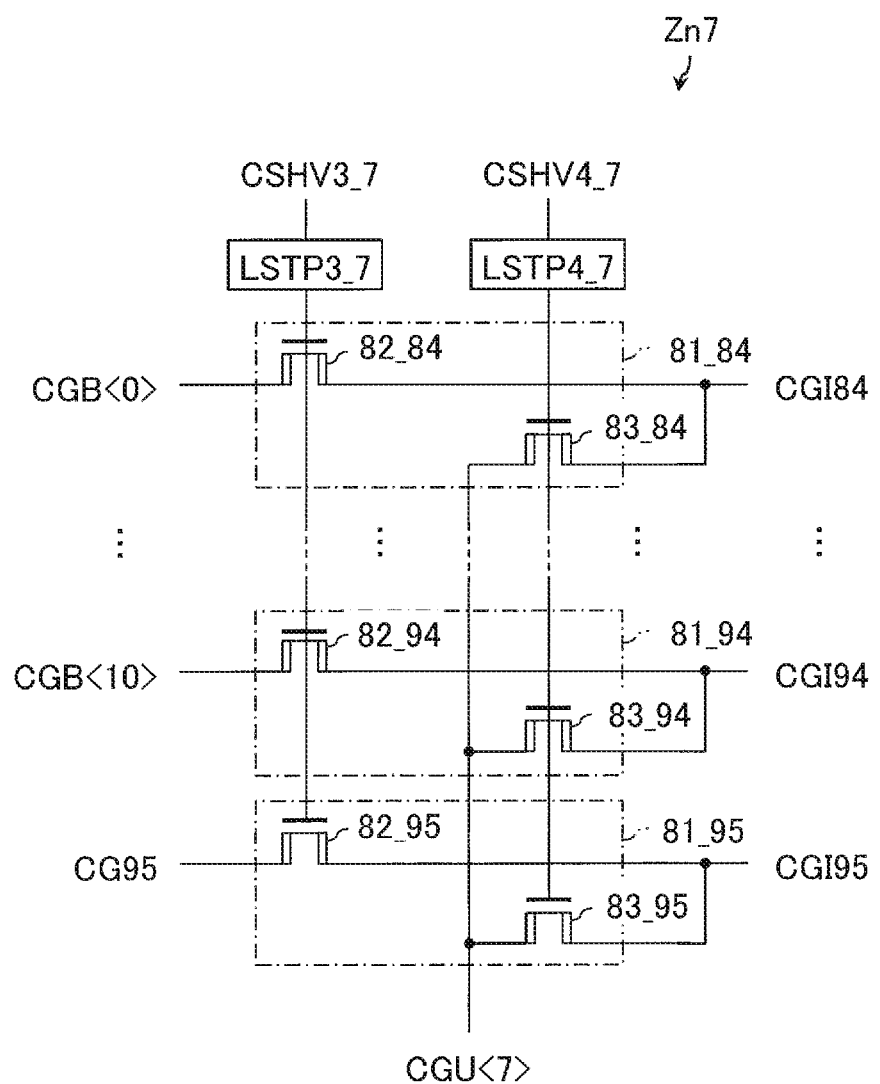
FIG. 17 is a circuit diagram of a switch circuit of a zone Zn7 in the WR/RD zone selector included in the semiconductor memory device according to the first embodiment.

As shown in FIG. 17, the zone Zn7 includes high-voltage n-channel MOS transistors 82_84 to 82_95 and 83_84 to 83_95, and level shifters LSTP3_7 and LSTP4_7.

The switch circuit 81_84 includes the transistors 82_84 and 83_84. The switch circuit 81_85 includes the transistors 82_85 and 83_85. The other switch circuits 81_86 to 81_95 have the same configuration, e.g., the switch circuit 81_95 includes the transistors 82_95 and 83_95.

One set of ends of the transistors 82_84 to 82_95 is coupled to the interconnects CGB<0> to CGB<10> and CG95, respectively, and the other set of ends is coupled to the interconnects CGI84 to CGI95, respectively. Gates of the transistors 82_84 to 82_95 are coupled in common to the level shifter LSTP3_7.

One set of ends of the transistors 83_84 to 83_95 is coupled in common to the interconnect CGU<7>, and the other set of ends is coupled to the interconnects CGI84 to CGI95, respectively. Gates of the transistors 83_84 to 83_95 are coupled in common to the level shifter LSTP4_7.

LSTP3_7 applies voltages to the gates of the transistors 82_84 to 82_95 based on a control signal CSHV3_7 received from the PB controller 12.

LSTP4_7 applies voltages to the gates of the transistors 83_84 to 83_95 based on a control signal CSHV4_7 received from the PB controller 12.

For example, if anyone of the interconnects CGI84 to CGI95 corresponds to the selected word line WL, the transistors 82_84 to 82_95 are set to an on state, and the interconnects CGI84 to CGI95 and the interconnects CGB<0> to CGB<10> and CG95 are electrically coupled, respectively. In addition, if the interconnects CGI84 to CGI95 do not correspond to the selected word line WL, the transistors 83_84 to 83_95 are set to an on state, and the interconnects CGI84 to CGI95 and the interconnect CGU<7> are electrically coupled.

In the WR/RD zone selector 80, the number of switch elements (i.e., the number of stages of transistors) provided between the interconnects CGI0 to CGI95 (i.e., the word lines WL0 to WL95) and the interconnects CGA, CGB, CG0, and CG95, and the number of switch elements provided between the interconnects CGI0 to CGI95 (i.e., the word lines WL0 to WL95) and the interconnect CGU, are the same. In other words, in the WR/RD zone selector 80, the number of switch elements (the number of stages of transistors) that electrically couple the word line WL and the selected CG driver (the CGA driver 30, the CGB driver 31, or the CG0/CG95 driver 32), and the number of switch elements (the number of stages of transistors) that electrically couple the word line WL and the unselected CG driver (the CGU driver 33), are the same.

1.1.6.2.4 Example of Configuration of ER Zone Selector

Next, an example of a configuration of the ER zone selector 90 will be described with reference to FIG. 18.

Figure 18:
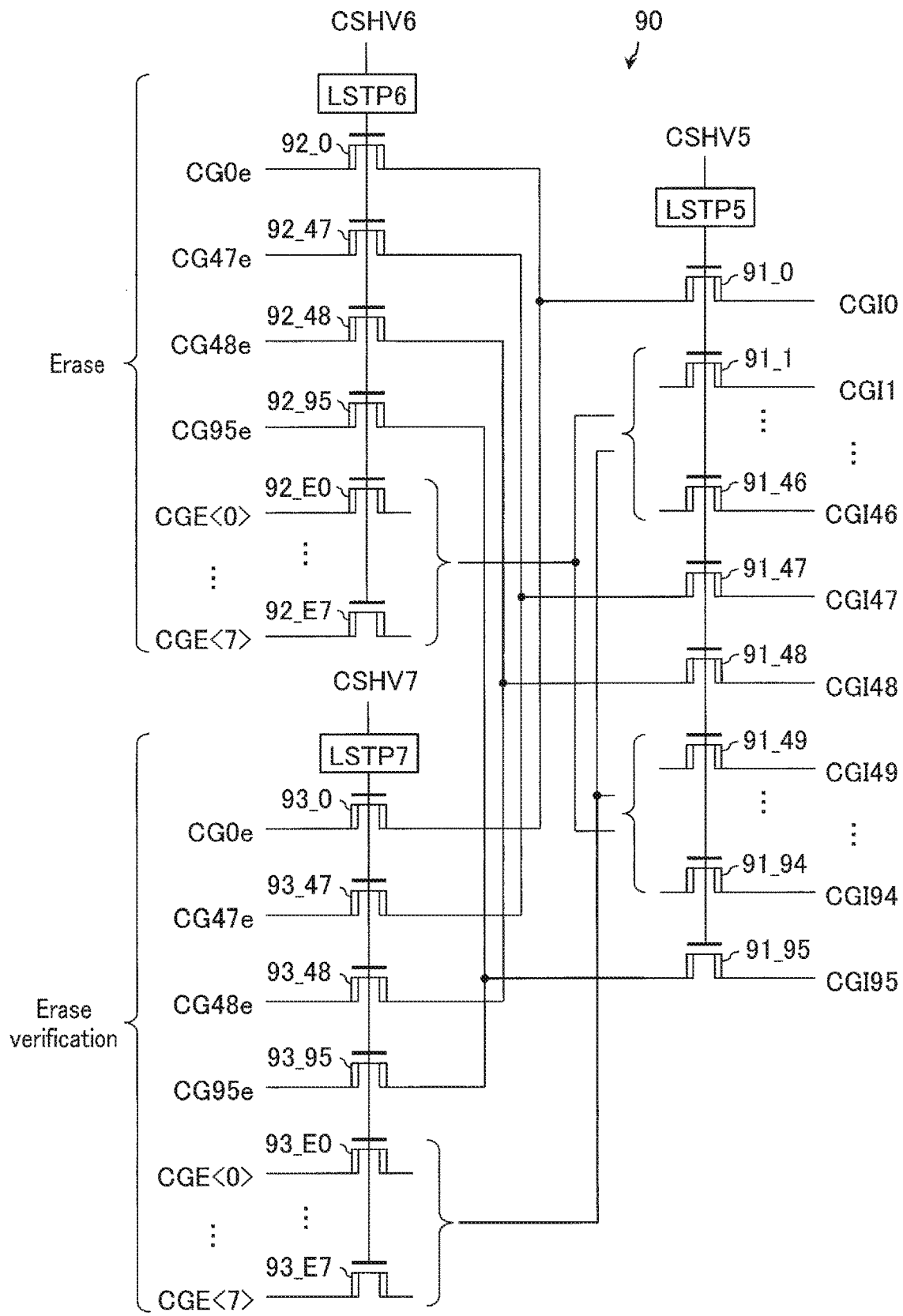
FIG. 18 is a circuit diagram of an ER zone selector in the WL selector included in the semiconductor memory device according to the first embodiment.

As shown in FIG. 18, the ER zone selector 90 includes: ninety six high-voltage n-channel MOS transistors 91_0 to 91_95, twelve high-voltage n-channel MOS transistors 92_0, 92_47, 92_48, 92_95, and 92_E0 to 92_E7, twelve high-voltage n-channel MOS transistors 93_0, 93_47, 93_48, 93_95, and 93_E0 to 93_E7, and three level shifters LSTP5 to LSTP7. A voltage applied to the word line WL in an erase operation is lower than a voltage applied to the word line WL in write and read operations. Thus, a withstand voltage of each transistor in the ER zone selector 90 may be lower than that of each transistor in the WR/RD zone selector 80. Namely, the transistor size (e.g., a gate length, a gate width, and a film thickness of a gate oxide film, etc.) of each transistor in the ER zone selector 90 may be smaller than that of each transistor in the WR/RD zone selector 80. Similarly, the transistor size of the high-voltage transistors used for the level shifters LSTP5 to LSTP7 may be smaller than that of the high-voltage transistors used for LSTP3_0 to 3_7 and 4_0 to 4_7.

One end of the transistor 91_0 is coupled to the interconnect CGI0, and the other end is coupled to one end of the transistor 92_0 and one end of 93_0. A gate of the transistor 91_0 is coupled to the level shifter LSTP5.

One set of ends of the transistors 91_1 to 91_46 is coupled to the interconnects CGI1 to CGI46, respectively, and the other set of ends is coupled to one end of any one of the transistors 92_E0 to 92_E7 and one end of any one of the transistors 93_E0 to 93_E7, respectively. Gates of the transistors 91_1 to 91_46 are coupled in common to the level shifter LSTP5.

In the transistors 91_1 to 91_46, a combination of one end of any one of the transistors 92_E0 to 92_E7 and one end of any one of the transistors 93_E0 to 93_E7, coupled to the other end of one transistor 91, is discretionary.

One end of the transistor 91_48 is coupled to the interconnect CGI48, and the other end is coupled to one end of the transistor 92_48 and one end of 93_48. A gate of the transistor 91_48 is coupled to the level shifter LSTP5.

One set of ends of the transistors 91_49 to 91_94 is coupled to the interconnects CGI49 to CGI94, respectively, and each end within the other set of ends is respectively coupled to one end of any one of the transistors 92_E0 to 92_E7 and one end of any one of the transistors 93_E0 to 93_E7. Gates of the transistors 91_49 to 91_94 are coupled in common to the level shifter LSTP5.

In the transistors 91_49 to 91_94, a combination of one end of any one of the transistors 92_E0 to 92_E7 and one end of any one of the transistors 93_E0 to 93_E7, coupled to the other end of one transistor 91, is discretionary.

One end of the transistor 91_95 is coupled to the interconnect CGI95, and the other end is coupled to one end of the transistor 92_95 and one end of 93_95. A gate of the transistor 91_95 is coupled to the level shifter LSTP5.

The transistors 92_0, 92_47, 92_48, 92_95, and 92_E0 to 92_E7 function as switch elements that electrically couple the interconnects CG0e, CG47e, CG48e, CG95e, and CGE<7:0> and the transistors 91_0 to 91_95 in the erase pulse application operation. The other ends of the transistors 92_0, 92_47, 92_48, 92_95, and 92_E0 to 92_E7 are coupled to the interconnects CG0e, CG47e, CG48e, CG95e, and CGE<0> to CGE<7>, respectively, and gates thereof are coupled in common to the level shifter LSTP6.

The transistors 93_0, 93_47, 93_48, 93_95, and 93_E0 to 93_E7 function as switch elements that electrically couple the interconnects CG0e, CG47e, CG48e, CG95e, and CGE<7:0> and the transistors 91_0 to 91_95 in the erase verification operation. The other ends of the transistors 93_0, 93_47, 93_48, 93_95, and 93_E0 to 93_E7 are coupled to the interconnects CG0e, CG47e, CG48e, CG95e, and CGE<0> to CGE<7>, respectively, and gates thereof, are coupled in common to the level shifter LSTP7.

LSTP5 applies voltages to the gates of the transistors 91_0 to 91_95 based on a control signal CSHV5 received from the PB controller 12.

LSTP6 applies voltages to the gates of the transistors 92_0, 92_47, 92_48, 92_95, and 92_E0 to 92_E7 based on a control signal CSHV6 received from the PB controller 12.

LSTP7 applies voltages to the gates of the transistors 93_0, 93_47, 93_48, 93_95, and 93_E0 to 93_E7 based on a control signal CSHV7 received from the PB controller 12.

For example, in the case of the erase pulse application operation, the transistors 91_0 to 91_95, 92_0, 92_47, 92_48, 92_95, and 92_E0 to 92_E7 are set to an on state. In the case of the erase verification operation, the transistors 91_0 to 91_95, 93_0, 93_47, 93_48, 93_95, and 93_E0 to 93_E7 are set to an on state.

1.1.6.3 Configuration of SG_WLD Selector

Next, the configuration of the SG_WLD selector will be described. Hereinafter, the configuration of the SG_WLD selector 24A will mainly be described, but the configuration of the SG_WLD selector 24B is also the same as that of the SG_WLD selector 24A.

1.1.6.3.1 Overall Configuration of SG_WLD Selector

First, the overall configuration of the SG_WLD selector 24A will be described with reference to FIG. 19.

As shown in FIG. 19, the SG_WLD selector 24A includes: a SGD unit 100 corresponding to the select gate lines SGD, and a SGS_WLD unit 101 corresponding to the select gate lines SGS, and SGSB and the dummy word lines WLD.

The SGD unit 100 includes a WR/RD selector 110, an ER selector 120, and a USG selector 130.

The WR/RD selector 110 applies voltages to the interconnects GSGD0 to GSGD3, based on the control signal CSHV received from the PB controller 12, in the write and read operations. The interconnect SGD_SEL is coupled to a first input terminal of the WR/RD selector 110, and the interconnect SGD_USEL is coupled to a second input terminal 1 of the WR/RD selector 110. The interconnects GSGD0 to GSGD3 are respectively coupled to four output terminals of the WR/RD selector 110.

The ER selector 120 applies voltages to the interconnects GSGD0 to GSGD3, based on the control signal CSHV received from the PB controller 12, in the erase operation. The interconnect SGD_SELe is coupled to a first input terminal of the ER selector 120, and the interconnect SGD_USELe is coupled to a second input terminal of the ER selector 120. The interconnects GSGD0 to GSGD3 are respectively coupled to four output terminals of the ER selector 120.

The USG selector 130 applies voltages to the interconnects GSGD0 to GSGD3 based on the control signal CSHV received from the PB controller 12. The interconnect USG is coupled to an input terminal of the USG selector 130. The interconnects GSGD0 to GSGD3 are respectively coupled to four output terminals of the USG selector 130.

The SGS_WLD unit 101 includes a WR/RD selector 140, an ER selector 150, and a USG selector 160.

The WR/RD selector 140 applies voltages to the interconnects GSGS, GSGSB, and GWLD0 to GWLD5, based on the control signal CSHV received from the PB controller 12, in the write and read operations. The interconnect SGS_SEL is coupled to a first input terminal of the WR/RD selector 140, the interconnect SGSB_SEL is coupled to a second input terminal of the WR/RD selector 140, and interconnects SG_D<5:0> are respectively coupled to the third to eighth input terminals of the WR/RD selector 140. The interconnects GSGS, GSGSB, and GWLD0 to GWLD5 are respectively coupled to eight output terminals of the WR/RD selector 140.

The ER selector 150 applies voltages to the interconnects GSGS, GSGSB, and GWLD0 to GWLD5, based on the control signal CSHV received from the PB controller 12, in the erase operation. The interconnect SGS_SELe is coupled to a first input terminal of the ER selector 150, the interconnect SGSB_SELe is coupled to a second input terminal of the ER selector 150, and interconnects SG_De<5:0> are respectively coupled to the third to eighth input terminals of the ER selector 150. The interconnects GSGS, GSGSB, and GWLD0 to GWLD5 are respectively coupled to eight output terminals of the ER selector 150.

The USG selector 160 applies voltages to the interconnects GSGS, GSGSB, and GWLD0 to GWLD5 based on the control signal CSHV received from the PB controller 12. The interconnect USG is coupled to an input terminal of the USG selector 160. The interconnects GSGS, GSGSB, and GWLD0 to GWLD5 are respectively coupled to eight output terminals of the USG selector 160.

1.1.6.3.2 Example of Configuration of SGD Unit

Figure 20:
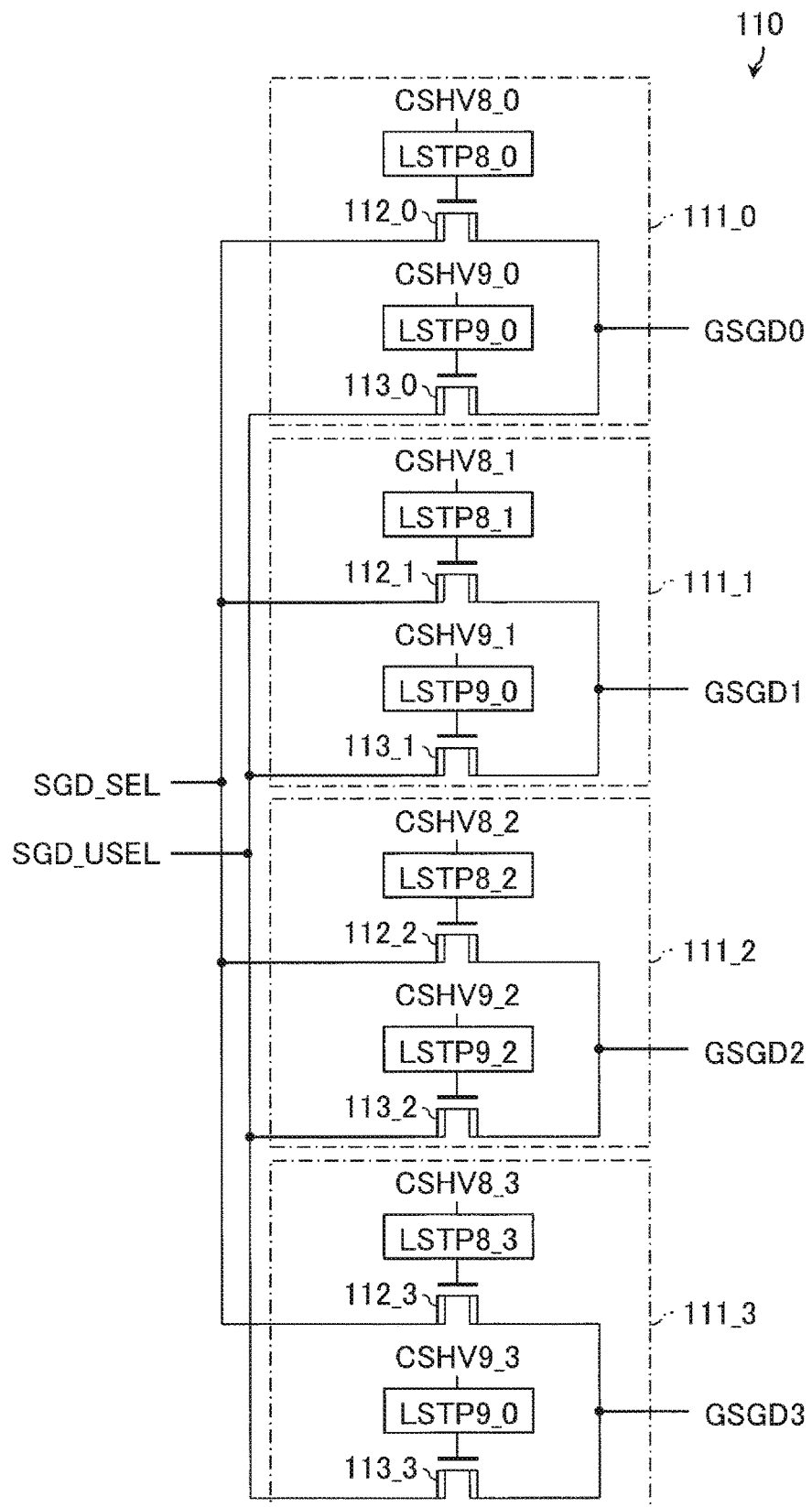
FIG. 20 is a circuit diagram of a WR/RD selector in a SGD unit included in the semiconductor memory device according to the first embodiment.
Figure 22:
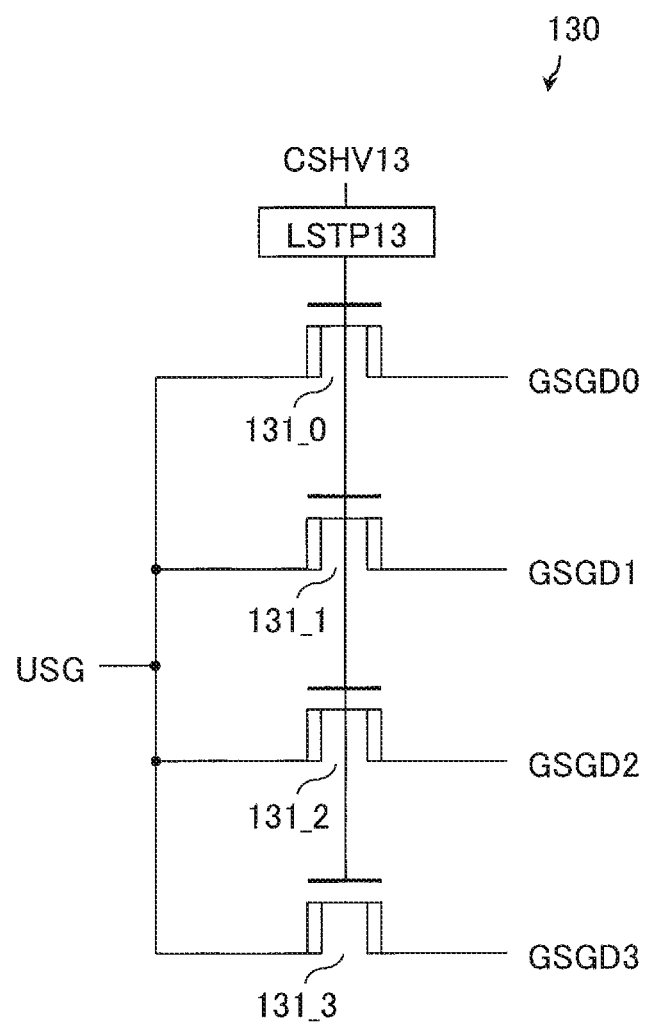
FIG. 22 is a circuit diagram of a USG selector in the SGD unit included in the semiconductor memory device according to the first embodiment.

Next, an example of a configuration of the SGD unit 100 will be described with reference to FIGS. 20 to 22. FIG. 20 shows a circuit diagram of the WR/RD selector 110. FIG. 21 shows a circuit diagram of the ER selector 120. FIG. 22 shows a circuit diagram of the USG selector 130.

As shown in FIG. 20, the WR/RD selector 110 includes four SGD groups 111_0 to 111_3 respectively corresponding to the select gate lines SGD0 to SGD3 (interconnects GSGD0 to GSGD3).

The SGD group 111_0 includes high-voltage n-channel MOS transistors 112_0 and 113_0 and level shifters LSTP8_0 and LSTP9_0.

One end of the transistor 112_0 is coupled to the interconnect GSGD0, and the other end is coupled to the interconnect SGD_SEL. A gate of the transistor 112_0 is coupled to the level shifter LSTP8_0.

One end of the transistor 113_0 is coupled to the interconnect GSGD0, and the other end is coupled to the interconnect SGD_USEL. A gate of the transistor 113_0 is coupled to the level shifter LSTP9_0.

LSTP8_0 applies a voltage to the gate of the transistors 112_0 based on a control signal CSHV8_0 received from the PB controller 12.

LSTP9_0 applies a voltage to the gate of the transistor 113_0 based on a control signal CSHV9_0 received from the PB controller 12.

The SGD group 111_1 includes high-voltage n-channel MOS transistors 112_1 and 113_1 and level shifters LSTP8_1 and LSTP9_1.

One end of the transistor 112_1 is coupled to the interconnect GSGD1, and the other end is coupled to the interconnect SGD_SEL. A gate of the transistor 112_1 is coupled to the level shifter LSTP8_1.

One end of the transistor 113_1 is coupled to the interconnect GSGD1, and the other end is coupled to the interconnect SGD_USEL. A gate of the transistor 113_1 is coupled to the level shifter LSTP9_1.

LSTP8_1 applies a voltage to the gate of the transistor 112_1 based on a control signal CSHV8_1 received from the PB controller 12.

LSTP9_1 applies a voltage to the gate of the transistor 113_1 based on a control signal CSHV9_1 received from the PB controller 12.

The SGD group 111_2 includes high-voltage n-channel MOS transistors 112_2 and 113_2 and level shifters LSTP8_2 and LSTP9_2.

One end of the transistor 112_2 is coupled to the interconnect GSGD2, and the other end is coupled to the interconnect SGD_SEL. A gate of the transistor 112_2 is coupled to the level shifter LSTP8_2.

One end of the transistor 113_2 is coupled to the interconnect GSGD2, and the other end is coupled to the interconnect SGD_USEL. A gate of the transistor 113_2 is coupled to the level shifter LSTP9_2.

LSTP8_2 applies a voltage to the gate of the transistor 112_2 based on a control signal CSHV8_2 received from the PB controller 12.

LSTP9_2 applies a voltage to the gate of the transistor 113_2 based on a control signal CSHV9_2 received from the PB controller 12.

The SGD group 111_3 includes high-voltage n-channel MOS transistors 112_3 and 113_3 and level shifters LSTP8_3 and LSTP9_3.

One end of the transistor 112_3 is coupled to the interconnect GSGD3, and the other end is coupled to the interconnect SGD_SEL. A gate of the transistor 112_3 is coupled to the level shifter LSTP8_3.

One end of the transistor 113_3 is coupled to the interconnect GSGD3, and the other end is coupled to the interconnect SGD_USEL. A gate of the transistor 113_3 is coupled to the level shifter LSTP9_3.

LSTP8_3 applies a voltage to the gate of the transistor 112_3 based on a control signal CSHV8_3 received from the PB controller 12.

LSTP9_3 applies a voltage to the gate of the transistor 113_3 based on a control signal CSHV9_3 received from the PB controller 12.

For example, when the select gate line SGD0 is selected in the write and read operations, in the SGD group 111_0 corresponding to the select gate line SGD0, the transistor 112_0 is set to an on state, and the transistor 113_0 is set to an off state. In the SGD groups 111_1 to 111_3, the transistors 112_1 to 112_3 are set to an off state, and 113_1 to 113_3 are set to an on state. Namely, the interconnect GSGD0 is electrically coupled to the interconnect SGD_SEL, and the interconnects GSGD1 to GSGD3 are electrically coupled to the interconnect SGD_USEL.

Next, the ER selector 120 will be described.

As shown in FIG. 21, the ER selector 120 includes four SGDe groups 121_0 to 121_3 respectively corresponding to the select gate lines SGD0 to SGD3 (the interconnects GSGD0 to GSGD3), and a level shifter LSTP10.

The SGDe group 121_0 includes high-voltage n-channel MOS transistors 122_0, 123_0, and 124_0 and level shifters LSTP11_0 and LSTP12_0.

One end of the transistor 122_0 is coupled to the interconnect GSGD0, and the other end is coupled to one end of the transistor 123_0 and one end of the transistor 124_0. A gate of the transistor 122_0 is coupled to the level shifter LSTP10.

The other end of the transistor 123_0 is coupled to the interconnect SGD_SELe. A gate of the transistor 123_0 is coupled to the level shifter LSTP11_0.

The other end of the transistor 124_0 is coupled to the interconnect SGD_USELe. A gate of the transistor 124_0 is coupled to the level shifter LSTP12_0.

LSTP11_0 applies a voltage to the gate of the transistor 123_0 based on a control signal CSHV11_0 received from the PB controller 12.

LSTP12_0 applies a voltage to the gate of the transistor 124_0 based on a control signal CSHV12_0 received from the PB controller 12.

The SGDe group 121_1 includes high-voltage n-channel MOS transistors 122_1, 123_1, and 124_1, and level shifters LSTP11_1 and LSTP12_1.

One end of the transistor 122_1 is coupled to the interconnect GSGD1, and the other end is coupled to one end of transistor 123_1 and one end of transistor 124_1. A gate of the transistor 122_1 is coupled to the level shifter LSTP10.

The other end of the transistor 123_1 is coupled to the interconnect SGD_SELe. A gate of the transistor 123_1 is coupled to the level shifter LSTP11_1.

The other end of the transistor 124_1 is coupled to the interconnect SGD_USELe. A gate of the transistor 124_1 is coupled to the level shifter LSTP12_1.

LSTP11_1 applies a voltage to the gate of the transistor 123_1 based on a control signal CSHV11_1 received from the PB controller 12.

LSTP12_1 applies a voltage to the gate of the transistor 124_1 based on a control signal CSHV12_1 received from the PB controller 12.

The SGDe group 121_2 includes high-voltage n-channel MOS transistors 122_2, 123_2, and 124_2, and level shifters LSTP11_2 and LSTP12_2.

One end of the transistor 122_2 is coupled to the interconnect GSGD2, and the other end is coupled to one end of the transistor 123_2 and one end of the transistor 124_2. A gate of the transistor 122_2 is coupled to the level shifter LSTP10.

The other end of the transistor 123_2 is coupled to the interconnect SGD_SELe. A gate of the transistor 123_2 is coupled to the level shifter LSTP11_2.

The other end of the transistor 124_2 is coupled to the interconnect SGD_USELe. A gate of the transistor 124_2 is coupled to the level shifter LSTP12_2.

LSTP11_2 applies a voltage to the gate of the transistor 123_2 based on a control signal CSHV11_2 received from the PB controller 12.

LSTP12_2 applies a voltage to the gate of the transistor 124_2 based on a control signal CSHV12_2 received from the PB controller 12.

The SGDe group 121_3 includes high-voltage n-channel MOS transistors 122_3, 123_3, and 124_3, and level shifters LSTP11_3 and LSTP12_3.

One end of the transistor 122_3 is coupled to the interconnect GSGD3, and the other end is coupled to one end of the transistor 123_3 and one end of the transistor 124_3. A gate of the transistor 122_3 is coupled to the level shifter LSTP10.

The other end of the transistor 123_3 is coupled to the interconnect SGD_SELe. A gate of the transistor 123_3 is coupled to the level shifter LSTP11_3.

The other end of the transistor 124_3 is coupled to the interconnect SGD_USELe. A gate of the transistor 124_3 is coupled to the level shifter LSTP12_3.

LSTP11_3 applies a voltage to the gate of the transistor 123_3 based on a control signal CSHV11_3 received from the PB controller 12.

LSTP12_3 applies a voltage to the gate of the transistor 124_3 based on a control signal CSHV12_3 received from the PB controller 12.

LSTP10 applies voltages to the gates of the transistors 122_0 to 122_3 based on a control signal CSHV10 received from the PB controller 12.

For example, in the case of the erase operation, the transistors 122_0 to 122_3 are set to an on state. In the erase pulse application operation, the transistors 123_0 to 123_3 are set to an on state. In the erase verification operation, any one of the transistors 123_0 to 123_3 corresponding to the selected string unit SU is set to an on state, and any one of the transistors 124_0 to 124_3 corresponding to the unselected string units SU is set to an on state. Thus, the interconnects GSGD0 to GSGD3 are electrically coupled to the interconnect SGD_SELe or SGD_USELe.

Next, the USG selector 130 will be described.

As shown in FIG. 22, the USG selector 130 includes high-voltage n-channel MOS transistors 131_0 to 131_3, and a level shifter LSTP13.

One end of the transistor 131_0 is coupled to the interconnect GSGD0, and the other end is coupled to the interconnect USG. A gate of the transistor 131_0 is coupled to the level shifter LSTP13.

One end of the transistor 131_1 is coupled to the interconnect GSGD1, and the other end is coupled to the interconnect USG. A gate of the transistor 131_1 is coupled to the level shifter LSTP13.

One end of the transistor 131_2 is coupled to the interconnect GSGD2, and the other end is coupled to the interconnect USG. A gate of the transistor 131_2 is coupled to the level shifter LSTP13.

One end of the transistor 131_3 is coupled to the interconnect GSGD3, and the other end is coupled to the interconnect USG. A gate of the transistor 131_3 is coupled to the level shifter LSTP13.

LSTP13 applies voltages to the gates of the transistors 131_0 to 131_3 based on a control signal CSHV13 received from the PB controller 12.

For example, when the interconnects GSGD0 to GSGD3 are respectively coupled to the interconnect USG electrically, the transistors 131_0 to 131_3 are set to an on state.

1.1.6.3.2 Example of Configuration of SGS_WLD Unit

Figure 23:
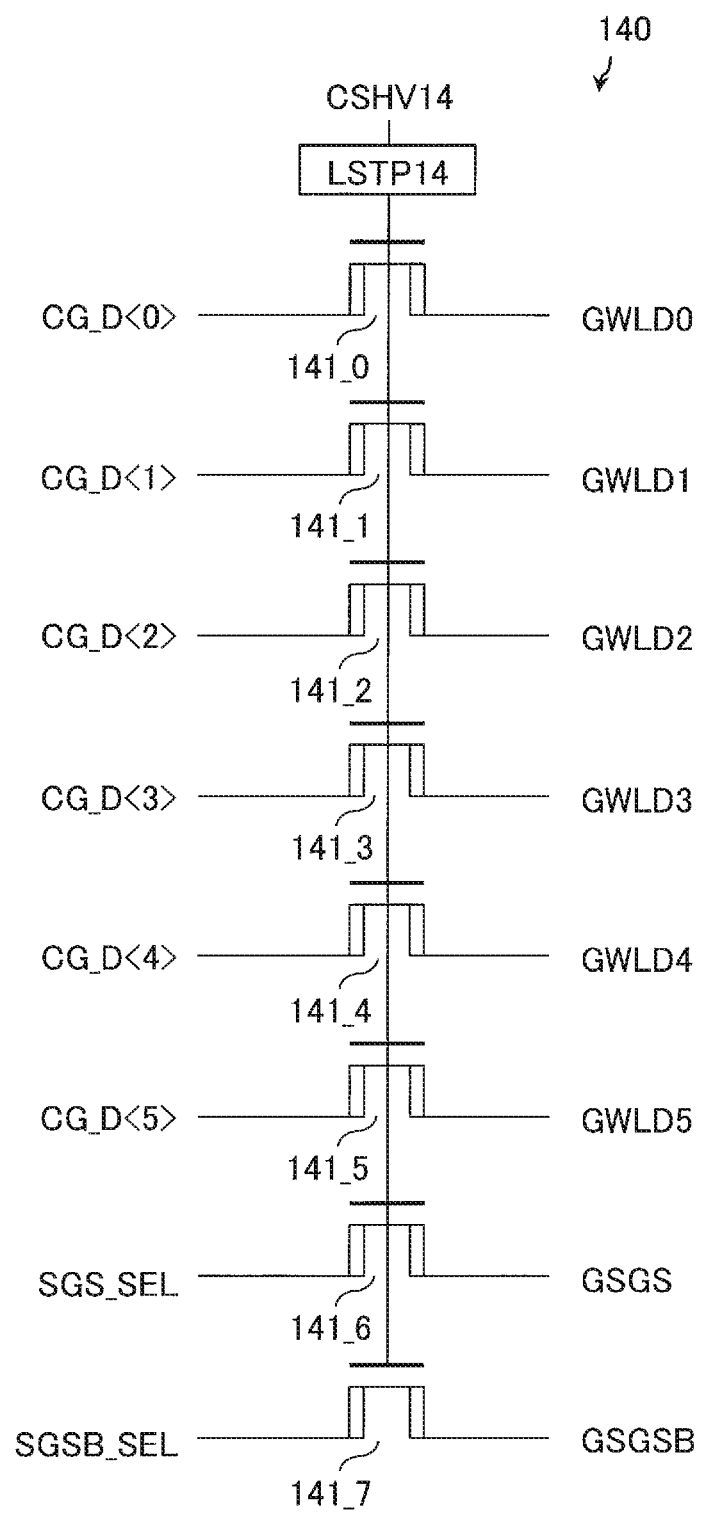
FIG. 23 is a circuit diagram of a WR/RD selector in a SGS_WLD unit included in the semiconductor memory device according to the first embodiment.
Figure 24:
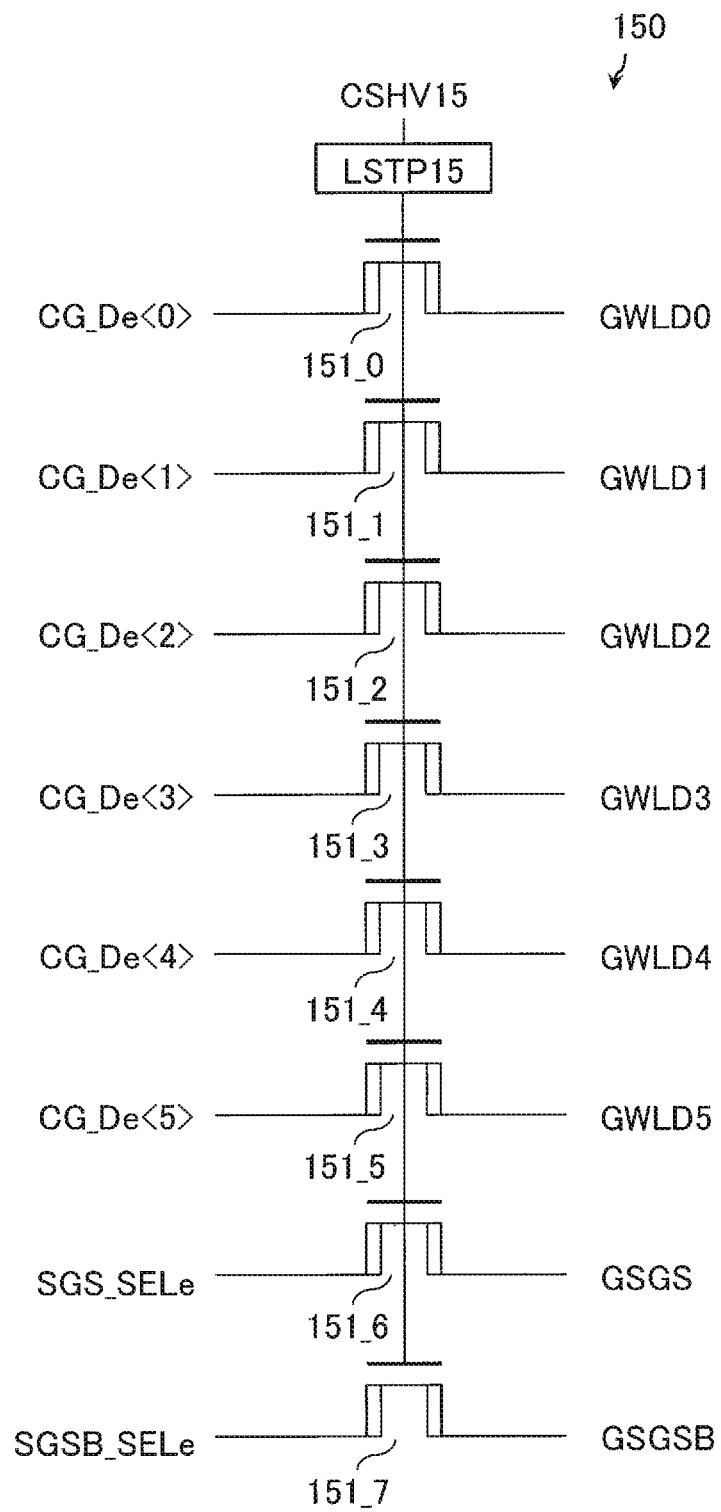
FIG. 24 is a circuit diagram of an ER selector in the SGS_WLD unit included in the semiconductor memory device according to the first embodiment.

Next, an example of a configuration of the SGS_WLD unit 101 will be described with reference to FIGS. 23 to 25. FIG. 23 shows a circuit diagram of the WR/RD selector 140. FIG. 24 shows a circuit diagram of the ER selector 150. FIG. 25 shows a circuit diagram of the USG selector 160.

As shown in FIG. 23, the WR/RD selector 140 includes high-voltage n-channel MOS transistors 141_0 to 141_7, and a level shifter LSTP14.

One end of the transistor 141_0 is coupled to the interconnect GWLD0, and the other end is coupled to an interconnect CG_D<0>. A gate of the transistor 141_0 is coupled to the level shifter LSTP14.

One end of the transistor 141_1 is coupled to the interconnect GWLD1, and the other end is coupled to an interconnect CG_D<1>. A gate of the transistor 141_1 is coupled to the level shifter LSTP14.

One end of the transistor 141_2 is coupled to the interconnect GWLD2, and the other end is coupled to an interconnect CG_D<2>. A gate of the transistor 141_2 is coupled to the level shifter LSTP14.

One end of the transistor 141_3 is coupled to the interconnect GWLD3, and the other end is coupled to an interconnect CG_D<3>. A gate of the transistor 141_3 is coupled to the level shifter LSTP14.

One end of the transistor 141_4 is coupled to the interconnect GWLD4, and the other end is coupled to an interconnect CG_D<4>. A gate of the transistor 141_4 is coupled to the level shifter LSTP14.

One end of the transistor 141_5 is coupled to the interconnect GWLD5, and the other end is coupled to an interconnect CG_D<5>. A gate of the transistor 141_5 is coupled to the level shifter LSTP14.

One end of the transistor 141_6 is coupled to the interconnect GSGS, and the other end is coupled to the interconnect SGS_SEL. A gate of the transistor 141_6 is coupled to the level shifter LSTP14.

One end of the transistor 141_7 is coupled to the interconnect GSGSB, and the other end is coupled to the interconnect SGSB_SEL. A gate of the transistor 141_7 is coupled to the level shifter LSTP14.

LSTP14 applies voltages to the gates of the transistors 141_0 to 141_7 based on a control signal CSHV14 received from the PB controller 12.

For example, when the interconnects GWLD0 to GWLD5, GSGS, and GSGSB are electrically coupled to the interconnects CG_D<5:0>, SGS_SEL, and SGSB_SEL, respectively, the transistors 141_0 to 141_7 are set to an on state.

Next, the ER selector 150 will be described.

As shown in FIG. 24, the ER selector 150 includes high-voltage n-channel MOS transistors 151_0 to 151_7, and a level shifter LSTP15.

One end of the transistor 151_0 is coupled to the interconnect GWLD0, and the other end is coupled to an interconnect CG_De<0>. A gate of the transistor 151_0 is coupled to the level shifter LSTP15.

One end of the transistor 151_1 is coupled to the interconnect GWLD1, and the other end is coupled to an interconnect CG_De<1>. A gate of the transistor 151_1 is coupled to the level shifter LSTP15.

One end of the transistor 151_2 is coupled to the interconnect GWLD2, and the other end is coupled to an interconnect CG_De<2>. A gate of the transistor 151_2 is coupled to the level shifter LSTP15.

One end of the transistor 151_3 is coupled to the interconnect GWLD3, and the other end is coupled to an interconnect CG_De<3>. A gate of the transistor 151_3 is coupled to the level shifter LSTP15.

One end of the transistor 151_4 is coupled to the interconnect GWLD4, and the other end is coupled to an interconnect CG_De<4>. A gate of the transistor 151_4 is coupled to the level shifter LSTP15.

One end of the transistor 151_5 is coupled to the interconnect GWLD5, and the other end is coupled to an interconnect CG_De<5>. A gate of the transistor 151_5 is coupled to the level shifter LSTP15.

One end of the transistor 151_6 is coupled to the interconnect GSGS, and the other end is coupled to the interconnect SGS_SELe. A gate of the transistor 151_6 is coupled to the level shifter LSTP15.

One end of the transistor 151_7 is coupled to the interconnect GSGSB, and the other end is coupled to the interconnect SGSB_SELe. A gate of the transistor 151_7 is coupled to the level shifter LSTP15.

LSTP15 applies voltages to the gates of the transistors 151_0 to 151_7 based on a control signal CSHV15 received from the PB controller 12.

For example, when the interconnects GWLD0 to GWLD5, GSGS, and GSGSB are electrically coupled to the interconnects CG_De<5:0>, SGS_SELe, and SGSB_SELe, respectively, the transistors 151_0 to 151_7 are set to an on state.

Next, the USG selector 160 will be described.

As shown in FIG. 25, the USG selector 160 includes high-voltage n-channel MOS transistors 161_0 to 161_7, and a level shifter LSTP16.

One end of the transistor 161_0 is coupled to the interconnect GWLD0, and the other end is coupled to the interconnect USG. A gate of the transistor 161_0 is coupled to the level shifter LSTP16.

One end of the transistor 161_1 is coupled to the interconnect GWLD1, and the other end is coupled to the interconnect USG. A gate of the transistor 161_1 is coupled to the level shifter LSTP16.

One end of the transistor 161_2 is coupled to the interconnect GWLD2, and the other end is coupled to the interconnect USG. A gate of the transistor 161_2 is coupled to the level shifter LSTP16.

One end of the transistor 161_3 is coupled to the interconnect GWLD3, and the other end is coupled to the interconnect USG. A gate of the transistor 161_3 is coupled to the level shifter LSTP16.

One end of the transistor 161_4 is coupled to the interconnect GWLD4, and the other end is coupled to the interconnect USG. A gate of the transistor 161_4 is coupled to the level shifter LSTP16.

One end of the transistor 161_5 is coupled to the interconnect GWLD5, and the other end is coupled to the interconnect USG. A gate of the transistor 161_5 is coupled to the level shifter LSTP16.

One end of the transistor 161_6 is coupled to the interconnect GSGS, and the other end is coupled to the interconnect USG. A gate of the transistor 161_6 is coupled to the level shifter LSTP16.

One end of the transistor 161_7 is coupled to the interconnect GSGSB, and the other end is coupled to the interconnect USG. A gate of the transistor 161_7 is coupled to the level shifter LSTP16.

LSTP16 applies voltages to the gates of the transistors 161_0 to 161_7 based on a control signal CSHV16 received from the PB controller 12.

For example, when the interconnects GWLD0 to GWLD5, GSGS, and GSGSB are electrically coupled to the interconnect USG, the transistors 161_0 to 161_7 are set to an on state.

1.2 Write Operation

Next, a write operation will be described. The write operation generally includes a program operation and a program verification operation. Then, by repeating a combination (hereinafter, referred to as "a program loop") of the program operation and the program verification operation, a threshold voltage of the memory cell transistor MT is increased to a target level.

The program operation is an operation of increasing a threshold voltage by injecting electrons into the charge storage layer 310 (or maintaining a threshold voltage by prohibiting the injection).

The program verification operation is an operation of reading data after the program operation and determining whether a threshold voltage of the memory cell transistor MT reaches a target level.

In the following embodiment, in the program operation, an operation of increasing a threshold voltage is referred to as a "'0' write" or simply "write". On the other hand, an operation for maintaining a threshold voltage is referred to as a "'1' write" or "non-write". In the following descriptions, a bit line corresponding to the "0" write will be expressed as BL("0"), and a bit line corresponding to the "1" write will be expressed as BL("1").

1.2.1 Voltages of Interconnects in Program Operation

First, voltages of the interconnects in the program operation will be described with reference to FIG. 26. In the following, a case of executing a write operation in the string unit SU0 of the block BLK0 will be described.

Figure 26:
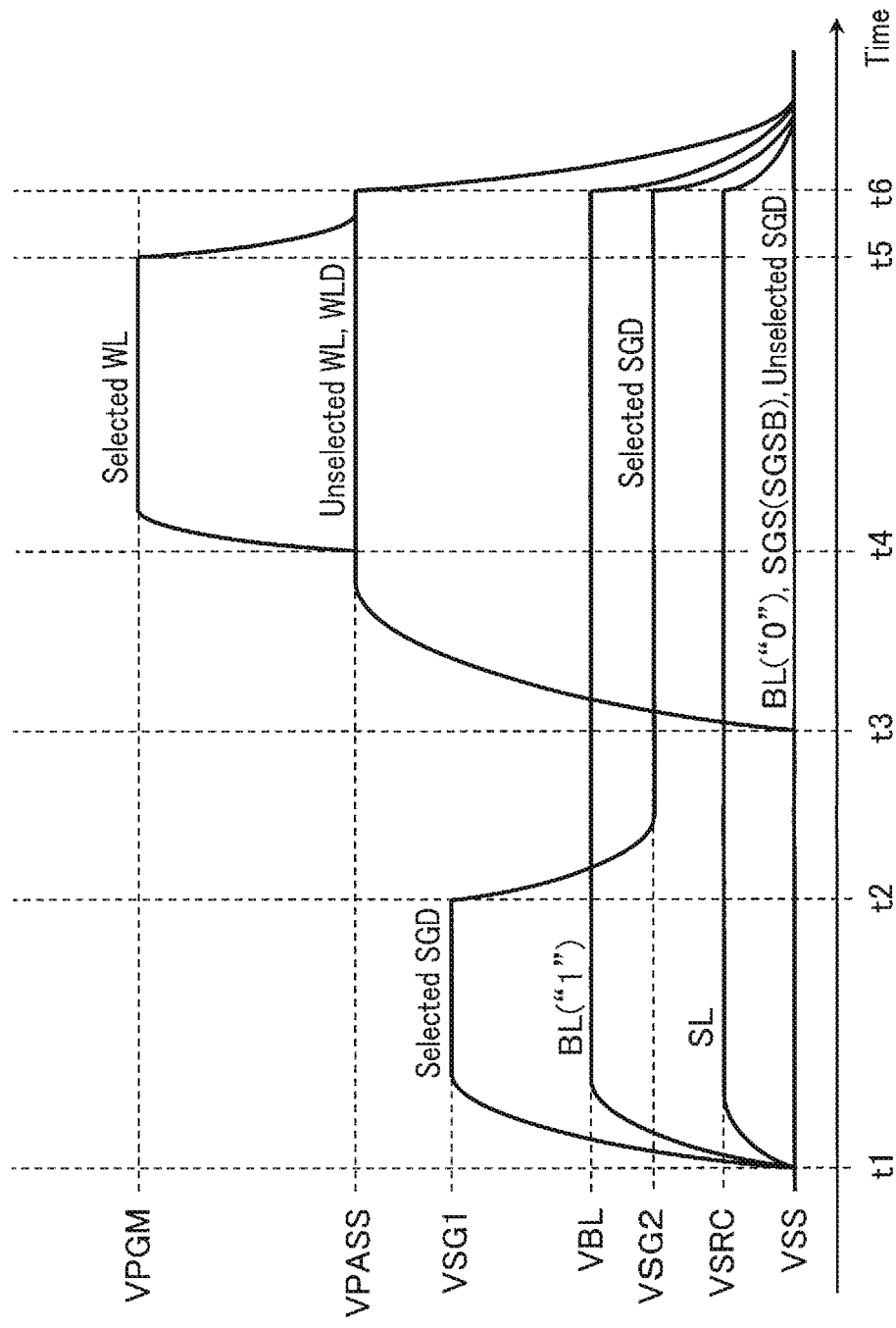
FIG. 26 is a timing chart showing voltages of interconnects in program operation in the semiconductor memory device according to the first embodiment.

As shown in FIG. 26, at time t1, a voltage VSRC is applied to a source line SL. The voltage VSRC is higher than a voltage VSS.

The row decoder 22A, corresponding to the selected block BLK0, applies a voltage VSG1 to the select gate line SGD0, corresponding to the selected string unit SU0 (reference sign "selected SGD" in FIG. 26), and applies a voltage VSS to the select gate lines SGD1 to SGD3 (reference sign "unselected SGD" in FIG. 26) corresponding to the unselected string units SU1 to SU3. The voltage VSG1 is a voltage for setting the select transistor ST1 to an on state, regardless of a voltage of a corresponding bit line BL. Thus, the select transistor ST1 of the selected string unit SU0 is set to an on state, and the select transistors ST1 of the unselected string units SU1 to SU3 are set to an off state.

The row decoder 22A applies the voltage VSS to the select gate line SGS (and SGSB). Thereby, the select transistors ST2 (ST2a and ST2b) of the block BLK0 are set to an off state.

The sense amplifier 25 applies a voltage VBL to the bit line BL ("1"), and applies the voltage VSS to the bit line BL ("0"). The voltage VBL is higher than a voltage VSRC.

Thus, in the selected string unit SU0, the voltage VBL is applied to a channel of a NAND string NS corresponding to the bit line BL ("1"), and the voltage VSS is applied to a channel of a NAND string NS corresponding to the bit line BL ("0").

At time t2, the row decoder 22A applies a voltage VSG2 to the select gate line SGD0 of the selected string unit SU0. The voltage VSG2 is a voltage for setting the select transistor ST1 corresponding to the bit line BL ("1") to a cutoff state, and setting the select transistor ST1 corresponding to the bit line BL ("0") to an "on" state. Thus, for example, the relationship between the voltages VSG1 and VSG2 and the voltage VBL is (VSG1−Vth)>VBL>(VSG2−Vth) (where the voltage Vth is a threshold voltage of the select transistor ST1). Thus, a channel of the NAND string NS of the selected string unit SU0 to which the bit line BL ("1") is coupled is set to a floating state.

At time t3, the row decoder 22A applies a voltage VPASS to the word line WL and the dummy word line WLD. The voltage VPASS is a voltage for setting the memory cell transistor MT and the dummy memory cell transistor MTD to an on state, regardless of their threshold voltages.

At time t4, the row decoder 22A applies a write voltage VPGM to the selected word line WL. The voltage VPGM is higher than the voltage VPASS.

In the NAND string NS corresponding to the bit line BL ("0"), the select transistor ST1 is in an on state. Thus, a channel potential of the memory cell transistor MT is maintained in VSS. Therefore, a potential difference (VPGM-VSS) between a control gate and a channel becomes larger, and as a result, electrons are injected into the charge storage layer 310, and the threshold voltage of the memory cell transistor MT increases.

In the NAND string NS corresponding to the bit line BL ("1"), the select transistor ST1 is in a cutoff state. Thus, a channel potential increases due to capacitive coupling with the selected word line WL. Therefore, the potential difference between the control gate and the channel decreases. As a result, hardly any electrons are injected into the charge storage layer 310, thereby maintaining the threshold voltage of the memory cell transistor MT.

At time t5, the row decoder 22A applies the voltage VPASS to the selected word line WL.

At time t6, a recovery operation is performed, and the program operation is ended.

1.2.2 Voltages of Interconnects in Program Verification Operation

Next, voltages of the interconnects in the program verification operation will be described with reference to FIG. 27. The erase verification and read operations have similar waveforms, and a read voltage VCGRV of the selected word line WL is different according to a verification level.

Figure 27:
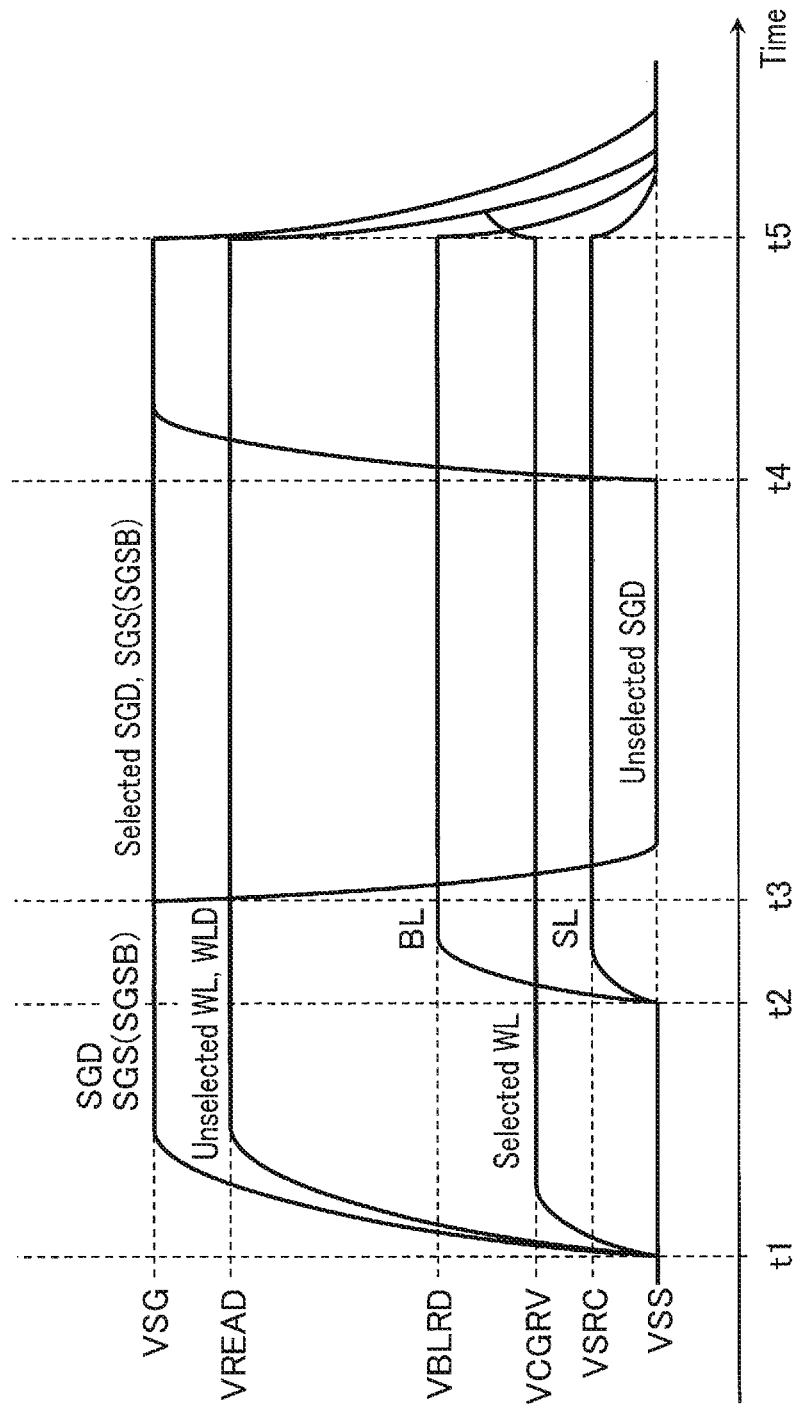
FIG. 27 is a timing chart showing voltages of interconnects in a program verification operation in the semiconductor memory device according to the first embodiment.

As shown in FIG. 27, at time t1, the row decoder 22A applies the voltage VSG to the select gate lines SGD0 to SGD3, SGS, and SGSB in the selected block BLK. The voltage VSG is a voltage for setting the select transistor ST1 to an on state, regardless of a voltage of a corresponding bit line BL. The row decoder 22A applies the voltage VCGRV to the selected word line WL, and applies the voltage VREAD to the unselected word lines WL and dummy word lines WLD. The voltage VCGRV is a read voltage corresponding to a threshold voltage level of read data. The voltage VREAD is a voltage for setting the memory cell transistor MT and the dummy memory cell transistor MTD to an on state, regardless of a threshold voltage. The relationship between the voltages VCGRV and VREAD is VCGRV<VREAD. Thus, in the unselected string units SU, unnecessary electrons in a channel of the NAND string NS are discharged. The voltage VSG is higher than the voltage VREAD in an example of FIG. 27, but the voltage VSG may be lower than the voltage VREAD.

At time t2, the sense amplifier 25 applies the voltage VBLRD to the bit line BL.

The voltage VBLRD is a voltage to be applied to the bit line BL in the read operation. The voltage VSRC is applied to the source line SL. The relationship between the voltages VBLRD and VSRC is VBLRD>VSRC (>VSS).

At time t3, the row decoder 22A continues to apply the voltage VSG to the select gate line SGD (selected SGD), corresponding to the selected string unit SU, and the select gate lines SGS and SGSB. the row decoder 22A applies, for example, the voltage VSS to the select gate lines SGD (unselected SGD) corresponding to the unselected string units SU. Thus, the select transistors ST1 corresponding to the unselected string units SU are set to a cutoff state. In this state, during a period of times t3 to t4, the sense amplifier 25 reads data.

At time t4, the row decoder 22A applies the voltage VSG to the select gate lines SGD corresponding to the unselected string units SU.

At time t5, a recovery operation is performed, and the read operation is ended. More specifically, the row decoder 22A applies the voltage VSS to the select gate lines SGD, SGS, and SGSB, the word lines WL, and the dummy word lines WLD. Thus, the selected word line WL and the unselected word lines WL are equalized. Accordingly, the voltage of the selected word line WL increases slightly before decreasing to the voltage VSS.

1.3 Supply Voltage to Level Shifter

Next, supply voltages to the level shifters LSTP will be described with reference to FIG. 28.

As shown in FIG. 28, the level shifters LSTP are generally divided into three groups by power sources to which they are coupled. For example, three power sources DEC1 to DEC3 corresponding to the level shifters LSTP are provided in the voltage generator 13.

The level shifters LSTP1, LSTP3_0 to LSTP3_7, LSTP4_0 to LSTP4_7, LSTP5, LSTP6, and LSTP7 are coupled to the power source DEC1. The power source DEC1 supplies a voltage VPGMH to the corresponding level shifters LSTP in the program operation. The voltage VPGMH is a voltage of higher value than the voltage VPGM. For example, the voltage VPGMH is a voltage capable of setting a transistor, to one end of which the voltage VPGM is applied, to an on state. In addition, the power source DEC1 supplies a voltage VGBST to the corresponding level shifters LSTP in the read operation (including the program verification operation) and the erase operation. The voltage VGBST is a voltage of lower value than the voltage VPGMH. For example, the voltage VGBST is a voltage for setting a transistor, to one end of which the voltage VREAD or VSG, etc. is applied, to an on state.

The level shifter LSTP2 is coupled to the power source DEC2. The power source DEC2 supplies the voltage VGBST to the level shifter LSTP2 in the write and read operations. The power source DEC2 supplies the voltage VERA to the level shifter LSTP2 in the erase operation. The voltage VERA is a voltage to be applied to the source line SL in the erase pulse application operation.

The level shifters LSTP8_0 to LSTP8_3, LSTP9_0 to LSTP9_3, LSTP10, LSTP11_0 to LSTP11_3, LSTP12_0 to LSTP12_3, LSTP13, LSTP14, LSTP15, and LSTP16 are coupled to the power source DEC3. The power source DEC3 supplies the voltage VGBST to the corresponding level shifters LSTP in the write and read operations. The power source DEC3 supplies the voltage VERA to the corresponding level shifters LSTP in the erase pulse application operation.

1.4 Configuration of Present Embodiment

According to the configuration of the present embodiment, it is possible to provide a semiconductor memory device capable of improving processing capability. Such an effect will be explained in detail below.

A semiconductor memory device may perform control by dividing a core circuit part into a plurality of planes. However, voltages that the device can simultaneously supply to the plurality of planes are limited by a row driver, thus rendering a plurality of operations difficult to be performed simultaneously. Therefore, for example, if a read command with a relatively high priority is received from a controller during an erase operation, the semiconductor memory device may stop the erase operation and execute a read operation.

In contrast, in the configuration according to the present embodiment, the row driver 10 includes the driver unit 15 for write/read operations and the driver unit 16 for erase operation. In addition, each plane PB includes the WR/RD zone selector 80 for write and read operations and the ER zone selector 90 for erase operation. Thereby, the semiconductor memory device 1 can execute the erase operation and the write or read operation in parallel. Thus, the processing capability of the semiconductor memory device can be thus improved.

In the configuration according to the present embodiment, the transistor size of each transistor in the ER zone selector 90 may be smaller than that of each transistor in the WR/RD zone selector 80. It is thereby possible to suppress an increase in an area of the chip.

In the configuration according to the present embodiment, in the WR/RD zone selector 80, the number of transistors provided between the word line WL and the select CG driver (the CGA driver 30, the CGB driver 31, and the CG0/CG95 driver 32) and the number of transistors provided between the word line WL and the CGU driver 33 can be the same. It is thereby possible to suppress an increase in charge/discharge period of the word line WL coupled to the CGU driver 33.

Furthermore, in the configuration according to the present embodiment, in the SGD unit 100, the interconnect GSGD (i.e., the select gate line SGD) and the interconnect USG (i.e., the row driver 10) can be electrically coupled via one of the transistors (any one of the transistors 131_0 to 131_3) in the USG selector 130. It is thereby possible to suppress an increase in the number of transistors provided on a current path between the select gate line SGD and the row driver 10, and suppress an increase in interconnect resistance by an ON resistance of the transistor. Thus, for example, in the read operation, when discharging the select gate lines SGD corresponding to the unselected string units SU, a discharge period can be shortened. The processing capability of the semiconductor memory device can be thus improved.

2. Second Embodiment

Next, the second embodiment will be described. In the second embodiment, four examples of a configuration of the WL selector different from that of the first embodiment will be described. Hereinafter, the parts which differ from the first embodiment will mainly be described.

2.1 First Example

First, an overall configuration of the WL selector of the first example will be described with reference to FIG. 29. Hereinafter, the configuration of the WL selector 23A will mainly be described, but the configuration of the WL selector 23B is also the same as that of the WL selector 23A.

As shown in FIG. 29, the WL selector 23A includes the chunk selector 70, a WR/RD zone selector 80A, a RD zone selector 80B, and the ER zone selector 90.

The configurations of the chunk selector 70 and the ER zone selector 90 are the same as those of the first embodiment.

The WR zone selector 80A has the same configuration as that of the WR/RD zone selector 80 of the first embodiment, but corresponds to the write operation.

The RD zone selector 80B has the same circuit configuration as that of the WR/RD zone selector 80 of the first embodiment, but corresponds to the read operation.

The semiconductor memory device 1 can execute the read operation that the RD zone selector 80B corresponds, in parallel with the write operation that the WR zone selector 80A corresponds.

2.2 Second Example

Next, an overall configuration of the WL selector of the second example will be described with reference to FIG. 30.

Figure 30:
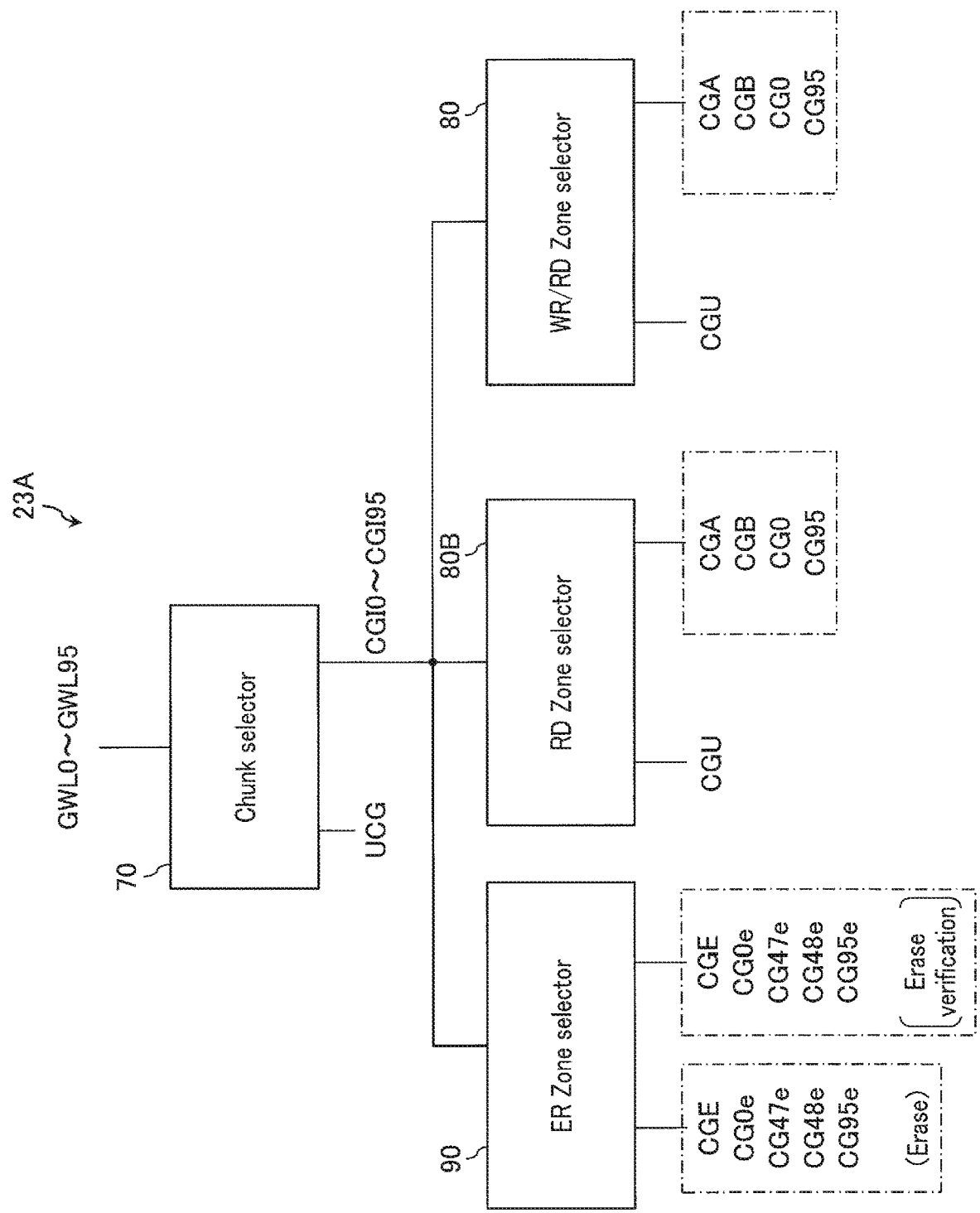
FIG. 30 is a block diagram of a WL selector included in a semiconductor memory device according to a second example of the second embodiment.

As shown in FIG. 30, the WL selector 23A includes the chunk selector 70, the RD zone selector 80B, the WR/RD zone selector 80, and the ER zone selector 90.

The configurations of the chunk selector 70, the WR/RD zone selector 80, and the ER zone selector 90 are the same as those of the first embodiment.

The RD zone selector 80B has the same configuration as that of the WR/RD zone selector 80 of the first embodiment.

The RD zone selector 80B has the same circuit configuration as that of the WR/RD zone selector 80 of the first embodiment, but corresponds to the read operation.

The semiconductor memory device 1 can execute the read operation that the RD zone selector 80B corresponds, in parallel with the write or read operation that the WR/RD zone selector 80 corresponds.

2.3 Third Example

Next, an overall configuration of the WL selector of the third example will be described with reference to FIG. 31.

Figure 31:
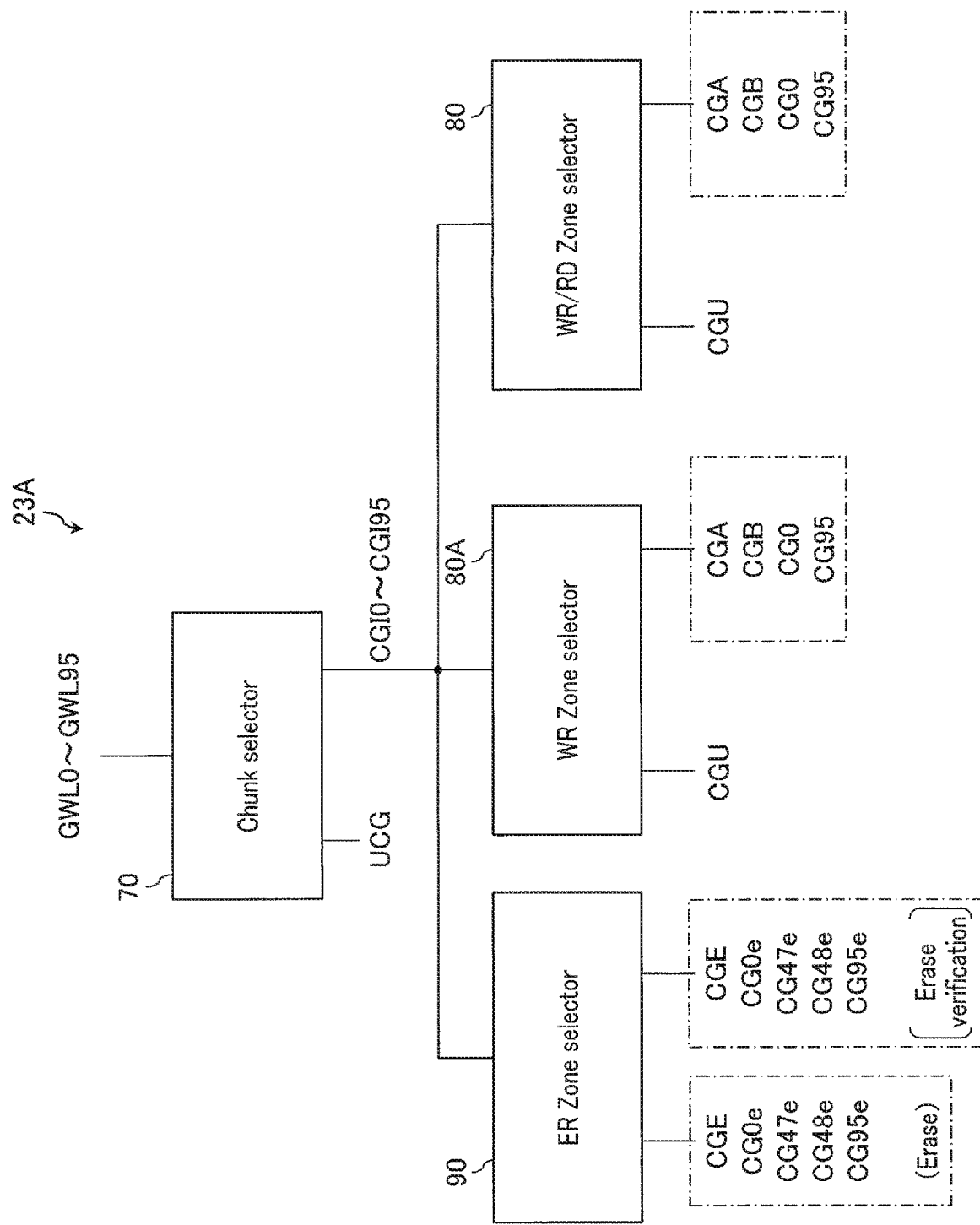
FIG. 31 is a block diagram of a WL selector included in a semiconductor memory device according to a third example of the second embodiment.

As shown in FIG. 31, the WL selector 23A includes the chunk selector 70, the WR zone selector 80A, the WR/RD zone selector 80, and the ER zone selector 90.

The configurations of the chunk selector 70, the WR/RD zone selector 80, and the ER zone selector 90 are the same as those of the first embodiment.

The WR zone selector 80A has the same configuration as that of the WR/RD zone selector 80 of the first embodiment, but corresponds to the write operation.

The semiconductor memory device 1 can execute the write operation that the WR zone selector 80A corresponds, in parallel with the write or read operation that the WR/RD zone selector 80 corresponds.

2.4 Fourth Example

Next, an overall configuration of the WL selector of the fourth example will be described with reference to FIG. 32.

Figure 32:
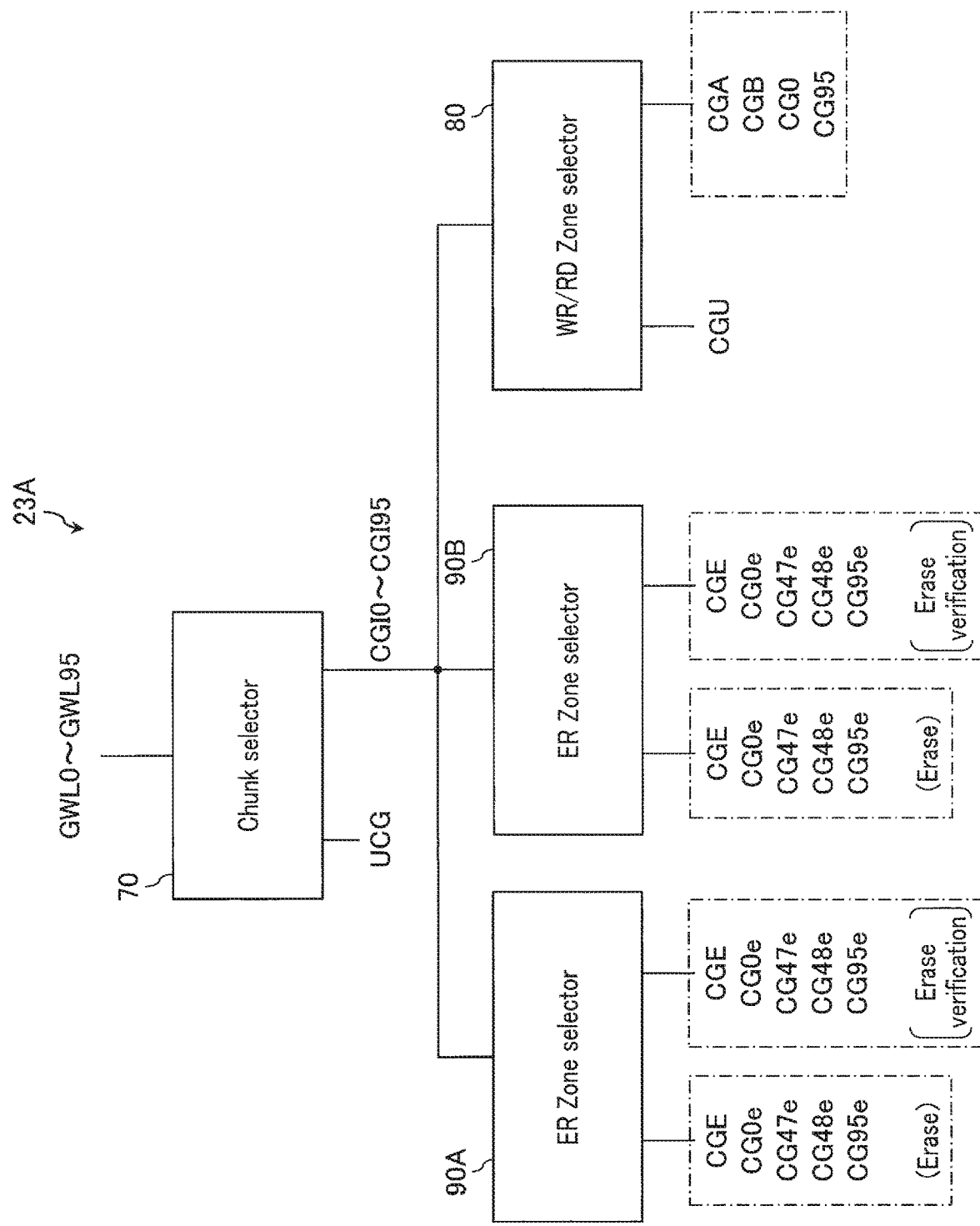
FIG. 32 is a block diagram of a WL selector included in a semiconductor memory device according to a fourth example of the second embodiment.

As shown in FIG. 32, the WL selector 23A includes the chunk selector 70, the WR/RD zone selector 80, and two ER zone selectors 90A and 90B.

The configurations of the chunk selector 70 and the WR/RD zone selector 80 are the same as those of the first embodiment.

Each of the ER zone selectors 90A and 90B has the same configuration as that of the ER zone selector 90 of the first embodiment.

The semiconductor memory device 1 can execute two erase operations in parallel in different planes PB.

2.5 Advantageous Effect of Present Embodiment

The configuration of the present embodiment can attain the same effect as that of the first embodiment.

Furthermore, in the configuration according to the present embodiment, a plurality of operations can be executed in parallel according to the number of zone selectors (e.g., the WR/RD zone selector 80 or the ER zone selector 90, etc.) provided in the WL selector 23.

The number of zone selectors provided in the WL selector 23 may be four or more.

3. Third Embodiment

Next, the third embodiment will be described. In the third embodiment, four examples of the current path when discharging the selected word line WL in the program verification operation will be described. Hereinafter, the parts which differ from the first embodiment will be mainly described. A discharge path of a word line WL voltage to be described below is applicable to the read and erase verification operations.

3.1 First Example

First, a current path in a first example will be described with reference to FIG. 33. An example of FIG. 33 shows a discharge path corresponding to the selected word line WL (in this example, the word line WL1) in the WL selector 23A.

Figure 33:
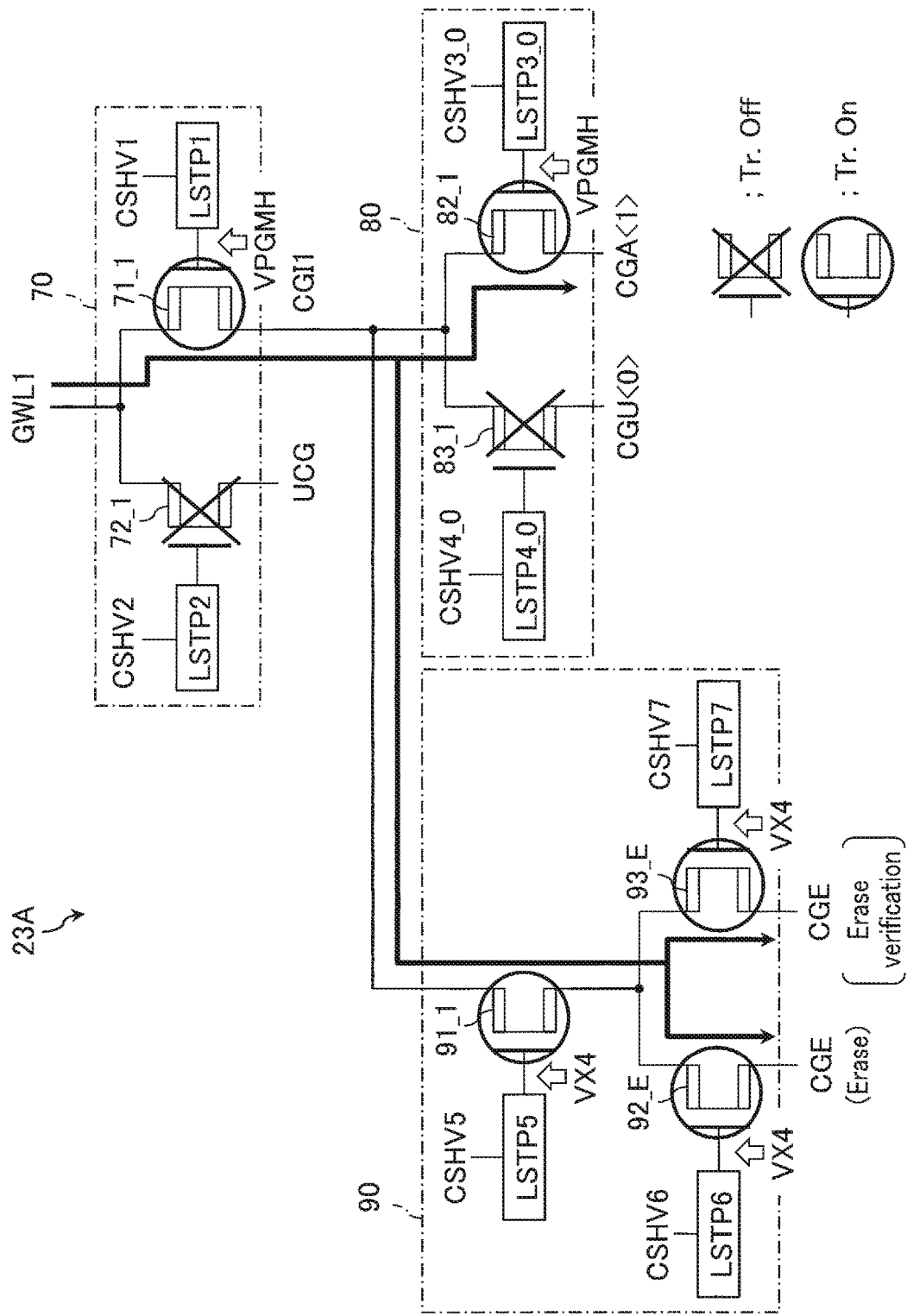
FIG. 33 is a schematic diagram illustrating a discharge path of a selected word line in a program verification operation in a semiconductor memory device according to a first example of a third embodiment.

As shown in FIG. 33, when the write operation is started, in the WR/RD zone selector 80, the level shifter LSTP3_0 applies the voltage VPGMH to the gates of 82_0 to 82_11 in the zone Zn0 corresponding to the word lines WL0 to WL11. Thereby, the transistors 82_0 to 82_11 including the transistor 82_1 corresponding to the word line WL1 are set to an on state. In the zones Zn1 to Zn7, not including the selected word line WL, the level shifters LSTP4_1 to 4_7 apply the voltage VPGMH to the gates of the transistors 83_12 to 83_95. Thereby, the transistors 83_12 to 83_95 corresponding to the word lines WL12 to WL95 are set to an on state.

In the chunk selector 70, the level shifter LSTP1 applies the voltage VPGMH to the gates of the transistors 71_0 to 71_95. Thereby, the transistors 71_0 to 71_95 including the transistor 71_1 corresponding to the word line WL1 are set to an on state.

In the program verification operation, when the read operation of data is ended, a recovery operation is started. More specifically, when the recovery operation is started, in the ER zone selector 90, the level shifter LSTP5 applies a voltage VX4 to the gates of the transistors 91_0 to 91_95. The voltage VX4 is a voltage lower than the voltage VGBST and for setting the corresponding transistors to an on state. Thereby, the transistors 91_0 to 91_95 are set to an on state. The level shifter LSTP6 applies the voltage VX4 to the gates of the transistors 92_0, 92_47, 92_48, 92_95, and 92_E0 to 92_E7. Thereby, the transistors 92_0, 92_47, 92_48, 92_95, and 92_E0 to 92_E7, including any one of the transistors 92_E0 to 92_E7 corresponding to the word line WL1, are set to an on state. The level shifter LSTP7 applies the voltage VX4 to the gates of the transistors 93_0, 93_47, 93_48, 93_95, and 93_E0 to 93_E7. Thereby, the transistors 93_0, 93_47, 93_48, 93_95, and 93_E0 to 93_E7, including any one of the transistors 93_E0 to 93_E7 corresponding to the word line WL1, are set to an on state.

As a result, a voltage of the word line WL is discharged to the row driver 10 via the ER zone selector 90 (and the WR/RD zone selector 80). At this time, the selected word line WL is electrically coupled to other word lines WL in the ER zone selector 90, and is equalized.

Next, a voltage of the selected word line WL and an output voltage of each level shifter LSTP in the write operation will be described with reference to FIG. 34. FIG. 34 is a timing chart showing a voltage of the selected word line WL (WL1) and output voltages of the level shifters LSTP in the first to third program loops.

As shown in FIG. 34, during a period of the first program loop, the level shifter LSTP1, and the level shifter LSTP3_0 corresponding to the selected word line WL, output the voltage VPGMH.

In the first (program loop) program operation PGM, the voltage VPGM is applied to the selected word line WL.

In the first program verification operation PVFY, the voltage VCGRV is applied to the selected word line WL, and the read operation is executed. After the read operation is ended, a recovery operation period, the level shifters LSTP5 to LSTP7 output the voltage VX4. Thereby, the word line WL is discharged.

At the start of the second program loop, the output voltage of the level shifters LSTP1 and LSTP3_0 is stepped up to a voltage (VPGMH+DV). A voltage DV is a voltage of a larger value than the voltage VSS used for stepping up the voltage VPGM when repeating a program loop. Then, during a period of the second program loop, the output voltage of the level shifters LSTP1 and LSTP3_0 is maintained to the voltage (VPGMH+DV).

In the second program operation PGM, the voltage (VPGM+DV) is applied to the selected word line WL.

In the second program verification operation PVFY, a voltage VCGRV is applied to the selected word line WL, and the read operation is executed. After the read operation is ended, a recovery operation period, the level shifters LSTP5 to LSTP7 output the voltage VX4. Thereby, the word line WL is discharged.

At the start of the third program loop, the output voltage of the level shifters LSTP1 and LSTP3_0 is stepped up to a voltage (VPGMH+2DV). Then, during a period of the third program loop, the output voltage of the level shifters LSTP1 and LSTP3_0 is maintained to the voltage (VPGMH+2DV).

In the third program operation PGM, a voltage (VPGM+2DV) is applied to the selected word line WL.

In the third program verification operation PVFY, the voltage VCGRV is applied to the selected word line WL, and the read operation of data is executed. After the read operation is ended, during a recovery operation period, the level shifters LSTP5 to LSTP7 output the voltage VX4. Thereby, the word line WL is discharged.

In the fourth program loop and subsequent loops, the voltage VPGMH and VPGM are stepped up every time the program loop is repeated. Thus, during the write operation period, the level shifters LSTP1 and LSTP3_0 corresponding to the program operation continue to output a voltage of not less than the voltage VPGMH.

Next, supply voltages to the level shifters LSTP will be described with reference to FIG. 35.

As shown in FIG. 35, the level shifters LSTP are generally divided into four groups by power sources to which they are coupled. In this example, the power sources DEC1 to DEC4 are provided in the voltage generator 13.

The level shifters LSTP1, LSTP3_0 to LSTP3_7, and LSTP4_0 to LSTP4_7 are coupled to the power source DEC1. The power source DEC1 supplies the voltage VPGMH to the corresponding level shifters LSTP in the write operation, and supplies the voltage VGBST to the corresponding level shifters LSTP in the read and erase operations.

The level shifter LSTP2 is coupled to the power source DEC2. The power source DEC2 supplies the voltage VX4 to the level shifter LSTP2 in the write and read operations. The power source DEC2 supplies the voltage VERA to the level shifter LSTP2 in the erase operation.

The level shifters LSTP8_0 to LSTP8_3, LSTP9_0 to LSTP9_3, LSTP10, LSTP11_0 to LSTP11_3, LSTP12_0 to LSTP12_3, LSTP13, LSTP14, LSTP15, and LSTP16 are coupled to the power source DEC3. The power source DEC3 supplies the voltage VGBST to the corresponding level shifters LSTP in the write and read operations. The power source DEC3 supplies the voltage VERA to the corresponding level shifters LSTP in the erase operation.

The level shifters LSTP5, LSTP6, and LSTP7 are coupled to the power source DEC4. The power source DEC4 supplies the voltage VX4 to the corresponding level shifters LSTP in the write and read operations. The power source DEC4 supplies the voltage VERA to the corresponding level shifters LSTP in the erase operation.

3.2 Second Example

Next, a current path in a second example will be described with reference to FIG. 36. An example of FIG. 36 shows a discharge path corresponding to the selected word line WL (in this example, the word line WL1) in the WL selector 23A. Hereinafter, the parts which differ from the first example of the third embodiment will mainly be described.

As shown in FIG. 36, in this example, when a recovery operation is started, in the chunk selector 70, the level shifter LSTP2 applies the voltage VX4 to the gates of the transistors 72_0 to 72_95. Thereby, the transistors 72_0 to 72_95 are set to an on state. Namely, the interconnects GWL0 to GWL95 are coupled in common to the interconnect UCG.

As a result, the voltage of the word line WL is discharged to the row driver 10 via the transistors 72_0 to 72_95 of the chunk selector 70 (and the WR/RD zone selector 80). At this time, the selected word line WL is electrically coupled to other word lines WL and is equalized in the chunk selector 70.

Next, a voltage of the selected word line WL and an output voltage of each level shifter LSTP in the write operation will be described with reference to FIG. 37. FIG. 37 is a timing chart showing a voltage of the selected word line WL (WL1) and output voltages of the level shifters LSTP in the first to third program loops.

As shown in FIG. 37, in the write operation, a voltage to be applied to the selected word line WL, and a voltage output by the level shifter LSTP1 and the level shifter LSTP3_0 corresponding to the selected word line WL, are the same as those in FIG. 34 of the first example.

In this example, in the program verification operation PVFY, during a recovery operation period, the level shifter LSTP2 outputs the voltage VX4. Thereby, the word line WL is discharged. Unlike in the first example, the output voltages of the level shifters LSTP5 to LSTP7 are maintained at the voltage VSS.

Supply voltages to the level shifters in this example are the same as those in FIG. 35 of the first example.

3.3 Third Example

Figure 38:
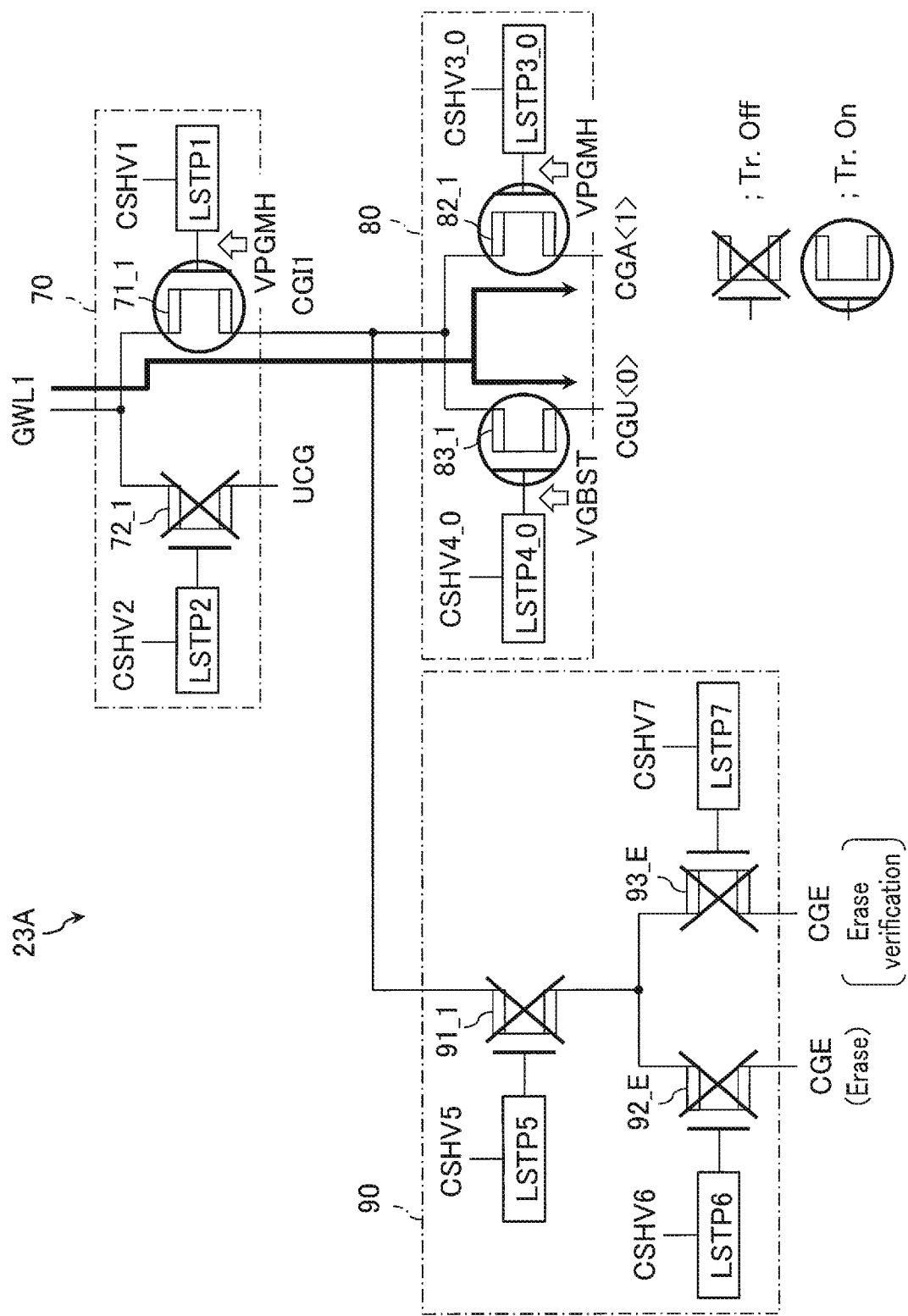
FIG. 38 is a schematic diagram illustrating a discharge path of a selected word line in a program verification operation in a semiconductor memory device according to a third example of the third embodiment.

Next, a current path in a third example will be described with reference to FIG. 38. An example of FIG. 38 shows a discharge path corresponding to the selected word line WL (in this example, the word line WL1) in the WL selector 23A. Hereinafter, the parts which differ from the first and second examples of the third embodiment will mainly be described.

As shown in FIG. 38, in this example, when a recovery operation is started, in the zone Zn of the WR/RD zone selector 80 corresponding to the selected word line WL, the level shifter LSTP4_0 applies the voltage VGBST to the gates of the transistors 83_1 to 83_11. Thereby, the transistors 83_1 to 83_11 are set to an on state. Namely, the interconnects GWL0 to GWL11 are coupled in common to the interconnect CGU<0>.

As a result, the voltage of the word line WL is discharged to the row driver 10 via the WR/RD zone selector 80. At this time, the selected word line WL is electrically coupled to other word lines WL and is equalized in the WR/RD zone selector 80.

Figure 39:
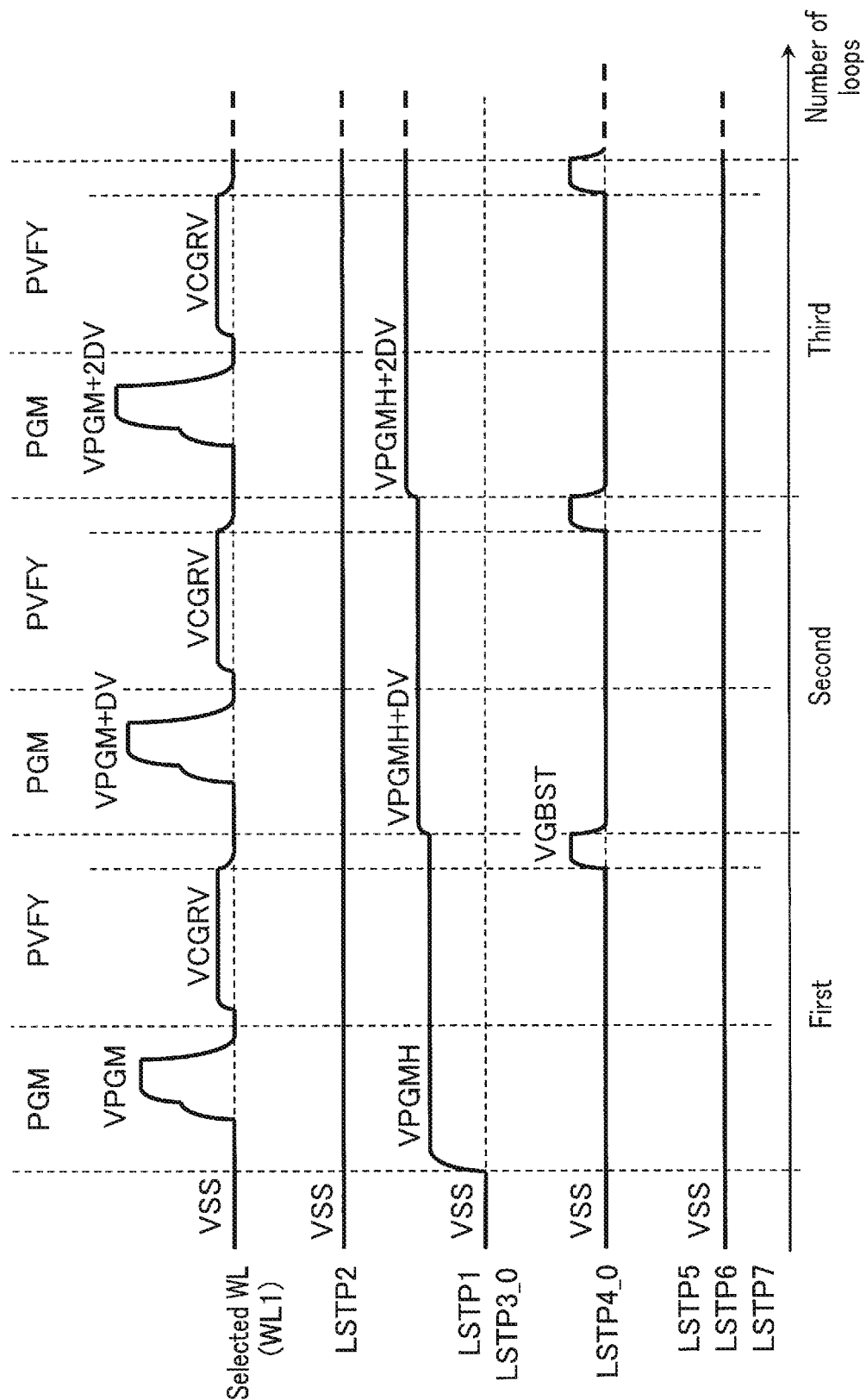
FIG. 39 is a timing chart showing a voltage of the selected word line WL and output voltages of level shifters in a write operation in the semiconductor memory device according to the third example of the third embodiment.

Next, a voltage of the selected word line WL and an output voltage of each level shifter LSTP in the write operation will be described with reference to FIG. 39. FIG. 39 is a timing chart illustrating a voltage of the selected word line WL (WL1) and an output voltage of each level shifter LSTP in the first to third program loops.

As shown in FIG. 39, in the write operation, a voltage to be applied to the selected word line WL, and a voltage output by the level shifter LSTP1 and the level shifter LSTP3_0 corresponding to the selected word line WL, are the same as those in FIG. 34 of the first example.

In this example, in the program verification operation PVFY, during a recovery operation period, the level shifter LSTP4_0 corresponding to the selected word line WL outputs the voltage VGBST. Thereby, the word line WL is discharged. Different from the first example, the output voltages of the level shifters LSTP5 to LSTP7 are maintained at the voltage VSS.

Next, supply voltages to the level shifters LSTP will be described with reference to FIG. 40.

Similarly to the first example, the power sources DEC1 to DEC4 are provided in this example as shown in FIG. 40.

Different from the first example, LSTP4_0 to LSTP4_7 are coupled to the power source DEC3. LSTP4_0 to LSTP4_7 are supplied with the voltage VGBST in the write and read operations, and with the voltage VERA in the erase operation. The other configurations are the same as those described in the first example.

3.4 Fourth Example

Next, a current path in a fourth example will be described with reference to FIG. 41. An example of FIG. 41 shows a discharge path corresponding to the selected word line WL (in this example, the word line WL1) in the WL selector 23A. Hereinafter, the parts which differ from the first to third examples of the third embodiment will be mainly described.

As shown in FIG. 41, in this example, when the recovery operation is started in the chunk selector 70, the level shifter LSTP2 applies the voltage VX4 to the gates of the transistors 72_0 to 72_95. Thereby, the transistors 72_0 to 72_95 are set to an on state.

In the zone Zn of the WR/RD zone selector 80 corresponding to the selected word line WL, the level shifter LSTP4_0 applies the voltage VGBST to the gates of the transistors 83_1 to 83_11. Thereby, the transistors 83_1 to 83_11 are set to an on state.

In the ER zone selector 90, the level shifter LSTP5 applies the voltage VX4 to the gates of the transistors 91_0 to 91_95. The level shifter LSTP6 applies the voltage VX4 to the gates of the transistors 92_0, 92_47, 92_48, 92_95, and 92_E0 to 92_E7. The level shifter LSTP7 applies the voltage VX4 to the gates of the transistors 93_0, 93_47, 93_48, 93_95, and 93_E0 to 93_E7. Thereby, the transistors 91_0 to 91_95, 92_0, 92_47, 92_48, 92_95, 92_E0 to 92_E7, 93_0, 93_47, 93_48, 93_95, and 93_E0 to 93_E7 are set to an on state.

As a result, the voltage of the word line WL is discharged to the row driver 10 via the transistors 72_0 to 72_95 of the chunk selector 70, the WR/RD zone selector 80, and the ER zone selector 90.

Figure 42:
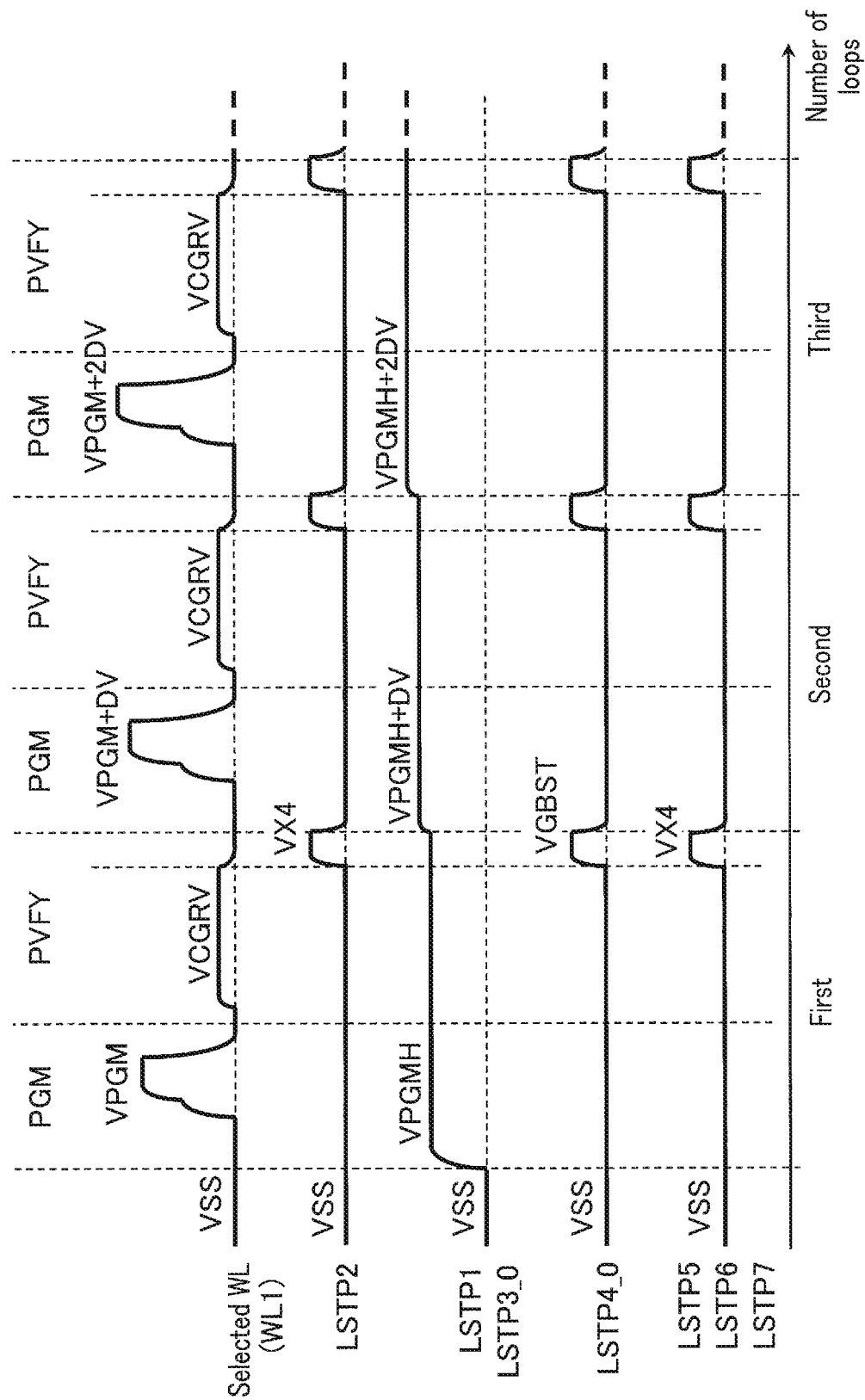
FIG. 42 is a timing chart showing a voltage of the selected word line WL and output voltages of level shifters in a write operation in the semiconductor memory device according to the fourth example of the third embodiment.

Next, a voltage of the selected word line WL and an output voltage of each level shifter LSTP in the write operation will be described with reference to FIG. 42. FIG. 42 is a timing chart showing a voltage of the selected word line WL (WL1) and an output voltage of each level shifter LSTP in the first to third program loops.

As shown in FIG. 42, in the write operation, a voltage to be applied to the selected word line WL, and a voltage output by that the level shifter LSTP1 and LSTP3_0 corresponding to the selected word line WL, are the same as those in FIG. 34 of the first example.

In this example, in the program verification operation PVFY, during the recovery operation period, the level shifter LSTP4_0 corresponding to the selected word line WL outputs the voltage VGBST. The level shifters LSTP2 and LSTP5 to LSTP6 output the voltage VX4.

Supply voltages to the level shifters in this example are the same as those in FIG. 40 of the third example.

3.5 Advantageous Effect of Present Embodiment

The configuration according to the present embodiment can be applied to the first and second embodiments. Thus, the same advantageous effect as that of the first and second embodiments can be obtained.

In addition, in the configuration according to the present embodiment, during the write operation period, in the WL selector 23, the level shifters LSTP corresponding to the program operation can continue to output a voltage no lower than the voltage VPGMH. Thereby, in the level shifters LSTP corresponding to the program operation, an on/off operation of an output of the voltage VPGMH is rendered unnecessary, along with the switching between the program operation and the program verification operation during the write operation. It is thus possible to suppress an increase in power consumption associated with switching between an on state and an off state. Accordingly, it is possible to suppress an increase in power consumption in the semiconductor memory device.

In the configuration according to the present embodiment, in the recovery operation in the program verification operation (and the read operation), an on/off operation of the level shifters LSTP that output the voltage VX4 or the voltage VGBST can provide a discharge path of the word line WL. In such a case, it is possible to suppress an increase in power consumption more than a case where a discharge path of the word line WL is provided by an on/off operation of the level shifters LSTP that output the voltage VPGMH.

4. Fourth Embodiment

Next, the fourth embodiment will be described. In the fourth embodiment, a configuration of the SG_WLD selector 24, which differs from that of the first embodiment, will be described. Hereinafter, the parts which differ from the first embodiment will be mainly described.

4.1 Overall Configuration of SG_WLD Selector

First, an overall configuration of the SG_WLD selector 24 will be described with reference to FIG. 43. Hereinafter, a configuration of the SG_WLD selector 24A will mainly be described, but a configuration of the SG_WLD selector 24B is also the same as that of the SG_WLD selector 24A.

As shown in FIG. 43, in the present embodiment, the SGD unit 100 includes the WR/RD selector 110, the ER selector 120, the USG selector 130, and a VSS selector 220.

The WR_RD selector 110, the ER selector 120, and the USG selector 130 have the same configurations as those in FIG. 19 of the first embodiment.

The VSS selector 220 applies the voltage VSS to the interconnects GSGD0 to GSGD3 based on a control signal CSHV received from the PB controller 12. The voltage VSS is applied to an input terminal of the VSS selector 220 (an input terminal is coupled to a ground voltage interconnect). The interconnects GSGD0 to GSGD3 are respectively coupled to four output terminals of the VSS selector 220.

The SGS_WLD unit 101 includes the WR/RD selector 140, the ER selector 150, the USG selector 160, and a VSS selector 230.

The WR/RD selector 140, the ER selector 150, and the USG selector 160 have the same configurations as those in FIG. 19 of the first embodiment.

The VSS selector 230 applies the voltage VSS to the interconnects GSGS and GSGSB based on a control signal CSHV received from the PB controller 12. The voltage VSS is applied to an input terminal of the VSS selector 230. The interconnects GSGS and GSGSB are respectively coupled to two output terminals of the VSS selector 230.

4.2 Configuration of VSS Selector

Next, configurations of the VSS selectors 220 and 230 will be described with reference to FIG. 44.

Figure 44:
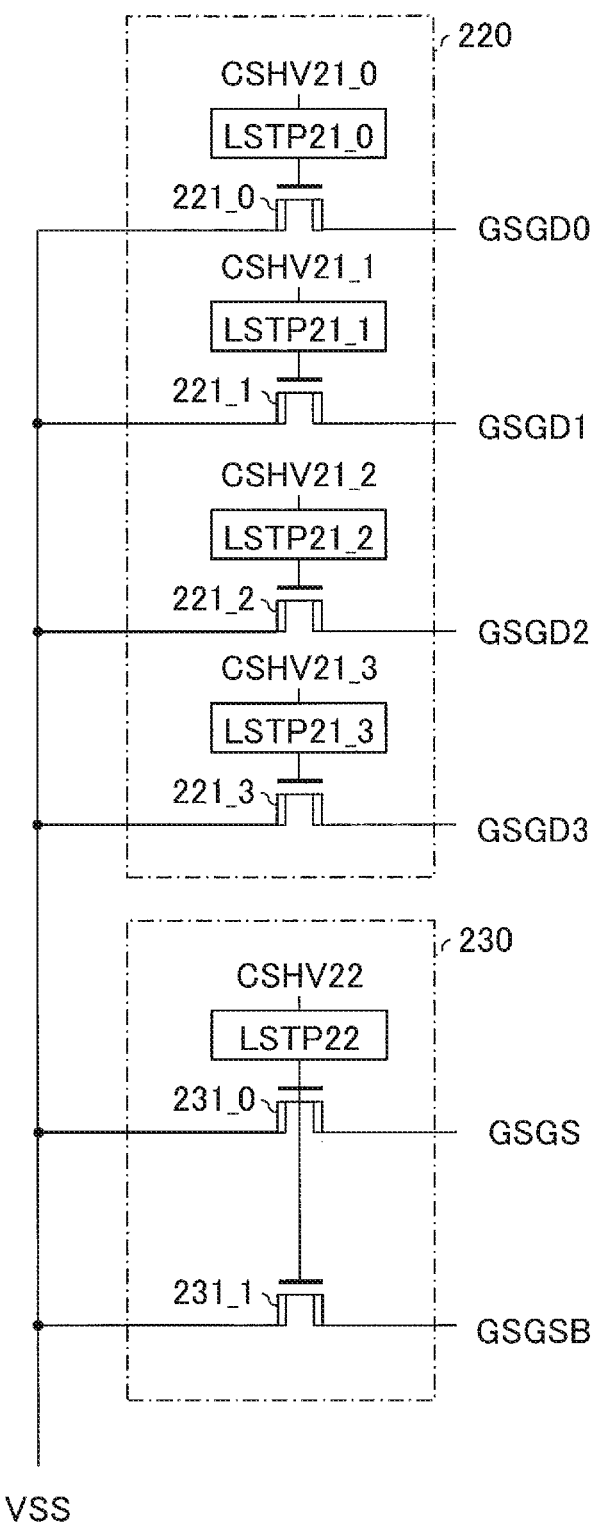
FIG. 44 is a circuit diagram of a VSS selector in the SG_WLD selector included in the semiconductor memory device according to the fourth embodiment.

As shown in FIG. 44, the VSS selector 220 includes high-voltage n-channel MOS transistors 221_0 to 221_3 and level shifters LSTP21_0 to LSTP21_3.

One end of the transistor 221_0 is coupled to the interconnect GSGD0, and the voltage VSS is applied to the other end (which is coupled to a ground voltage interconnect). A gate of the transistor 221_0 is coupled to the level shifter LSTP21_0.

LSTP21_0 applies a voltage to the gate of the transistor 221_0 based on a control signal CSHV21_0 received from the PB controller 12.

One end of the transistor 221_1 is coupled to the interconnect GSGD1, and the voltage VSS is applied to the other end (which is coupled to a ground voltage interconnect). A gate of the transistor 221_1 is coupled to the level shifter LSTP21_1.

LSTP21_1 applies a voltage to the gate of the transistor 221_1 based on a control signal CSHV21_1 received from the PB controller 12.

One end of the transistor 221_2 is coupled to the interconnect GSGD2, and the voltage VSS is applied to the other end (which is coupled to a ground voltage interconnect). A gate of the transistor 221_2 is coupled to the level shifter LSTP21_2.

LSTP21_2 applies a voltage to the gate of the transistor 221_2 based on a control signal CSHV21_2 received from the PB controller 12.

One end of the transistor 221_3 is coupled to the interconnect GSGD3, and the voltage VSS is applied to the other end (which is coupled to a ground voltage interconnect). A gate of the transistor 221_3 is coupled to the level shifter LSTP21_3.

LSTP21_3 applies a voltage to the gate of the transistor 221_3 based on a control signal CSHV21_3 received from the PB controller 12.

Next, the VSS selector 230 will be described.

The VSS selector 230 includes high-voltage n-channel MOS transistors 231_0 and 231_1, and a level shifter LSTP22.

One end of the transistor 231_0 is coupled to the interconnect GSGS, and the voltage VSS is applied to the other end (which is coupled to a ground voltage interconnect). A gate of the transistor 231_0 is coupled to the level shifter LSTP22.

One end of the transistor 231_1 is coupled to the interconnect GSGSB, and the voltage VSS is applied to the other end (which is coupled to a ground voltage interconnect). A gate of the transistor 231_1 is coupled to the level shifter LSTP22.

LSTP22 applies voltages to the gates of the transistors 231_0 and 231_1 based on a control signal CSHV22 received from the PB controller 12.

4.3 Example of Discharge Path of Select Gate Line SGD

Next, an example about a current path when discharging the select gate lines SGD corresponding to the unselected string units SU in the read operation (program verification operation) will be described with reference to FIG. 45. An example of FIG. 45 shows a discharge path corresponding to the select gate line SGD0 (the interconnect GSGD) in the SGD unit 100.

In the read operation, for example, as shown in FIG. 27, at time t3 or t5, the voltage VSG being applied to the select gate lines SGD (the unselected SGD) corresponding to the unselected string units SU is discharged. In such a case, the discharge path shown in FIG. 45 is applied.

Figure 45:
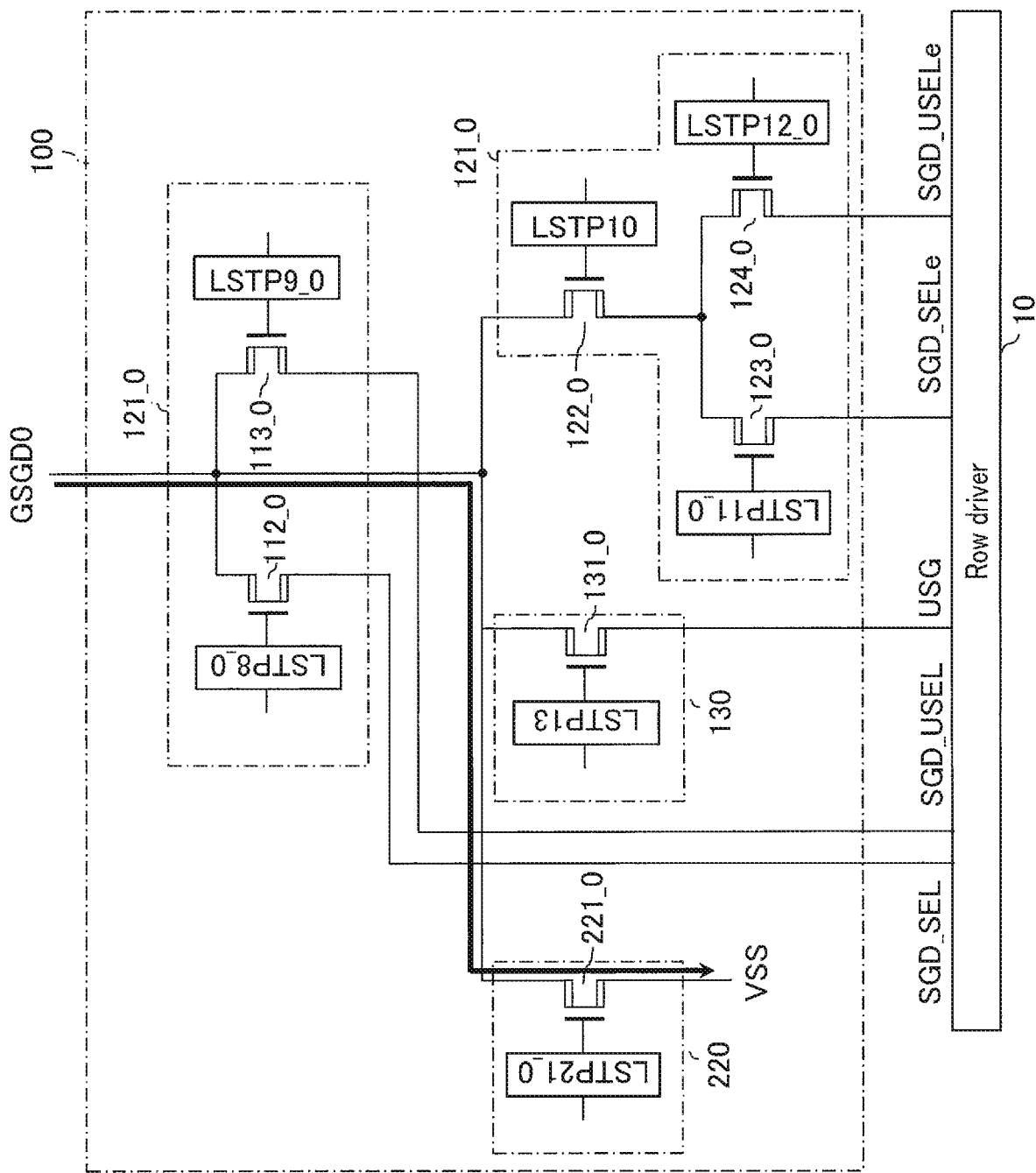
FIG. 45 is a schematic diagram illustrating a discharge path of a select gate line corresponding to an unselected string unit SU in the semiconductor memory device according to the fourth embodiment.

As shown in FIG. 45, when the select gate line SGD0 is discharged, in the VSS selector 220, the level shifter LSTP21_0 applies, for example, the voltage VGBST to the transistor 221_0. Thereby, the transistor 221_0 is set to an on state.

As a result, the select gate line SGD0 (the interconnect GSGD0) is applied (discharged to a ground voltage interconnect) with the voltage VSS via the transistor 221_0.

4.4 Advantageous Effect of Present Embodiment

The configuration according to the present embodiment can be applied to the first to third embodiments. Thus, the same advantageous effect as that of the first to third embodiments can be obtained.

Furthermore, in the configuration according to the present embodiment, in the read operation, in the SGD unit 100, when discharging the select gate lines SGD corresponding to the unselected string units SU, the voltage VSS can be applied to the select gate line SGD without going through the row driver 10. Therefore, the number of switching elements (the number of stages of transistors) in the discharge path of the select gate line SGD can be reduced, and the discharge period can be shortened. The processing capability of the semiconductor memory device can be thus improved.

5. Modification, Etc

According to above embodiments, a semiconductor memory device includes: a memory cell array (20) including a first memory cell, a first word line (WL) coupled to a gate of the first memory cell, a first circuit (21) coupled to the first word line, a first driver (30) used for a write operation and a read operation, a second driver (42) used for an erase operation, and a voltage generator (13) respectively coupled to the first and second drivers. The first circuit includes: a second circuit (22) capable of electrically coupling the first word line and a first interconnect (GWL) in the write operation, the read operation, and the erase operation in which the first word line is selected; a third circuit (70) capable of electrically coupling the first interconnect and a second interconnect (CGI) in the write operation, the read operation, and the erase operation; a fourth circuit (80) capable of electrically coupling the second interconnect and the first driver in the write operation and the read operation; and a fifth circuit (90) capable of electrically coupling the second interconnect and the second driver in the erase operation.

The application of the above-described embodiments allows for the provision of a semiconductor memory device capable of improving processing capability. The embodiments are not limited to the above-described aspects, but can be modified in various ways.

The above-described embodiments can be combined as far as possible.

The term "couple" in the above-described embodiments includes indirect coupling via a transistor or a resistor, etc.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a first memory cell;
a first word line coupled to a gate of the first memory cell;
a first circuit coupled to the first word line;
a first driver used for a write operation and a read operation;
a second driver used for an erase operation; and
a voltage generator respectively coupled to the first and second drivers,
wherein the first circuit includes:
a second circuit capable of electrically coupling the first word line and a first interconnect in the write operation, the read operation, and the erase operation in which the first word line is selected;
a third circuit capable of electrically coupling the first interconnect and a second interconnect in the write operation, the read operation, and the erase operation;
a fourth circuit capable of electrically coupling the second interconnect and the first driver in the write operation and the read operation; and
a fifth circuit capable of electrically coupling the second interconnect and the second driver in the erase operation.

2. The device according to claim 1, further comprising:
a second word line coupled to the first circuit; and
a third driver used for the write operation and the read operation and coupled to the voltage generator,
wherein the memory cell array further includes a second memory cell coupled to the first memory cell in series, and including a gate to which the second word line is coupled,
the second circuit is capable of electrically coupling the second word line and a third interconnect,
the third circuit is capable of electrically coupling the third interconnect and a fourth interconnect, and
the fourth circuit is capable of electrically coupling the fourth interconnect and the third driver in the write operation and the read operation in which the first word line is selected.

3. The device according to claim 1, wherein
the first driver supplies a write voltage to the first circuit in the write operation and supplies a read voltage to the first circuit in the read operation.

4. The device according to claim 2, wherein
the third driver supplies a first voltage lower than a write voltage to the first circuit in the write operation, and supplies a second voltage higher than a read voltage to the first circuit in the read operation.

5. The device according to claim 1, wherein
the first circuit further includes a sixth circuit capable of electrically coupling the second interconnect and the first driver in the read operation, and
the second interconnect is electrically coupled to the first driver via one of the fourth circuit and the sixth circuit in the read operation.

6. The device according to claim 1, wherein
the first circuit further includes a seventh circuit capable of electrically coupling the second interconnect and the first driver in the write operation, and
the second interconnect is electrically coupled to the first driver via one of the fourth circuit and the seventh circuit in the write operation.

7. The device according to claim 1, wherein
the first circuit further includes an eighth circuit capable of electrically coupling the second interconnect and the second driver in the erase operation, and
the second interconnect is electrically coupled to the second driver via one of the fifth circuit and the eighth circuit in the write operation.

8. The device according to claim 1, further comprising:
a first select gate line coupled to the first circuit;
a fourth driver used for the write operation and the read operation and coupled to the voltage generator;
a fifth driver used for the erase operation and coupled to the voltage generator; and
a sixth driver coupled to the voltage generator,
wherein the memory cell array further includes a first select transistor which includes one end coupled to the first memory cell in series and a gate to which the first select gate line is coupled, the second circuit is capable of electrically coupling the first select gate line and a fifth interconnect, and the first circuit further includes:
a ninth circuit capable of electrically coupling the fifth interconnect and the fourth driver in the write operation and the read operation;
a tenth circuit capable of electrically coupling the fifth interconnect and the fifth driver in the erase operation; and
an eleventh circuit capable of electrically couples the fifth interconnect and the sixth driver.

9. The device according to claim 8, further comprising
a seventh driver used for the write operation and the read operation and coupled to the voltage generator,
wherein, in the write operation and the read operation, the ninth circuit electrically couples the fifth interconnect and the fourth driver when the first select gate line is selected, and electrically couples the fifth interconnect and the seventh driver when the first select gate line is not selected.

10. The device according to claim 8, further comprising
a sense amplifier to which a bit line is coupled,
wherein the other end of the first select transistor is coupled to the bit line.

11. The device according to claim 1, wherein
the write operation includes a program operation and a program verification operation,
the fourth circuit includes a first transistor coupling the second interconnect and the first driver,
during the write operation, a third voltage higher than a write voltage is applied to a gate of the first transistor, and
when the first interconnect is discharged in the program verification operation, the fifth circuit electrically couples the second interconnect and the second driver.

12. The device according to claim 2, wherein
the write operation includes a program operation and a program verification operation,
the fourth circuit includes a second transistor coupling the second interconnect and the first driver, and a third transistor coupling the second interconnect and the third driver,
during the write operation, a third voltage higher than a write voltage is applied to a gate of the second transistor, and
when the first interconnect is discharged in the program verification operation, a fourth voltage lower than the third voltage is applied to the third transistor, and the second interconnect and the third driver are electrically coupled.

13. The device according to claim 1, further comprising
an eighth driver coupled to the voltage generator,
wherein the write operation includes a program operation and a program verification operation,
the third circuit includes a fourth transistor coupling the first interconnect and the second interconnect, and a fifth transistor coupling the first interconnect and the eighth driver,
during the write operation, a third voltage higher than a write voltage is applied to a gate of the fourth transistor, and
when the first interconnect is discharged in the program verification operation, the third circuit applies a fifth voltage lower than the third voltage to the fifth transistor, and electrically couples the first interconnect and the eighth driver.

14. The device according to claim 8, wherein
the first circuit includes a twelfth circuit capable of coupling the fifth interconnect and a ground voltage interconnect.

15. The device according to claim 14, wherein
the write operation includes a program operation and a program verification operation, and
when the second interconnect is discharged in the program verification operation, the twelfth circuit electrically couples the fifth interconnect and the ground voltage interconnect.

16. The device according to claim 8, further comprising:
a second select gate line coupled to the first circuit;
a ninth driver used for the write operation and the read operation and coupled to the voltage generator; and
a tenth driver used for the erase operation and coupled to the voltage generator,
wherein the memory cell array further includes a second select transistor, which includes one end coupled to the first memory cell in series and a gate to which the second select gate line is coupled,
the second circuit is capable of electrically coupling the second select gate line and a sixth interconnect, and
the first circuit further includes:
a thirteenth circuit capable of electrically coupling the sixth interconnect and the ninth driver in the write operation and the read operation;
a fourteenth circuit capable of electrically coupling the sixth interconnect and the tenth driver in the erase operation; and
a fifteenth circuit capable of electrically coupling the sixth interconnect and the sixth driver.

17. The device according to claim 16, wherein the other end of the second select transistor is coupled to a source line.

18. The device according to claim 1, wherein the first memory cell includes a charge storage layer.

19. A semiconductor memory device comprising:
a memory cell array including a first memory cell;
a first word line coupled to a gate of the first memory cell;
a first circuit coupled to the first word line;
a first driver used for a write operation and a read operation;
a second driver used for an erase operation; and
a voltage generator respectively coupled to the first and second drivers,
wherein the first circuit includes:
a second circuit capable of electrically coupling the first word line and a first interconnect in the write operation, the read operation, and the erase operation, in which the first word line is selected;
a third circuit capable of electrically coupling the first interconnect and a second interconnect in the write operation, the read operation, and the erase operation;
a fourth circuit capable of electrically coupling the second interconnect and the first driver in the write operation;
a fifth circuit capable of electrically coupling the second interconnect and the first driver in the read operation; and
a sixth circuit capable of electrically coupling the second interconnect and the second driver in the erase operation.

20. The device according to claim 19, further comprising:
a second word line coupled to the first circuit; and
a third driver used for the write operation and the read operation and coupled to the voltage generator, wherein the memory cell array further includes a second memory cell coupled to the first memory cell in series and including a gate to which the second word line is coupled, the second circuit is capable of electrically coupling the second word line and a third interconnect, the third circuit is capable of electrically coupling the third interconnect and a fourth interconnect, the fourth circuit is capable of electrically coupling the fourth interconnect and the third driver in the write operation in which the first word line is selected, and the fifth circuit is capable of electrically coupling the fourth interconnect and the third driver in the read operation in which the first word line is selected.

* * * * *